(12) United States Patent
DeWilde et al.

(10) Patent No.: US 6,211,670 B1
(45) Date of Patent: Apr. 3, 2001

(54) MAGNETIC SENSING DEVICE FOR OUTPUTTING A DIGITAL SIGNAL AS A DYNAMIC REPRESENTATION OF AN ANALOG SIGNAL

(75) Inventors: Eric DeWilde, Fountain Valley; Kenneth Brown, Banning, both of CA (US); Donald Rimlinger, Bloomfield, NY (US)

(73) Assignee: Optek Technology, Inc., Carrolton, TX (US)

( * ) Notice: Subject to any disclaimer, the term of this patent is extended or adjusted under 35 U.S.C. 154(b) by 0 days.

(21) Appl. No.: 09/213,715

(22) Filed: Dec. 17, 1998

(51) Int. Cl.$^7$ .............................. G01P 3/488; G01P 3/489; G01R 33/06; H03K 5/153; H03K 5/22

(52) U.S. Cl. ............... 324/207.21; 324/166; 324/207.25; 324/252; 327/60; 327/68

(58) Field of Search ...................... 324/160, 166, 324/173, 174, 207.12, 207.2–207.25, 251, 252; 327/14, 15, 28–30, 58, 60, 62, 68, 72, 510, 511; 123/406.58, 406.59

(56) References Cited

U.S. PATENT DOCUMENTS

| | | | |
|---|---|---|---|
| 4,219,152 | * 8/1980 | Couch et al. | 327/58 X |
| 4,535,289 | * 8/1985 | Abe et al. | 324/207.12 X |
| 5,442,283 | 8/1995 | Vig et al. | 324/207.2 |
| 5,493,219 | * 2/1996 | Makino et al. | 324/207.25 |
| 5,570,052 | 10/1996 | Fonderie et al. | 327/561 |
| 5,612,618 | 3/1997 | Arakawa | 324/207.25 |
| 5,650,719 | 7/1997 | Moody et al. | 324/166 |
| 5,694,038 | 12/1997 | Moody et al. | 324/207.2 |
| 5,729,127 | * 3/1998 | Tamura et al. | 324/207.21 X |
| 5,729,130 | 3/1998 | Moody et al. | 324/207.12 |
| 5,821,745 | * 10/1998 | Makino et al. | 324/166 X |
| 5,952,824 | * 9/1999 | Shinjo et al. | 324/166 X |

* cited by examiner

Primary Examiner—Gerard R. Strecker
(74) Attorney, Agent, or Firm—Woodard, Emhardt, Naughton, Moriarty & McNett Patent and Trademark Attorneys

(57) ABSTRACT

A magnetic sensing device comprising a magnetic sensor and a digital circuit is disclosed. The magnetic sensor is operable to output an analog signal as an indication of any movement of an object. The digital circuit can include a dynamic reference threshold generator to output a reference signal in response to a detection of a signal feature of the analog signal and to a detection of a diametric signal feature of the analog signal, and an output format generator to output a digital signal in response to a comparison of the analog signal and the reference signal. The digital circuit can include a dynamic reference threshold generator to output a reference signal in response to a detection a first pair of quadrants of the analog signal and a detection of a second pair of quadrants of the analog signal, and an output format generator to output a digital signal in response to a comparison of the analog signal and the reference signal. The digital circuit can include a dynamic dual reference threshold generator to output a first reference signal as a percentage of a positive peak amplitude of the analog signal and second reference signal as a percentage of a negative peak amplitude of the analog signal, and an output format generator to output a digital signal in response to a comparison of the analog signal to the first reference signal and the second reference signal.

66 Claims, 19 Drawing Sheets

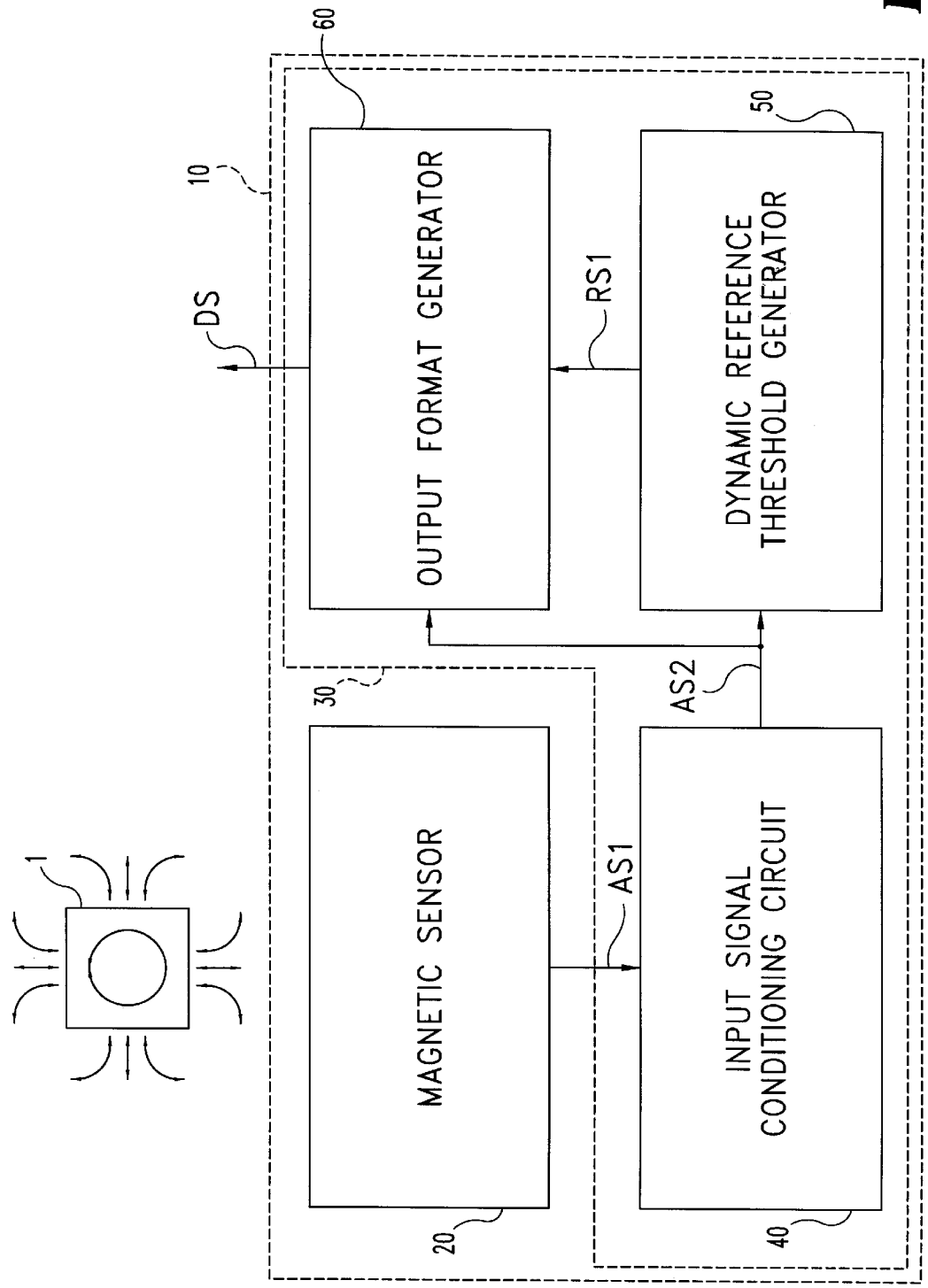

MAGNETIC SENSING DEVICE FOR OUTPUTTING A DIGITAL SIGNAL AS A DYNAMIC REPRESENTATION OF AN ANALOG SIGNAL

BACKGROUND OF THE INVENTION

1. Field of the Invention

The present invention relates generally to magnetic sensing devices, and more specifically, to electronic circuitry for outputting a digital signal as a dynamic representation of an analog signal that is indicative of any rotational movement, any linear movement, and/or any angular movement of an object as sensed by a magnetic sensor.

2. Background

Magnetic sensors known in the art are operable to output an analog signal as a function of the magnetic flux density of any magnetic flux passing through one or more magnetic flux sensitive transducers of the magnetic sensor, e.g. a magneto-resistor, a Hall effect element, a coil, etc. The magnetic sensor is spatially positioned from an object to define an air gap area therebetween. A portion of a magnetic field traverses the air gap area, and the magnetic flux sensitive transducer(s) is (are) disposed within the magnetic field. As a result, the magnitude of the analog signal varies in response to any rotational movement, any linear movement, and/or any angular movement of the object that increases or decreases the reluctance across the air gap area to thereby alter the magnetic flux density of the magnetic flux passing through the magnetic flux sensitive transducer(s). Consequently, whenever any movement of the object undulates any magnetic flux passing through the magnetic flux sensitive transducer(s), a cycle or cycles of the analog signal is indicative of a degree of movement of the object, and a frequency of each cycle of the analog signal is indicative of a rate of movement of the object. Accordingly, the analog signal of a magnetic sensor has been and will continue to be extensively utilized by various electromechanical systems to ascertain the degree and the rate of any movement of an object. For example, magnetic sensors have been extensively incorporated in engine timing systems of motor vehicles to ascertain a number of rotations of a gear component and/or to ascertain a rotational speed of a gear component.

The utilization of the analog signal of a magnetic sensor as an input signal for a digital device of an electromechanical system requires the analog signal to be outputted as a square wave having a peak-to-peak amplitude consistently equating a logic low signal level and a logic high signal level of a square wave. However, it is essentially impossible to output the analog signal as a square wave. In addition, it is improbable for a magnetic sensor to output an analog signal having a consistent peak-to-peak amplitude, because the peak-to-peak amplitude of the analog signal is a function of various factors including, but not limited to, any changes in environmental conditions ambient to the magnetic sensor such as temperature, any changes in the magnetic induction of the magnetic field, any manufacturing imperfections or irregularities of the object, and any variance in the original geometric configuration and physical dimensions of the object. Thus, various digital circuits have been made to output a digital signal as a representation of each occurrence and frequency of every cycle of the analog signal. A problem associated with outputting the digital signal as such a representation is the aforementioned inconsistency of the peak-to-peak amplitude of the analog signal. One design approach to overcome this problem is the incorporation of an automatic gain control of the analog signal in combination with a static switching threshold for the digital signal. While this particular design approach of digital circuits limits the effects of the inconsistency of the peak-to-peak amplitude of the analog signal on the accuracy of the digital signal over a relatively long time period, this design approach does not dynamically address the effects of the inconsistency of the peak-to-peak amplitude of the analog signal on the accuracy of the digital signal.

SUMMARY OF THE INVENTION

The present invention addresses the problem associated with outputting a digital signal as a dynamic representation of each occurrence and frequency of every cycle of an analog signal from a magnetic sensor in view of any dynamic increase or dynamic decrease in the peak-to-peak amplitude of the analog signal. Various aspects of the present invention are novel, non-obvious, and provides various advantages. While the actual nature of the present invention described in detail herein can only be determined with reference to the claims appended hereto, certain features which are characteristic of the present invention disclosed herein can be described briefly.

The present invention is a magnetic sensing device comprising a magnetic sensor outputting a first analog signal, and a digital circuit outputting a digital circuit in response to the first analog signal.

In a first form of the present invention, the digital circuit includes an optional input signal conditioning circuit, a dynamic reference threshold generator, and an output format generator. The optional input signal conditioning circuit outputs a second analog signal as a variant of the first analog signal. The dynamic reference threshold generator outputs a reference signal as a percentage of the second analog signal when a first signal feature of the second analog signal is detected. The dynamic reference threshold generator outputs the reference signal as a fixed percentage of one of a pair of peak amplitudes of the second analog signal when a second signal feature of the second analog signal is detected. The output format generator outputs the digital signal at a first logic signal level when the second analog signal is greater than the reference signal, and at a second logic signal level when the second analog signal is less than the reference signal. The dynamic reference threshold generator and the output format generator utilize the first analog signal in lieu of the second analog signal when the input signal conditioning circuit is omitted.

In a second form of the present invention, the digital circuit also includes an optional input signal conditioning circuit, a dynamic reference threshold generator, and an output format generator. The optional input signal conditioning circuit outputs a second analog signal as a variant of the first analog signal. The dynamic reference threshold generator outputs a reference signal at a first level when a first quadrant or a second quadrant of the second analog signal is detected, and outputs the reference signal at a second level when a third quadrant or a fourth quadrant of the second analog signal is detected. The output format generator outputs the digital signal at a first logic signal level when the second analog signal is greater than the reference signal, and at a second logic signal level when the second analog signal is less than the reference signal. The dynamic reference threshold generator and the output format generator utilize the first analog signal in lieu of the second analog signal when the input signal conditioning circuit is omitted.

In a third form of the present invention, the digital circuit also includes an optional input signal conditioning circuit, a dynamic dual reference threshold generator, and an output format generator. The optional input signal conditioning circuit outputs a second analog signal as a variant of the first analog signal. The dynamic reference threshold generator simultaneously outputs a first reference signal as a percentage of a positive peak amplitude of the second analog signal, and a second reference signal as a percentage of a negative peak amplitude of the second analog signal. The output format concurrently inputs the first reference signal and the second reference signal. The output format generator outputs the digital signal at a first logic signal level when the second analog signal is greater than the first reference signal, and at a second logic signal level when the second analog signal is less than the second reference signal. The dynamic dual reference threshold generator and the output format generator utilize the first analog signal in lieu of the second analog signal when the input signal conditioning circuit is omitted.

It is a primary objective of the present invention to provide a magnetic sensing device for outputting a digital signal as a basis for ascertaining a degree and a rate of any rotational movement, any linear movement, and/or any angular movement of an object.

It is also a primary objective of the present invention to provide a digital circuit for outputting a digital signal as a dynamic representation of each occurrence and frequency of every cycle of an analog signal from any type of magnetic sensor, particularly a magneto-resistive sensor, the analog signal being an indication of a degree and of a rate of any rotational movement, any linear movement, and/or any angular movement of an object.

Secondary objectives and advantages of the present invention will be apparent from the following description of the present invention and various embodiments thereof.

BRIEF DESCRIPTION OF THE DRAWINGS

FIG. 1 is a block diagram of a first magnetic sensing device in accordance with the present invention.

DESCRIPTION OF THE PREFERRED EMBODIMENTS

Figure 2A:
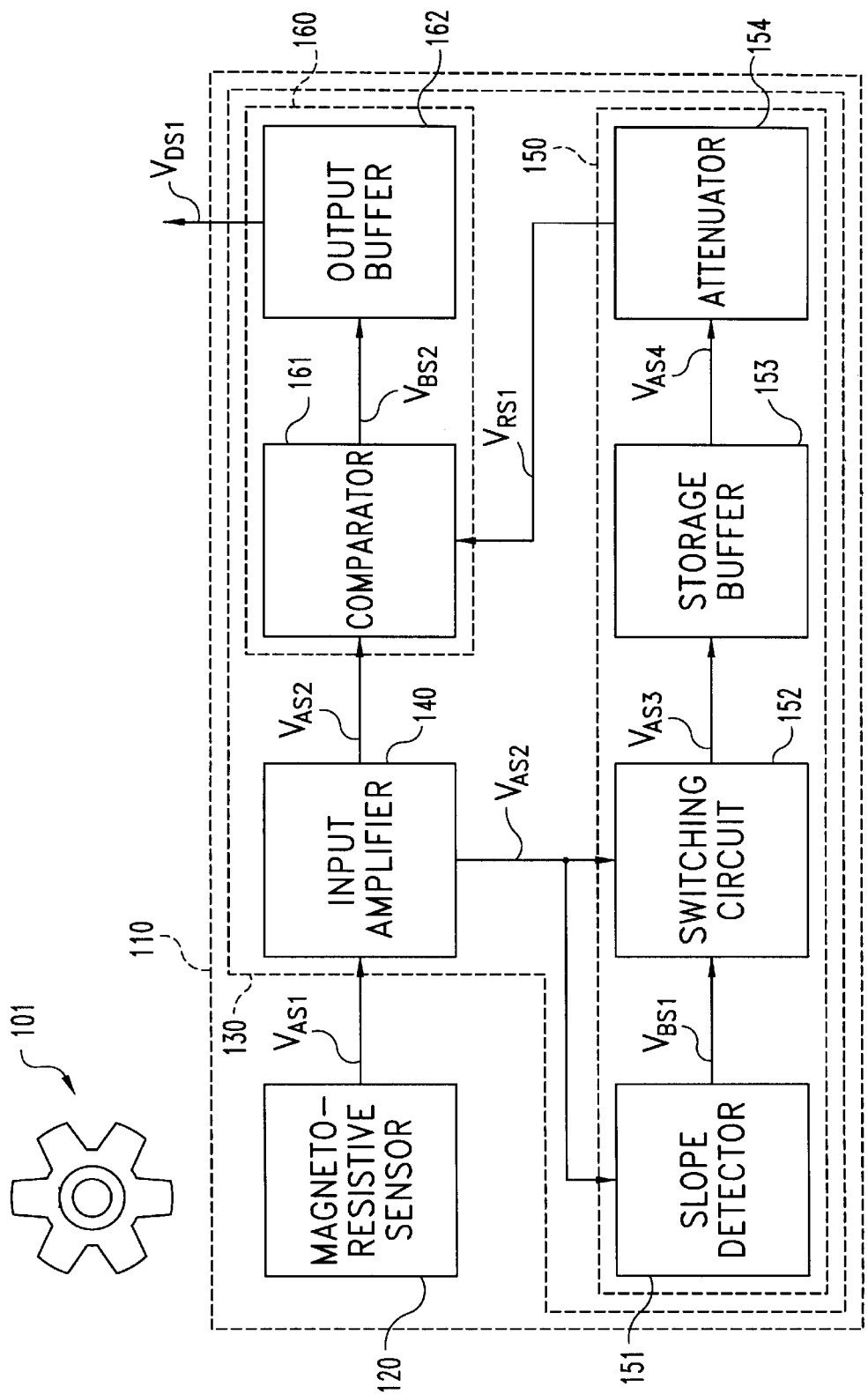
FIG. 2A is a block diagram of one embodiment of the magnetic sensing device of FIG. 1.

For the purposes of promoting an understanding of the principles of the present invention, reference will now be made to the preferred embodiments of the present invention as illustrated in the drawings and specific language will be used to describe the same. It will nevertheless be understood that no limitation of the scope of the present invention is thereby intended. Any alterations and further modifications in the illustrated embodiments, and any further applications of the principles of the present invention as illustrated and described herein are contemplated as would normally occur to one skilled in the art to which the present invention relates.

Referring to FIG. 1, a block diagram of a magnetic sensing device 10 in accordance with the present invention is shown. Magnetic sensing device 10 outputs a digital signal DS (in the form of a voltage or a current) as a basis for ascertaining a degree and a rate of any rotational movement, any linear movement, and/or any angular movement (as exemplified by the arrows) of an object 1. Magnetic sensing device 10 comprises a magnetic sensor 20. For purposes of the present invention, magnetic sensor 20 is broadly defined as any device that is operable to output an analog signal AS1 (in the form of a voltage or a current) as a function of the magnetic flux density of any magnetic flux passing through one or more magnetic flux sensitive transducers, e.g. a magneto-resistor, a Hall effect element, a coil, etc., of the magnetic sensor. Consequently, any illustration and accompanying description herein of a particular embodiment of magnetic sensor 20 is given solely for purposes of describing the best mode of the present invention and is not meant to be limiting in any way. Magnetic sensor 20 is spatially positioned from object 1 to define an air gap area therebetween, and magnetic flux (not shown) traverses a portion of the air gap area, or preferably, an entirety of the air gap area. The present invention contemplates that the magnetic flux can be generated by a magnetic component (if any) of magnetic sensor 20, by object 1 (if object 1 is magnetized), and/or by some other source of magnetic flux. The magnetic flux sensitive transducer(s) of magnetic sensor 20 is (are) disposed within the magnetic field, and magnetic sensor 20 outputs analog signal AS1 as an indication of a degree and of a rate of any rotational movement, any linear movement, and/or any angular movement (as exemplified by the arrows) of object 1 that alters the magnetic flux density of the magnetic flux passing through the magnetic flux sensitive transducer(s) of magnetic sensor 20.

Magnetic sensing device 10 further comprises a new and unique digital circuit 30. Digital circuit 30 outputs digital signal DS as a dynamic representation of analog signal AS1. Digital circuit 30 includes an optional input signal conditioning circuit 40. Input signal conditioning circuit 40 inputs analog signal AS1 from magnetic sensor 20 as shown by any type of medium, e.g. an electrical coupling, an optical emission and reception, or an acoustical transmission and reception. For purposes of the present invention, input signal conditioning circuit 40 is broadly defined as any electronic component or any electronic circuit that is operable to output an analog signal AS2 (in the form of a voltage or a current) as a variant of inputted analog signal AS1 to thereby facilitate the outputting of digital signal DS. For example, an embodiment of input signal conditioning circuit 40 could be operable to output analog signal AS2 as an amplification of analog signal AS1 to thereby facilitate the outputting of digital signal DS. Also by example, an embodiment of input signal conditioning circuit 40 could be operable to output analog signal AS2 as an attenuation of analog signal AS1 to thereby facilitate the outputting of digital signal DS. Consequently, any illustration and accompanying description herein of a particular embodiment of input signal conditioning circuit 40 is given solely for purposes of describing the best mode of the present invention and is not meant to be limiting in any way. An embodiment of digital circuit 30 can exclude input signal conditioning circuit 40 when a conditioning of analog signal AS1 to thereby facilitate the outputting of digital signal DS is not required.

Digital circuit 30 further includes a dynamic reference threshold generator 50. Dynamic reference threshold generator 50 inputs analog signal AS2 from input signal conditioning circuit 40 as shown by any type of medium, or alternatively, inputs analog signal AS1 from magnetic sensor 20 by any type of medium when input signal conditioning circuit 40 is excluded by an embodiment of digital circuit 30. For purposes of the present invention, dynamic reference threshold generator 50 is broadly defined as any electronic component or any electronic circuit that is operable for each cycle of analog signal AS2 (or analog signal AS1) to output a reference signal RS1 (in the form of a voltage or a current) equating a percentage (fixed or variable) of analog signal AS2 (or analog signal AS1) in response to a detection of a specific signal feature of analog signal AS2 (or analog signal AS1) and equating a fixed percentage of a peak amplitude of analog signal AS2 (or analog signal AS1) in response to a detection of a diametric signal feature of analog signal AS2 (or analog signal AS1). Thus, reference signal RS1 is dynamically generated for each cycle of analog signal AS2 (or analog signal AS1). For example, an embodiment of dynamic reference threshold generator 50 could be operable to output reference signal RS1 as a voltage reference signal equating a variable percentage of analog signal AS2 (or analog signal AS1) in response to a detection of a positive slope of analog signal AS2 (or analog signal AS1), and equating eighty (80) percent of a positive peak amplitude of analog signal AS2 (or analog signal AS1) in response to a detection of a negative slope of analog signal AS2 (or analog signal AS1). Also by example, an embodiment of dynamic reference threshold generator 50 could be operable to output reference signal RS1 as a current reference signal equating fifty (50) percent of analog signal AS2 (or analog signal AS1) in response to a detection of a negative polarity of analog signal AS2 (or analog signal AS1), and equating fifty (50) percent of a negative peak amplitude of analog signal AS2 (or analog signal AS1) in response to a detection of a positive slope of analog signal AS2 (or analog signal AS1). Consequently, any illustration and accompanying description herein of a particular embodiment of dynamic reference threshold generator 50 is given solely for purposes of describing the best mode of the present invention and is not meant to be limiting in any way.

Digital circuit 30 further includes an output format generator 60. Output format generator 60 inputs reference signal RS1 from dynamic reference threshold generator 50 as shown by any type of medium. Output format generator 60 also inputs analog signal AS2 from input signal conditioning circuit 40 as shown by any type of medium, or alternatively, inputs analog signal AS1 from magnetic sensor 20 by any type of medium when input signal conditioning circuit 40 is excluded by an embodiment of digital circuit 30. For purposes of the present invention, output format generator 60 is broadly defined as any electronic component or any electronic circuit that is operable to output digital signal DS equating one of the logic signal levels in response to analog signal AS2 (or analog signal AS1) being equal to or less than a reference signal, e.g. reference signal RS1, and equating the other logic signal level in response to analog signal AS2 (or analog signal AS1) being greater than the reference signal. For example, an embodiment of output format generator 60 can output digital signal DS as a voltage digital signal equating zero (0) volts in response to analog signal AS2 being equal to or less than reference signal RS1 and equating five (5) volts in response to analog signal AS2 being greater than reference signal RS1. Also by example, an embodiment of output format generator 60 could be operable to output digital signal DS as a current digital signal equating fourteen (14) milliamperes in response to analog signal AS1 being equal to or less than reference signal RS1, and equating seven (7) milliamperes in response to analog signal AS1 being greater than reference signal RS1. Consequently, any illustration and accompanying description herein of a particular embodiment of output format generator 60 is given solely for purposes of describing the best mode of the present invention and is not meant to be limiting in any way.

FIG. 2A is a block diagram a magneto-resistive sensing device 110 as an embodiment of magnetic sensing device 10 (FIG. 1). Referring to FIG. 2A, magneto-resistive sensing device 110 outputs a voltage digital signal $V_{DS1}$ as shown as a basis for ascertaining a degree and a rate of any rotational movement (as exemplified by the arrows) of a ferromagnetic gear 101. Magneto-resistive sensing device 110 comprises a magneto-resistive sensor 120 as an embodiment of magnetic sensor 20 (FIG. 1). For purposes of the present invention, magneto-resistive sensor 120 is broadly defined as any device that is operable to output a voltage analog signal $V_{AS1}$ as a function of the magnetic flux density of any magnetic flux passing through one or more magneto-resistors. Consequently, any illustration and accompanying description herein of a particular embodiment of magneto-resistive sensor 120 is given solely for purposes of describing the best mode of the present invention and is not meant to be limiting in any way. Magneto-resistive sensor 120 is spatially positioned from ferromagnetic gear 101 to define an air gap area therebetween, and magnetic flux (not shown) traverses a portion of the air gap area, or preferably, an entirety of the air gap area. The present invention contemplates that the magnetic flux can be generated by a magnetic component (if any) of magneto-resistive sensor 120, and/or by some other source of magnetic flux. The magneto-resistor(s) of magneto-resistive sensor 120 is (are) disposed within the magnetic field, and magneto-resistive sensor 120 outputs voltage analog signal $V_{AS1}$ as an indication of a degree and of a rate of any rotational movement (as exemplified by the arrows) of ferromagnetic gear 101 that alters the magnetic flux density of the magnetic flux passing through the magneto-resistor(s) of magneto-resistive sensor 120. Magneto-resistive sensing device 110 further comprises a digital circuit 130 as an embodiment of digital circuit 30 (FIG. 1). Digital circuit 130 outputs voltage digital signal $V_{DS1}$ as shown as a dynamic representation of voltage analog signal $V_{AS1}$. Digital circuit 130 includes an optional input amplifier 140 as an embodiment of input signal conditioning circuit 40 (FIG. 1). Input amplifier 140 inputs voltage analog signal $V_{AS1}$ from magneto-resistive sensor 120 as shown by any type of medium. For purposes of the present invention, input amplifier 140 is broadly defined as any electronic component or any electronic circuit that is operable to output voltage analog signal $V_{AS2}$ as an amplification of voltage analog signal $V_{AS1}$. Consequently, any illustration and accompanying description herein of a particular embodiment of input amplifier 140 is given solely for purposes of describing the best mode of the present invention and is not meant to be limiting in any way. An embodiment of digital circuit 130 can exclude input amplifier 140 when an amplification of voltage analog signal $V_{AS1}$ to thereby facilitate the outputting of voltage digital signal $V_{DS1}$ is not required.

Digital circuit 130 further includes a dynamic reference threshold generator 150 as an embodiment of dynamic reference threshold generator 50 (FIG. 1). Dynamic reference threshold generator 150 includes a slope detector 151, a switching circuit 152, a storage buffer 153, and an attenuator 154. Slope detector 151 inputs voltage analog signal $V_{AS2}$ from input amplifier 140 as shown by any type of medium, or alternatively, inputs voltage analog signal $V_{AS1}$ from magnetic sensor 120 by any type of medium when input amplifier 140 is excluded by an embodiment of digital circuit 130. For purposes of the present invention, slope detector 151 is broadly defined as any electronic component or any electronic circuit that is operable to output a voltage binary signal $V_{BS1}$ equating a first fixed voltage level in response to a detection of a positive slope of voltage analog signal $V_{AS2}$ (or voltage analog signal $V_{AS1}$) and equating a second fixed voltage level in response to a detection of a negative slope of voltage analog signal $V_{AS2}$ (or voltage analog signal $V_{AS1}$). Consequently, any illustration and accompanying description herein of a particular embodiment of slope detector 151 is given solely for purposes of describing the best mode of the present invention and is not meant to be limiting in any way.

Switching circuit 152 inputs voltage binary signal $V_{BS1}$ from slope detector 151 as shown by any type of medium. Switching circuit 152 also inputs voltage analog signal $V_{AS2}$ from input amplifier 140 as shown by any type of medium, or alternatively, inputs voltage analog signal $V_{AS1}$ from magnetic sensor 120 by any type of medium when input amplifier 140 is excluded by an embodiment of digital circuit 130. For purposes of the present invention, switching circuit 152 is broadly defined as any electronic component or any electronic circuit that is operable to output a voltage analog signal $V_{AS3}$ equating voltage analog signal $V_{AS2}$ or a portion thereof (or voltage analog signal $V_{AS1}$ or a portion thereof) in response to a voltage binary signal, e.g. voltage binary signal $V_{BS1}$, equating the first fixed voltage level, and that is inoperative in response to the voltage binary signal equating the the second fixed voltage level. Consequently, any illustration and accompanying description herein of a particular embodiment of switching circuit 152 is given solely for purposes of describing the best mode of the present invention and is not meant to be limiting in any way. Storage buffer 153 inputs voltage analog signal $V_{AS3}$ from switching circuit 152 as shown by any type of medium. For purposes of the present invention, storage buffer 153 is broadly defined as any electronic component or any electronic circuit that is operable to store voltage analog signal $V_{AS3}$ and further operable to output a voltage analog signal $V_{AS4}$ equating stored voltage analog signal $V_{AS3}$ or a portion thereof. Consequently, any illustration and accompanying description herein of a particular embodiment of storage buffer 153 is given solely for purposes of describing the best mode of the present invention and is not meant to be limiting in any way. Attenuator 154 inputs voltage analog signal $V_{AS4}$ from storage buffer 153 as shown by any type of medium. For purposes of the present invention, attenuator 154 is broadly defined as any electronic component or any electronic circuit that is operable to output a voltage reference signal $V_{RS1}$ equating an attenuation of voltage analog signal $V_{AS4}$. Thus, it is to be understood that voltage reference signal $V_{RS1}$ is dynamically generated for each cycle of voltage analog signal $V_{AS1}$. Consequently, any illustration and accompanying description herein of a particular embodiment of attenuator 154 is given solely for purposes of describing the best mode of the present invention and is not meant to be limiting in any way.

Digital circuit 130 further includes an output format generator 160 as an embodiment of output format generator 60 (FIG. 1). Output format generator 160 includes a comparator 161, and an optional output buffer 162. Comparator 161 inputs voltage reference signal $V_{RS1}$ from attenuator 154 as shown by any type of medium. Comparator 161 also inputs voltage analog signal $V_{AS2}$ from input amplifier 140 as shown by any type of medium, or alternatively inputs voltage analog signal $V_{AS1}$ from magnetic sensor 120 by any type of medium when input amplifier 140 is excluded from an embodiment of digital circuit 130. For purposes of the present invention, comparator 161 is broadly defined as any electronic component or any electronic circuit that is operable to output a voltage binary signal $V_{BS2}$ equating a first fixed voltage level in response to voltage analog signal $V_{AS2}$ (or voltage analog signal $V_{AS1}$) being equal to or less than a voltage reference signal, e.g. a voltage reference signal $V_{RS1}$, and equating a second fixed voltage level in response to voltage analog signal $V_{AS2}$ (or voltage analog signal $V_{AS1}$) being greater than the voltage reference signal. Consequently, any illustration and accompanying description herein of a particular embodiment of comparator 161 is given solely for purposes of describing the best mode of the present invention and is not meant to be limiting in any way. Output buffer 162 inputs voltage binary signal $V_{BS2}$ from comparator 161 as shown by any type of medium. For purposes of the present invention, output buffer 162 is broadly defined as any electronic component or any electronic circuit that is operable to output voltage digital signal $V_{DS1}$ in response to an external device being applied to output buffer 162 while isolating the other components of digital circuit 130, particularly comparator 161, from the applied external device. Voltage digital signal $V_{DS1}$ equates one of the voltage logic levels in response to voltage binary signal $V_{BS2}$ equating the first fixed voltage level, and equates the other voltage logic level in response to voltage binary signal $V_{BS2}$ equating the second fixed voltage level. Consequently, any illustration and accompanying description herein of a particular embodiment of output buffer 162 is given solely for purposes of describing the best mode of the present invention and is not meant to be limiting in any way. It is to be appreciated that voltage digital signal $V_{BS2}$ can be concurrently outputted with voltage digital signal $V_{DS1}$ as a second voltage digital signal that is dynamically representative of voltage analog signal $V_{AS1}$. When output buffer 62 is excluded by an embodiment of output format generator 160, it is to be appreciated that voltage binary signal $V_{BS2}$ is outputted as the voltage digital signal that is dynamically representative of voltage analog signal $V_{AS1}$. The present invention contemplates that the fixed voltage levels for voltage binary signals $V_{BS1}$ and $V_{BS2}$ may or may not be identical.

Figure 2B:
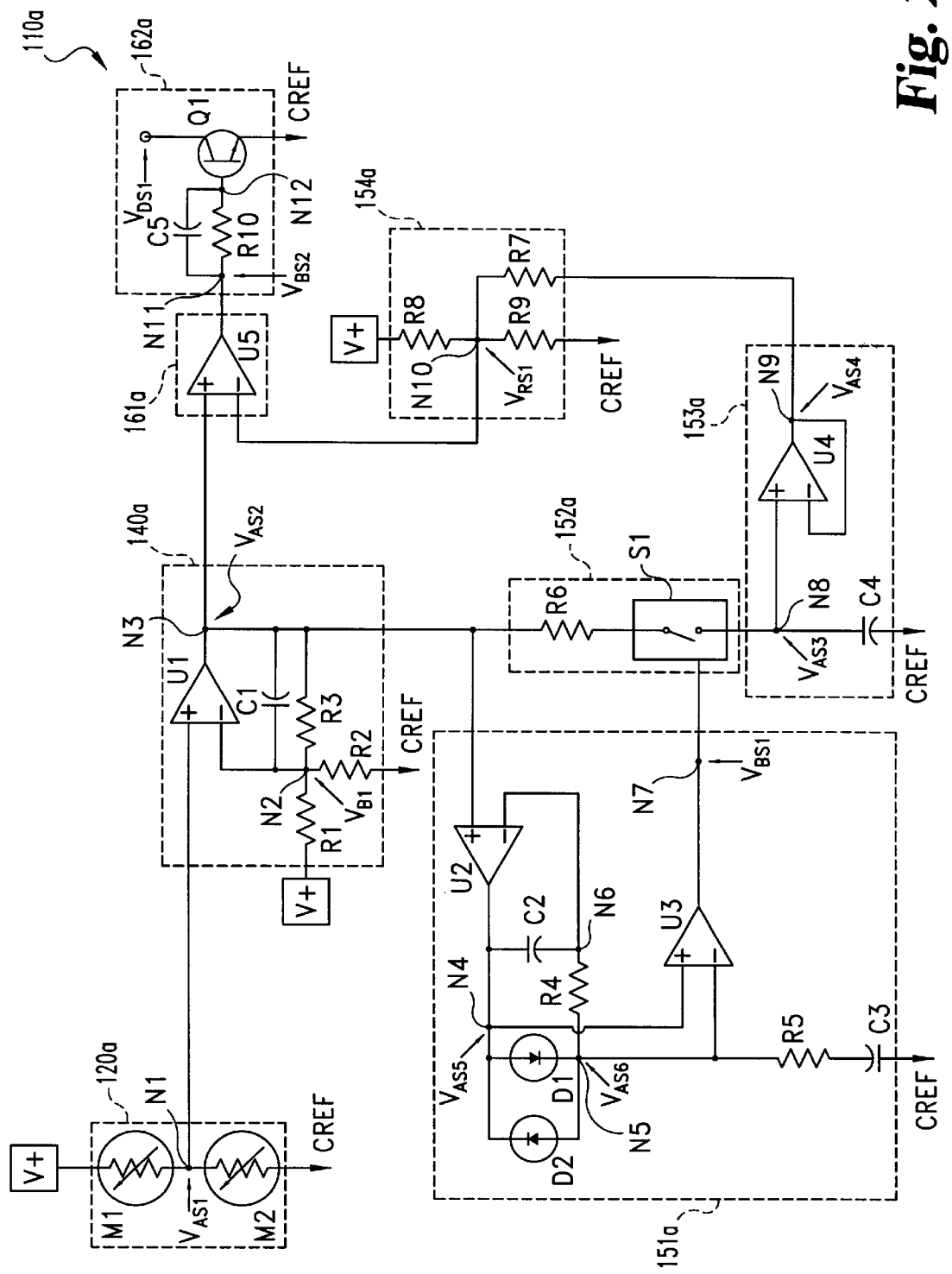
FIG. 2B is a schematic diagram of one embodiment of the magneto-resistive sensing device of FIG. 2A.

FIG. 2B is a schematic diagram of a magneto-resistive sensing device 110a as an embodiment of magneto-resistive sensing device 110 (FIG. 2A). Referring to FIG. 2B, magneto-resistive sensing device 110a comprises a magneto-resistive sensor 120a as an embodiment of magnetic-resistive sensor 120 (FIG. 2A). Magneto-resistive sensor 120a includes a magneto-resistor M1, and a magneto-resistor M2. Magneto-resistor M1 is electrically coupled to a positive voltage source V+ and to a node N1, and magneto-resistor M2 is electrically coupled to node N1 and to a common reference CREF, i.e. a ground terminal, a negative power voltage, etc., to thereby output voltage analog signal $V_{AS1}$ (FIG. 2A) via node N1.

Magneto-resistive sensing device 110a further comprises an input amplifier 140a as an embodiment of input amplifier 140 (FIG. 2A). Input amplifier 140a includes an operational amplifier U1, a resistor R1, a resistor R2, an optional resistor R3, and an optional capacitor C1. A noninverting input of operational amplifier U1 is electrically coupled to node N1 to thereby input voltage analog signal $V_{AS1}$. Resistor R1 is electrically coupled to positive voltage source V+ and to a node N2, and resistor R2 is electrically coupled to node N2 and to common reference CREF to thereby establish a biasing voltage $V_{B1}$ at node N2. An inverting input of operational amplifier U1 is electrically coupled to node N2 to thereby input biasing voltage $V_{B1}$. An output terminal of operational amplifier U1 is electrically coupled to a node N3, and operational amplifier U1 outputs voltage analog signal $V_{AS2}$ (FIG. 2A) via node N3 as an amplification of voltage analog signal $V_{AS1}$ in response to voltage analog signal $V_{AS1}$ and biasing voltage $V_{B1}$. Capacitor C1 can be electrically coupled to node N2 and to node N3, and resistor R3 can be electrically coupled to node N2 and to node N3 to thereby provide a negative feedback to the inverting input of operational amplifier U1. The particular model of operational amplifier U1, the electrical resistive values of resistors R1–R3, and the electrical reactive value of capacitor C1 are selected in view of positive voltage source V+and common reference CREF to control and stabilize the gain of input amplifier 140a as related to temperature and to any gradual changes in the peak-to-peak amplitude of voltage analog signal $V_{AS1}$.

Magneto-resistive sensing device 110a further comprises a slope detector 151a as an embodiment of slope detector 151 (FIG. 2A). Slope detector 151a includes an operational amplifier U2, a diode D1, a diode D2, an optional capacitor C2, an optional resistor R4, a comparator U3, a resistor R5, and a capacitor C3. A noninverting input of operational amplifier U2 is electrically coupled to node N3 to thereby input voltage analog signal $V_{AS2}$. An output terminal of operational amplifier U2 is electrically coupled to a node N4, an anode terminal of diode D1 and a cathode terminal of diode D2 are electrically coupled to node N4, a cathode terminal of diode D1 and an anode terminal of diode D2 are electrically coupled to node N4, resistor R5 is electrically coupled to node N4, and capacitor C3 is electrically coupled to resistor R5 and common reference CREF to thereby establish a voltage analog signal $V_{AS5}$ at node N4 and to thereby establish a voltage analog signal $V_{AS6}$ at node N5. Resistor R4 can be electrically coupled to node N5 and to a node N6, capacitor C2 can be electrically coupled to node N4 and to node N6, and an inverting input of operational amplifier U2 can be electrically coupled to node N6 to thereby provide a negative feedback to the inverting input of operational amplifier U2. Alternatively, the inverting input of operational amplifier U2 can be electrically coupled to node N4. The particular model of operational amplifier U2, the particular model of diodes D1 and D2, the electrical resistive values of resistors R4 and R5, and the electrical reactive values of capacitors C2 and C3 are selected to thereby equate voltage analog signal $V_{AS5}$ as a variant of voltage analog signal $V_{AS2}$ having a positive peak amplitude being greater than the positive peak amplitude of voltage analog signal $V_{AS2}$ by a voltage drop across diode D1 and having a negative peak amplitude being less than the negative peak amplitude of voltage analog signal $V_{AS2}$ by a voltage drop across diode D2, and to thereby equate voltage analog signal $V_{AS6}$ as voltage analog signal $V_{AS2}$. An inverting input of comparator U3 is electrically coupled to node N4 to thereby input voltage analog signal $V_{AS5}$, and a noninverting input of comparator U3 is electrically coupled to node N5 to thereby input voltage analog signal $V_{AS6}$. An output terminal of comparator U3 is electrically coupled to a node N7, and comparator U3 outputs voltage binary signal $V_{BS1}$ (FIG. 2A) via node N7 in response to voltage analog signal $V_{AS5}$ and voltage analog signal $V_{AS6}$. The particular model of comparator U3 is selected to equate voltage binary signal $V_{BS1}$ as common reference CREF, e.g. zero (0) volts, in response to voltage analog signal $V_{AS5}$ being greater than voltage analog signal $V_{AS6}$ and to equate voltage binary signal $V_{BS1}$ as positive voltage source V+, e.g. five (5) volts, in response to voltage analog signal $V_{AS5}$ being equal to or less than voltage analog signal $V_{AS6}$.

Magneto-resistive sensing device 110a further comprises a switching circuit 152a as an embodiment of switching circuit 152 (FIG. 2A). Switching circuit 152a includes an optional resistor R6, and a CMOS switch symbolically shown as S1. Resistor R6 can be electrically coupled to node N3 and to an input terminal of CMOS switch S1 to thereby input voltage analog signal $V_{AS2}$. Alternatively, the input terminal of CMOS switch S1 can be electrically coupled to node N3 to thereby input voltage analog signal $V_{AS2}$. A control terminal of CMOS switch S1 is electrically coupled to node N7 to thereby input voltage binary signal $V_{BS1}$. CMOS switch S1 is operative in response to voltage binary signal $V_{BS1}$ equating common reference CREF, and is inoperative in response to voltage binary signal $V_{BS1}$ equating positive voltage source V+. An output terminal of CMOS switch S1 is electrically coupled to a node N8, and CMOS switch S1 outputs voltage analog signal $V_{AS3}$ (FIG. 2A) via node N8 when CMOS switch S1 is operative. The particular type of CMOS switch S1 and the electrical resistive value of resistor R6 are selected to output voltage analog signal $V_{AS3}$ as equating an attenuation of voltage analog signal $V_{AS2}$.

Magneto-resistive sensing device 110a further comprises a storage buffer 153a as an embodiment of storage buffer 153 (FIG. 2A). Storage buffer 153a includes a capacitor C4 and a buffer amplifier U4. Capacitor C4 is electrically coupled to node N8 and to common reference CREF to thereby store voltage analog signal $V_{AS3}$. A noninverting input of buffer amplifier U4 is electrically coupled to node N8 to thereby input voltage analog signal $V_{AS3}$ as stored by capacitor C4. An output terminal of buffer amplifier U4 is electrically coupled to a node N9, and buffer amplifier U4 outputs voltage analog signal $V_{AS4}$ (FIG. 2A) via node N9. An inverting input of buffer amplifier U4 is electrically coupled to the output terminal of buffer amplifier U4 to provide a negative feedback to buffer amplifier U4. The particular model of buffer amplifier U4 and the electrical reactive value of capacitor C4 are selected to store and output voltage analog signal $V_{AS4}$ as equating voltage analog signal $V_{AS3}$.

Magneto-resistive sensing device 110a further comprises an attenuator 154a as an embodiment of attenuator 154 (FIG. 2A). Attenuator 154a includes a resistor R7, a resistor R8, and a resistor R9. Resistor R7 is electrically coupled to node N9 to thereby input voltage analog signal $V_{AS4}$. Resistor R7 is further electrically coupled to a node N10, resistor R8 is electrically coupled to positive voltage source V+ and to node N10, and resistor R9 is electrically coupled to node N10 and to common reference CREF to thereby output voltage reference signal $V_{RS1}$ (FIG. 2A) via node N10. The electrical resistive values of resistors R7–R9 are selected in view of voltage analog signal $V_{AS4}$, positive voltage source V+ and common reference CREF to equate voltage reference signal $V_{RS1}$ as a biased attenuation of voltage analog signal $V_{AS4}$.

Magneto-resistive sensing device 110a further comprises a comparator 161a as an embodiment of comparator 161 (FIG. 2A). Comparator 161a includes comparator U5. A noninverting input of comparator U5 is electrically coupled to node N3 to thereby input voltage analog signal $V_{AS2}$, and an inverting input of comparator U5 is electrically coupled to node N10 to thereby input voltage reference signal $V_{RS1}$. An output terminal of comparator U5 is electrically coupled to a node N11, and comparator U5 outputs voltage binary signal $V_{BS2}$ (FIG. 2A) via node N11 in response to voltage analog signal $V_{AS2}$ and voltage reference signal $V_{RS1}$. The particular model of comparator U5 is selected to equate voltage binary signal $V_{BS2}$ as common reference CREF, e.g. zero (0) volts, in response to voltage analog signal $V_{AS2}$ being greater than voltage reference signal $V_{RS1}$ and to equate voltage binary signal $V_{BS2}$ as positive voltage source V+, e.g. five (5) volts, in response to voltage analog signal $V_{AS2}$ being equal to or less than voltage reference signal $V_{RS1}$.

Magneto-resistive sensing device 110a further comprises an output buffer 162a as an embodiment of output buffer 162 (FIG. 2A). Output buffer 162a includes an optional resistor R10, an optional capacitor C5, and an NPN transistor Q1. Resistor R10 and capacitor C5 can be electrically coupled to node N11, and to a base terminal of transistor Q1 to thereby input voltage binary signal $V_{BS2}$. Alternatively, a base terminal of transistor Q1 can be electrically coupled to node N11 to thereby input voltage binary signal $V_{BS2}$. An emitter terminal of transistor Q1 is electrically coupled to common reference CREF, a nd a collector terminal of transistor Q is operable to output voltage digital signal $V_{DS1}$ in response to an external device being applied to the collector terminal. The particular model of transistor Q1, the electrical resistive value of resistor R10, and the electrical reactive value of capacitor C5 are selected to thereby output voltage digital signal $V_{DS1}$ while transistor Q1 isolates the other components of magneto-resistive sensing device 110a, particularly comparator U5, from any external device being applied to the collector terminal of transistor Q1. In addition, a current digital signal (not shown) associated with voltage digital signal $V_{DS1}$ is an amplification of a current digital signal (not shown) associated with outputs voltage binary signal $V_{BS2}$, and can be outputted from the emitter terminal of transistor Q1 to thereby serve as a concurrent or alternate basis for ascertaining a degree and a rate of any movement of an object, e.g. a degree and a rate of any rotational movement of ferromagnetic gear 101 (FIG. 2A).

Figure 2C:
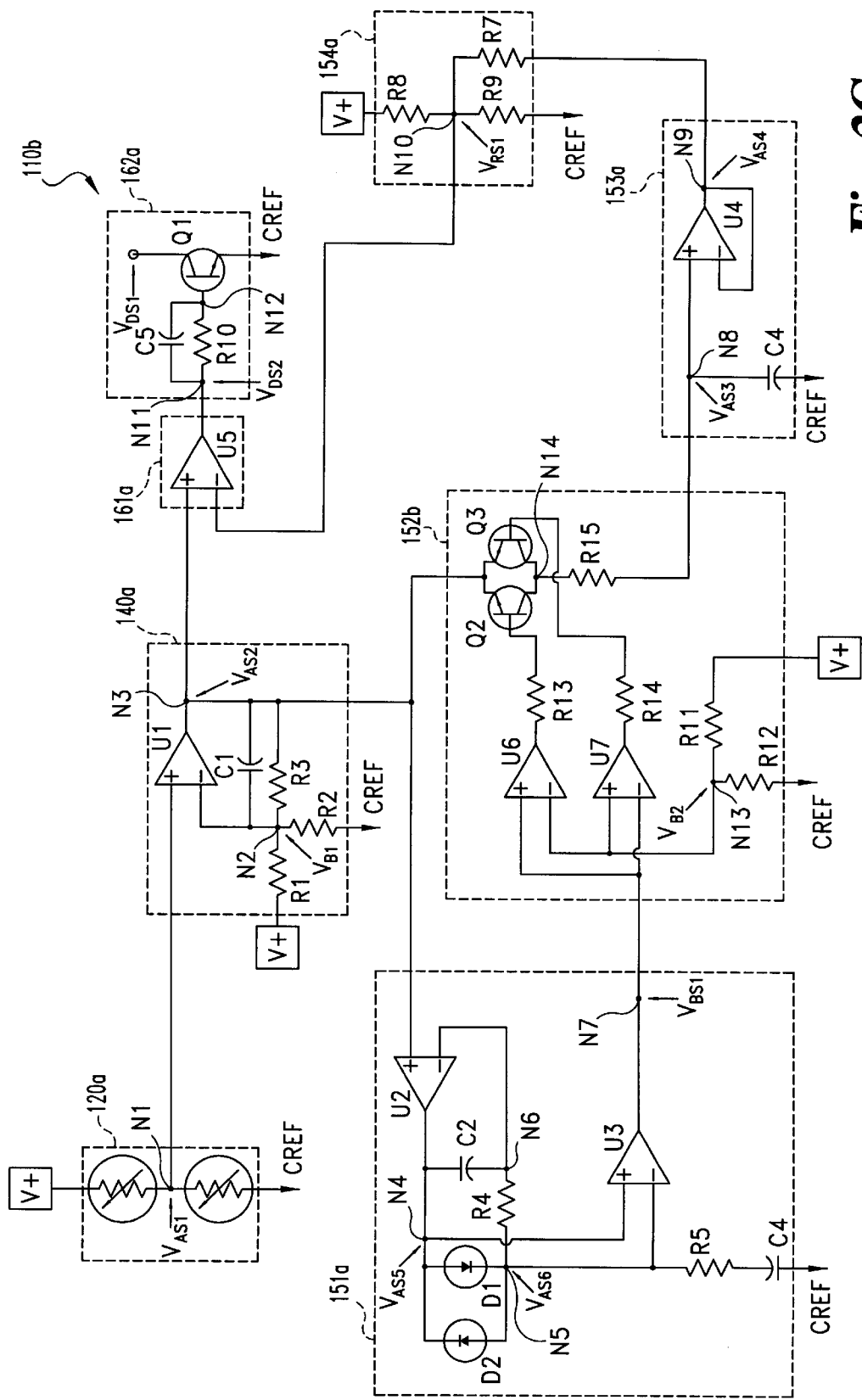
FIG. 2C is a schematic diagram of another embodiment of the magneto-resistive sensing device of FIG. 2A.

FIG. 2C is a schematic diagram of a magneto-resistive sensing device 110b as another embodiment of magneto-resistive sensing device 110 (FIG. 2A). Referring to FIG. 2C, magneto-resistive sensing device 110b comprises magneto-resistive sensor 120a (FIG. 2B), input amplifier 140a (FIG. 2B), slope detector 151a (FIG. 2B), a switch circuit 152b as an alternative to switch circuit 152a (FIG. 2B), storage buffer 153a (FIG. 2B), attenuator 154a (FIG. 2B), comparator 161a (FIG. 2B), and output buffer 162a (FIG. 2B). Switch circuit 152b includes a comparator U6, a comparator U7, a resistor R11, a resistor R12, a resistor R13, a resistor R14, a NPN transistor Q2, a PNP transistor Q3, and a resistor R15. A noninverting input of comparator U6 and an inverting input of comparator U7 are electrically coupled to node N7 to thereby input voltage binary signal $V_{BS1}$. Resistor R11 is electrically coupled to positive voltage source V+ and to a node N13, and resistor R12 is electrically coupled to node N13 and to common reference CREF to thereby establish a biasing voltage $V_{B2}$ at a node N13. A noninverting input of comparator U7 and an inverting input of comparator U6 are electrically coupled to node N13 to thereby input biasing voltage $V_{B2}$. An emitter terminal of transistor Q2 and an emitter terminal of transistor Q3 are electrically coupled to node N3 to thereby selectively input voltage analog signal $V_{AS2}$. Resistor R13 is electrically coupled to an output terminal of comparator U6 and to a base terminal of transistor Q2, resistor R14 is electrically coupled to an output terminal of comparator U7 and to a base terminal of transistor Q3, a collector terminal of transistor Q2 and a collector terminal of transistor Q3 are electrically coupled to a node N14, and resistor R15 is electrically coupled to node N14 and to node N8 to thereby output voltage analog signal $V_{AS3}$ (HG. 2B) at node N8. The particular models of comparators U6 and U7, the particular models of transistors Q2 and Q3, and the electrical resistive values of resistors R13–R15 are selected in view of voltage binary signal $V_{BS1}$ and biased voltage $V_{B2}$ to establish transistor Q2 and transistor Q3 into a saturation mode of operation in response to voltage binary signal $V_{BS1}$ equating common reference CREF, and to establish transistor Q2 and transistor Q3 into a cutoff mode of operation in response to voltage binary signal $V_{BS1}$ equating positive voltage source V+.

Figure 3A:
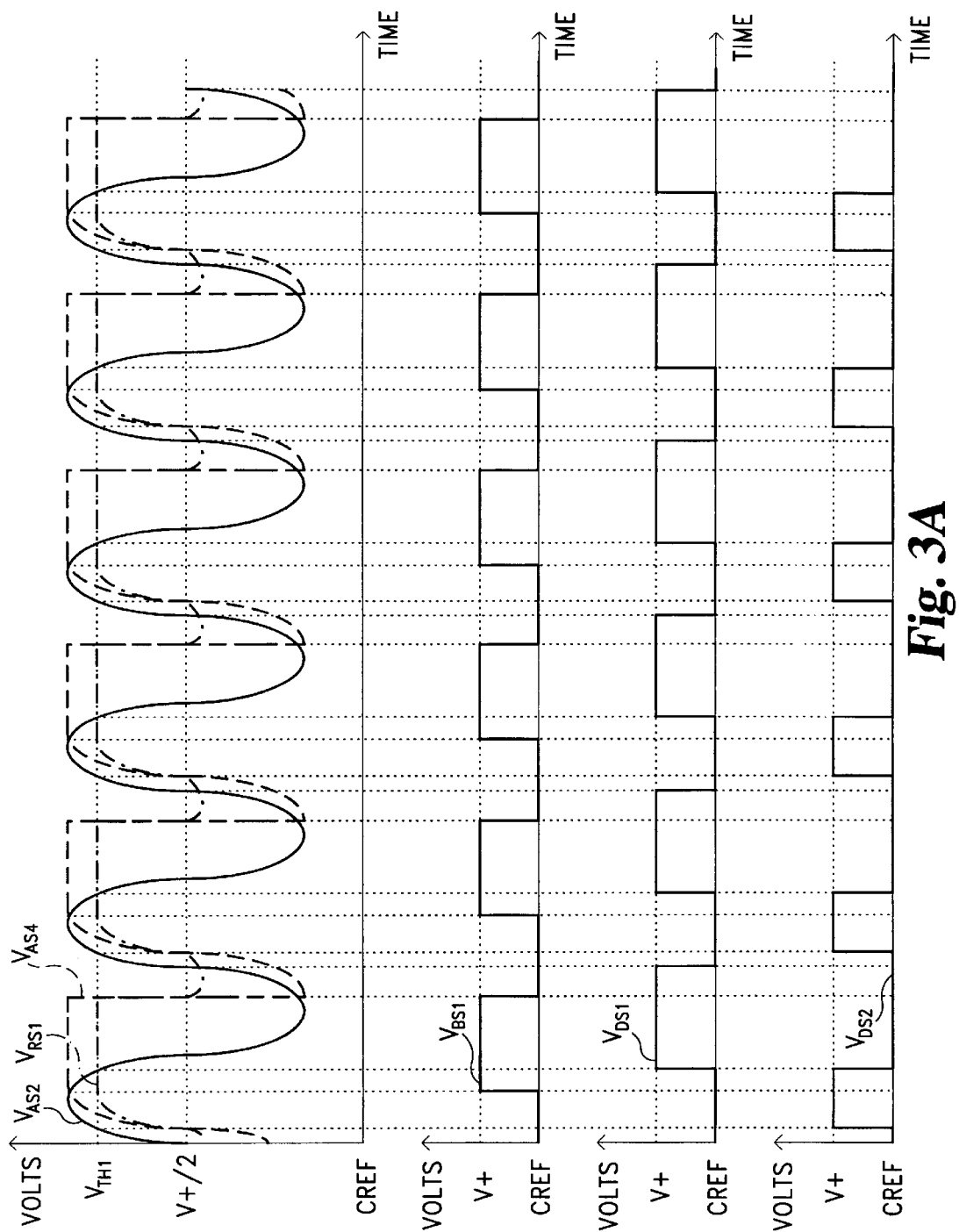
FIG. 3A is a first set of graphical diagrams of exemplary voltage waveforms as outputted by various components of a digital circuit of the magneto-resistive sensing device of FIG. 2B.

Referring to FIG. 3A, a first set of graphical diagrams consisting of an exemplary voltage analog signal $V_{AS2}$ as outputted by input amplifier 140a (FIG. 2B) as magneto-resistive sensor 120a (FIG. 2B) senses a constant rate of rotation of ferromagnetic gear 101 (FIG. 2A) over a 360 degree range of rotation, of an exemplary voltage analog signal $V_{AS4}$ as outputted by storage buffer 153a (FIG. 2B), of an exemplary voltage reference signal $V_{RS1}$ as outputted by attenuator 154a (FIG. 2B), of an exemplary voltage binary signal $V_{BS1}$ as outputted by slope detector 151a (FIG. 2B), of an exemplary voltage digital signal $V_{DS1}$ as outputted by output buffer 162a (FIG. 2B), and of an exemplary voltage digital signal $V_{DS2}$ as outputted by a magneto-resistive sensing device incorporating a static voltage switching threshold $V_{TH1}$. Voltage analog signal $V_{AS2}$ is exemplary shown as a sinusoidal waveform for the simplicity of describing the present invention. However, it is to be appreciated that the actual waveform shape of voltage analog signal $V_{AS2}$ is a function of numerous factors. Voltage analog signal $V_{AS2}$ is also exemplary shown as having a consistent peak-to-peak amplitude over the 360 degree range of rotation. The first quadrant of each cycle of voltage analog signal $V_{AS2}$ corresponds to voltage analog signal $V_{AS2}$ having a positive polarity and a positive slope. During the first quadrant, voltage binary signal $V_{BS1}$ equates common reference CREF in response to a detection of the positive slope of voltage analog signal $V_{AS2}$. As a result, voltage analog signal $V_{AS4}$ equates an approximation of voltage analog signal $V_{AS2}$ that slightly lags voltage analog signal $V_{AS2}$ as a function of capacitor C4 (FIG. 2B), and voltage reference signal $V_{RS1}$ equates a biased attenuation of voltage analog signal $V_{AS4}$, i.e. a biased attenuation of voltage analog signal $V_{AS2}$. Consequently, voltage digital signal $V_{DS1}$ equates common reference CREF in response to voltage analog signal $V_{AS2}$ being greater than voltage reference signal $V_{RS1}$. The second quadrant of each cycle of voltage analog signal $V_{AS2}$ corresponds to voltage analog signal $V_{AS2}$ having a positive polarity and a negative slope. During the second quadrant, voltage binary signal $V_{BS1}$ equates positive voltage source $V^+$ in response to a detection of the negative slope of voltage analog signal $V_{AS2}$. As a result, voltage analog signal $V_{AS4}$ equates an approximation of the positive peak amplitude of voltage analog signal $V_{AS2}$, and voltage reference signal $V_{RS1}$ equates a biased attenuation of voltage analog signal $V_{AS4}$, i.e. a biased attenuation of the positive peak amplitude of voltage analog signal $V_{AS2}$.

Consequently, voltage digital signal $V_{DS1}$ transitions from common reference CREF to positive voltage source $V^+$ in response to voltage analog signal $V_{AS2}$ becoming equal to or less than voltage reference signal $V_{RS1}$ during the second quadrant of each cycle.

The third quadrant of each cycle of voltage analog signal $V_{AS2}$ corresponds to voltage analog signal $V_{AS2}$ having a negative polarity and a negative slope. During the third quadrant, voltage binary signal $V_{BS1}$ equates positive voltage source $V^+$ in response to a detection of the negative slope of voltage analog signal $V_{AS2}$. As a result, voltage analog signal $V_{AS4}$ still equates an approximation of the positive peak amplitude of voltage analog signal $V_{AS2}$, and voltage reference signal $V_{RS1}$ still equates a biased attenuation of voltage analog signal $V_{AS4}$, i.e. a biased attenuation of the positive peak amplitude of voltage analog signal $V_{AS2}$. Consequently, voltage digital signal $V_{DS1}$ equates positive voltage source $V^+$ in response to voltage analog signal $V_{AS2}$ being less than voltage reference signal $V_{RS1}$. The final quadrant of each cycle of voltage analog signal $V_{AS2}$ corresponds to voltage analog signal $V_{AS2}$ having a negative polarity and a positive slope. During the final quadrant, voltage binary signal $V_{BS1}$ equates common reference CREF in response to a detection of the positive slope of voltage analog signal $V_{AS2}$. As a result, voltage analog signal $V_{AS4}$ equates an approximation of voltage analog signal $V_{AS2}$ that slightly lags voltage analog signal $V_{AS2}$ as a function of capacitor C4, and voltage reference signal $V_{RS1}$ equates a biased attenuation of voltage analog signal $V_{AS4}$, i.e. a biased attenuation of voltage analog signal $V_{AS2}$. Consequently, voltage digital signal $V_{DS1}$ transitions from positive voltage source $V^+$ to common reference CREF in response to voltage analog signal $V_{AS2}$ becoming greater than voltage reference signal $V_{RS1}$ during the final quadrant of each cycle. It is to be appreciated that voltage digital signal $V_{DS1}$ is an accurate representation of each occurrence and frequency of all six cycles of voltage analog signal $V_{AS2}$, i.e. voltage analog signal $V_{AS1}$ (FIG. 2B), over the 360 degree range of rotation. It is to be further appreciated that voltage binary signal $V_{BS2}$ (FIG. 2B) equates voltage digital signal $V_{DS1}$ as shown, and therefore can be alternatively or concurrently outputted as an accurate representation of each occurrence and frequency of all six cycles of voltage analog signal $V_{AS2}$ (and of voltage analog signal $V_{AS1}$) over the 360 degree range of rotation.

Voltage digital signal $V_{DS2}$ transitions from common reference CREF to positive voltage source $V^+$ in response to voltage analog signal $V_{AS2}$ becoming greater than static voltage switching threshold $V_{TH1}$ during the first quadrant of each cycle, and transitions from positive voltage source $V^+$ to common reference CREF to in response to voltage analog signal $V_{AS2}$ becoming less than static voltage switching threshold $V_{TH1}$ during the second quadrant of each cycle. Due to the consistency of the peak-to-peak amplitude of voltage analog signal $V_{AS2}$, voltage digital signal $V_{DS2}$ is an accurate representation of each occurrence and frequency of all six cycles of voltage analog signal $V_{AS2}$, i.e. voltage analog signal $V_{AS1}$ (FIG. 2B), over the 360 degree range of rotation. The benefit of all embodiments of magnetic sensing device 10 (FIG. 1), e.g. magneto-resistive sensing device 110a (FIG. 2B) and magneto-resistive sensing device 110b (FIG. 2C) over a magnetic sensing device incorporating a static voltage switching threshold $V_{TH1}$ will now be described herein.

Figure 3B:
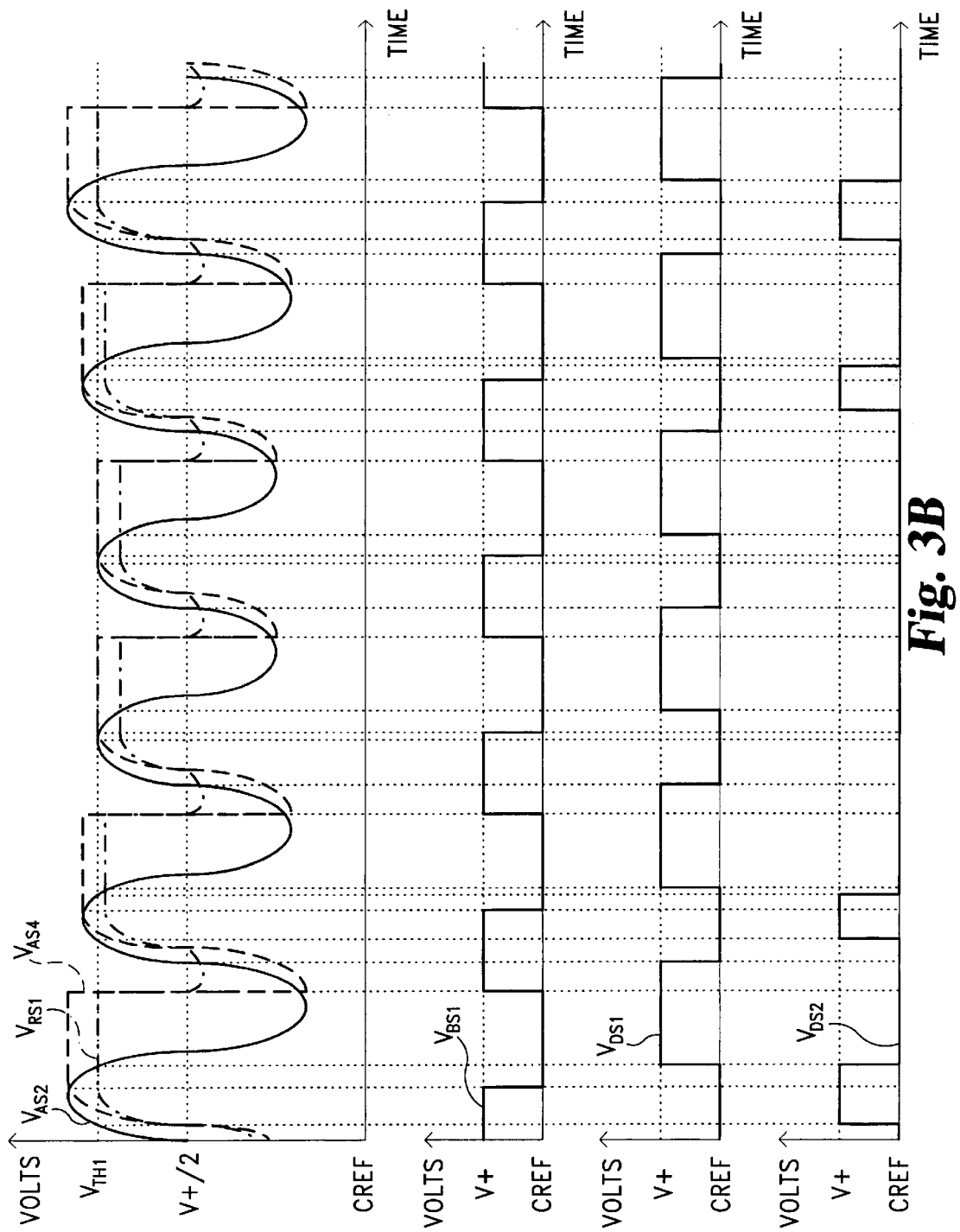
FIG. 3B is a second set of graphical diagrams of exemplary voltage waveforms as outputted by various components of a digital circuit of the magneto-resistive sensing device of FIG. 2B.

Referring to FIG. 3B, a second set of graphical diagrams consisting of an exemplary voltage analog signal $V_{AS2}$ as outputted by input amplifier 140a (FIG. 2B) as magneto-resistive sensor 120a (FIG. 2B) senses a constant rate of rotation of ferromagnetic gear 101 (FIG. 2A) over a 360 degree range of rotation, of an exemplary voltage analog signal $V_{AS4}$ as outputted by storage buffer 153a (FIG. 2B), of an exemplary voltage reference signal $V_{RS1}$ as outputted by attenuator 154a (FIG. 2B), of an exemplary voltage binary signal $V_{BS1}$ as outputted by slope detector 151a (FIG. 2B), of an exemplary voltage digital signal $V_{DS1}$ as outputted by output buffer 162a (FIG. 2B), and of an exemplary voltage digital signal $V_{DS2}$ as outputted by a magneto-resistive sensing device incorporating a static voltage switching threshold $V_{TH1}$. Voltage analog signal $V_{AS2}$ is exemplary shown as a sinusoidal waveform having an inconsistent peak-to-peak amplitude over the 360 degree range of rotation due to a gross manufacturing imperfection of ferromagnetic gear 101, e.g. the teeth of ferromagnetic gear 101 being unequally offset from a longitudinal axis of ferromagnetic gear 101. The variations in the peak-to-peak amplitude of voltage analog signal $V_{AS2}$ are exaggerated to better illustrate an advantage of the present invention. Due to the dynamic generation of voltage reference signal $V_{RS1}$ for each cycle of voltage analog signal $V_{AS2}$, voltage digital signal $V_{DS1}$ still transitions from common reference CREF to positive voltage source $V^+$ in response to voltage analog signal $V_{AS2}$ becoming equal to or less than voltage reference signal $V_{RS1}$ during the second quadrant of each cycle of voltage analog signal $V_{AS2}$, and voltage digital signal $V_{DS1}$ still transitions from positive voltage source $V^+$ to common reference CREF in response to voltage analog signal $V_{AS2}$ becoming greater than voltage reference signal $V_{RS1}$ during the final quadrant of each cycle of voltage analog signal $V_{AS2}$ as previously described herein in connection with FIG.

3A. Therefore, despite the inconsistency of the peak-to-peak amplitude of voltage analog signal $V_{AS2}$, i.e. voltage analog signal $V_{AS1}$ (FIG. 2B), voltage digital signal $V_{DS1}$ remains an accurate representation of each occurrence and frequency of all six cycles of voltage analog signal $V_{AS2}$ (and of voltage analog signal $V_{AS1}$) over the 360 degree range of rotation of ferromagnetic gear 101. However, as shown, voltage digital signal $V_{DS2}$ ceases being an accurate representation of each occurrence of the six cycles of voltage analog signal $V_{AS2}$ (and of voltage analog signal $V_{AS1}$) over the 360 degree range of rotation as well as an accurate representation of the frequency of the four represented cycles of voltage analog signal $V_{AS2}$ due to the incorporation of static voltage switching threshold $V_{TH1}$.

Figure 3C:
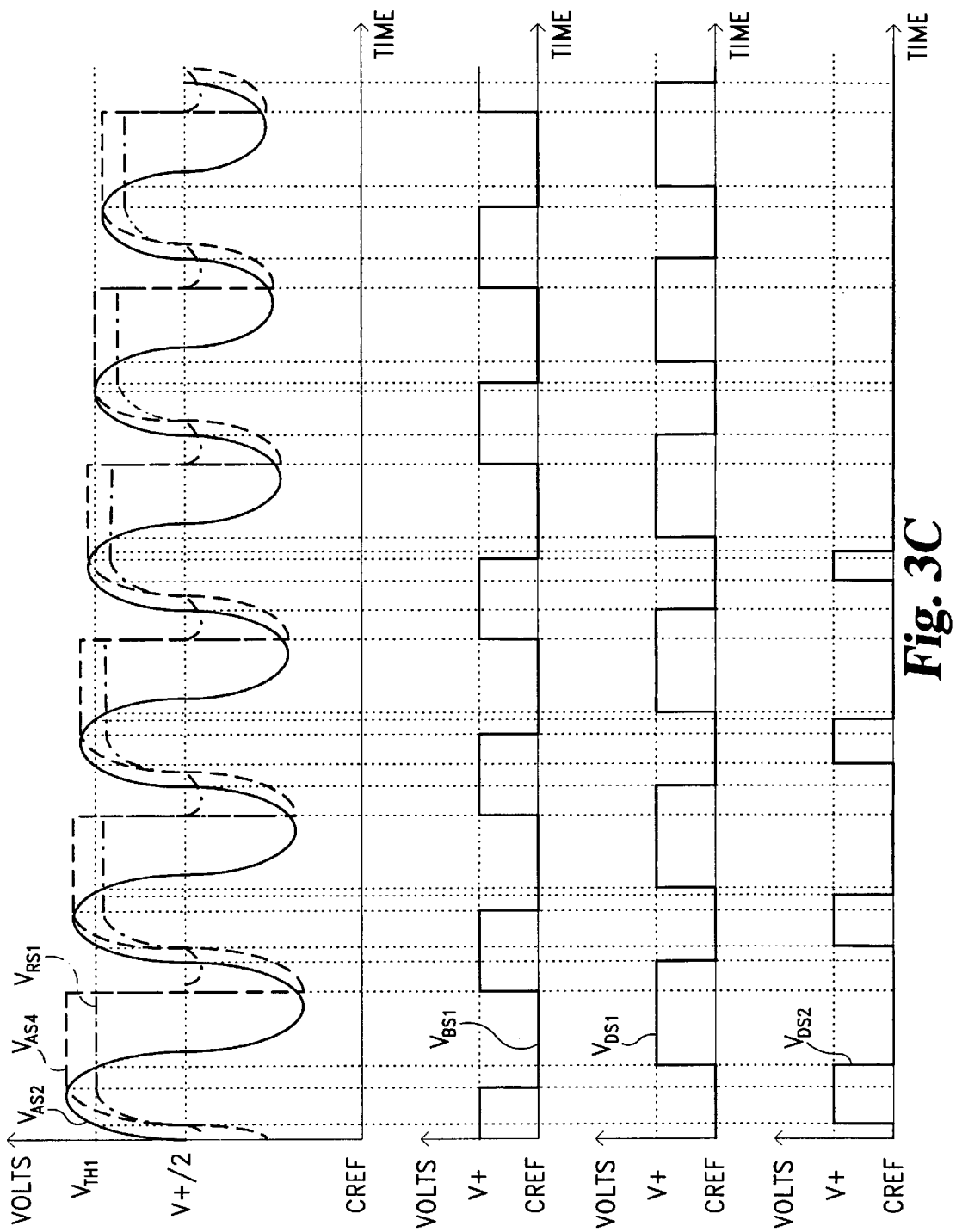
FIG. 3C is a third set of graphical diagrams of exemplary voltage waveforms as outputted by various components of a digital circuit of the magneto-resistive sensing device of FIG. 2B.

Referring to FIG. 3C, a third set of graphical diagrams consisting of an exemplary voltage analog signal $V_{AS2}$ as outputted by input amplifier 140a (FIG. 2B) as magnetoresistive sensor 120a (FIG. 2B) senses a constant rate of rotation of ferromagnetic gear 101 (FIG. 2A) over a 360 degree range of rotation, of an exemplary voltage analog signal $V_{AS4}$ as outputted by storage buffer 153a (FIG. 2B), of an exemplary voltage reference signal $V_{RS1}$ as outputted by attenuator 154a (FIG. 2B), of an exemplary voltage binary signal $V_{BS1}$ as outputted by slope detector 151a (FIG. 2B), of an exemplary voltage digital signal $V_{DS1}$ as outputted by output buffer 162a (FIG. 2B), and of an exemplary voltage digital signal $V_{DS2}$ as outputted by prior magnetoresistive sensing devices incorporating a static voltage switching threshold $V_{TH1}$. Voltage analog signal $V_{AS2}$ is exemplary shown as a sinusoidal waveform having an inconsistent peak-to-peak amplitude over the 360 degree range of rotation due a dramatic weakening in the magnetic induction of the magnetic field. The variations in the peak-to-peak amplitude of voltage analog signal $V_{AS2}$ are again exaggerated to better illustrate an advantage of the present invention. Again, due to the dynamic generation of voltage reference signal $V_{RS1}$ for each cycle of voltage analog signal $V_{AS2}$, voltage digital signal $V_{DS1}$ still transitions from common reference CREF to positive voltage source $V^+$ in response to voltage analog signal $V_{AS2}$ becoming equal to or less than voltage reference signal $V_{RS1}$ during the second quadrant of each cycle of voltage analog signal $V_{AS2}$, and voltage digital signal $V_{DS1}$ still transitions from positive voltage source $V^+$ to common reference CREF in response to voltage analog signal $V_{AS2}$ becoming greater than voltage reference signal $V_{RS1}$ during the final quadrant of each cycle of voltage analog signal $V_{AS2}$ as previously described herein in connection with FIG. 3A. Therefore, despite the inconsistency of the peak-to-peak amplitude of voltage analog signal $V_{AS2}$, i.e. voltage analog signal $V_{AS1}$ (FIG. 2B), voltage digital signal $V_{DS1}$ remains an accurate representation of each occurrence and frequency of all six cycles of voltage analog signal $V_{AS2}$ (and of voltage analog signal $V_{AS1}$) over the 360 degree range of rotation of ferromagnetic gear 101. However, as shown, voltage digital signal $V_{DS2}$ ceases being an accurate representation of each occurrence of the six cycles of voltage analog signal $V_{AS2}$ (and of voltage analog signal $V_{AS1}$) over the 360 degree range of rotation as well as an accurate representation of the frequency of the four represented cycles of voltage analog signal $V_{AS2}$ due to the incorporation of static voltage switching threshold $V_{TH1}$.

Figure 4:
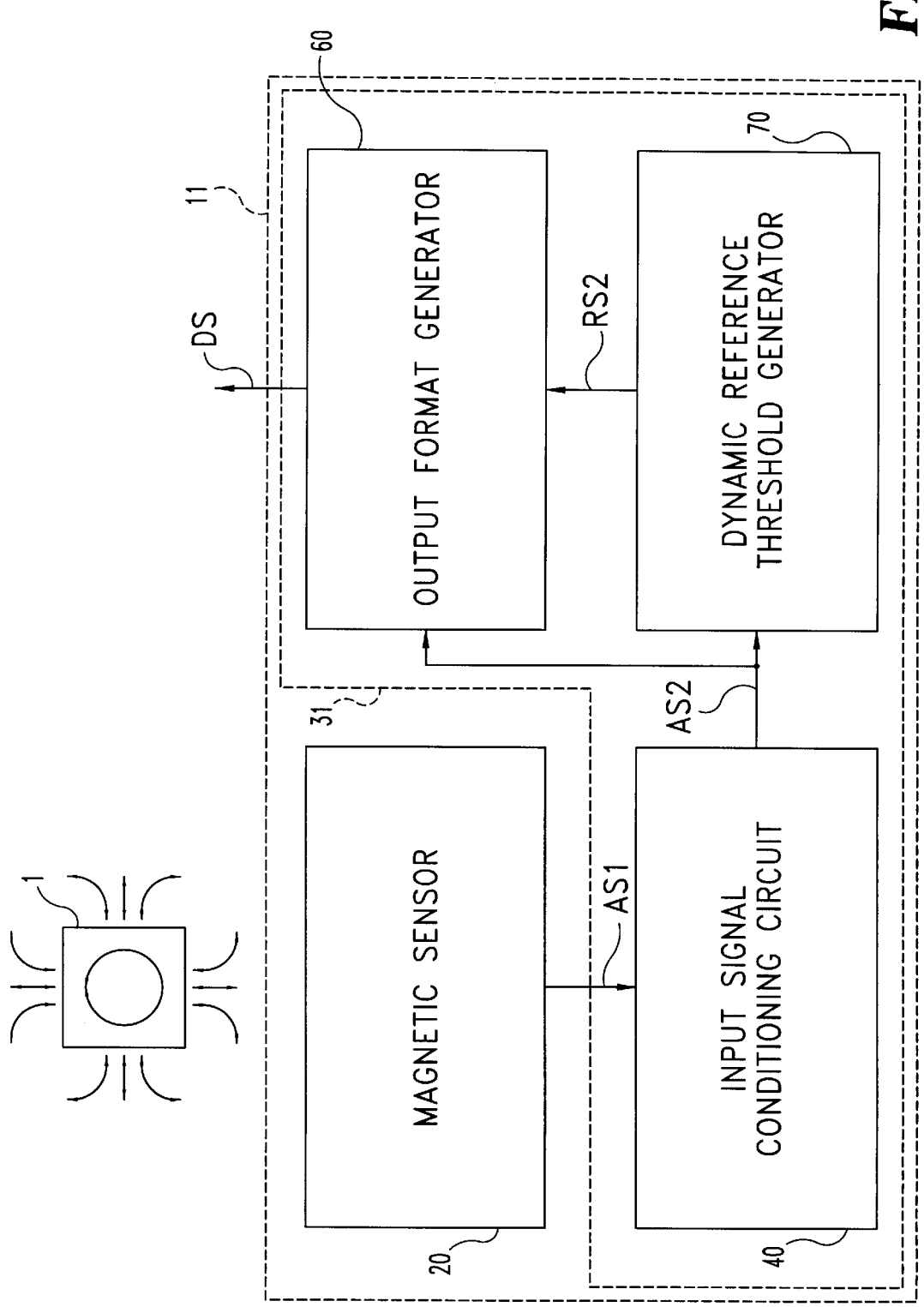
FIG. 4 is a block diagram of a second magnetic sensing device in accordance with the present invention.

Referring to FIG. 4, a block diagram of a magnetic sensing device 11 in accordance with the present invention is shown. Magnetic sensing device 11 also outputs digital signal DS (in the form of a voltage or a current) as a basis for ascertaining a degree and a rate of any rotational movement, any linear movement, and/or any angular movement (as exemplified by the arrows) of an object 1. Magnetic sensing device 11 comprises magnetic sensor 20 (FIG. 1). Magnetic sensor 20 outputs analog signal AS1 as previously described herein in connection with FIG. 1. Magnetic sensing device 11 further comprises a new and unique digital circuit 31. Digital circuit 31 also outputs digital signal DS as a dynamic representation of analog signal AS1. Digital circuit 31 includes optional input signal conditioning circuit 40 (FIG. 1). Input signal conditioning circuit 40 inputs analog signal AS1 and outputs analog signal AS2 as previously described herein in connection with FIG. 1.

Digital circuit 31 further includes a dynamic reference threshold generator 70. Dynamic reference threshold generator 70 inputs analog signal AS2 from input signal conditioning circuit 40 as shown by any type of medium, or alternatively, inputs analog signal AS1 from magnetic sensor 20 by any type of medium when input signal conditioning circuit 40 is excluded by an embodiment of digital circuit 31. For purposes of the present invention, dynamic reference threshold generator 70 is broadly defined as any electronic component or any electronic circuit that is operable for each cycle of analog signal AS2 (or analog signal AS1) to output a reference signal RS2 (in the form of a voltage or a current) equating a percentage (fixed or variable) of analog signal AS2 (or analog signal AS1) in response to a detection of a first opposing pair of quadrants of analog signal AS2 (or analog signal AS1) and equating a percentage (fixed or variable) of a peak amplitude of analog signal AS2 (or analog signal AS1) in response to a detection of a second opposing pair of quadrants of analog signal AS2 (or analog signal AS1). Thus, reference signal RS2 is dynamically generated for each cycle of analog signal AS2 (or analog signal AS1). For example, an embodiment of dynamic reference threshold generator 70 could be operable for each cycle of analog signal AS2 (or analog signal AS1) to output reference signal RS2 as a voltage reference signal equating a variable percentage of analog signal AS2 (or analog signal AS1) in response to a detection of a first quadrant and a third quadrant of analog signal AS2 (or analog signal AS1), equating eighty (80) percent of a positive peak amplitude of analog signal AS2 (or analog signal AS1) in response to a detection of a second quadrant of analog signal AS2 (or analog signal AS1), and equating eighty (80) percent of a negative peak amplitude of analog signal AS2 (or analog signal AS1) in response to a detection of a fourth quadrant of analog signal AS2 (or analog signal AS1). Also by example, an embodiment of dynamic reference threshold generator 70 could be operable for each cycle of analog signal AS2 (or analog signal AS1) to output reference signal RS2 as a current reference signal equating fifty (50) percent of analog signal AS2 (or analog signal AS1) in response to a detection of a second quadrant and a fourth quadrant of analog signal AS2 (or analog signal AS1), equating fifty (50) percent of a negative peak amplitude of analog signal AS2 (or analog signal AS1) in response to a detection of a first quadrant of analog signal AS2 (or analog signal AS1), and equating fifty (50) percent of a positive peak amplitude of analog signal AS2 (or analog signal AS1) in response to a detection of third quadrant of analog signal AS2 (or analog signal AS1). Consequently, any illustration and accompanying description herein of a particular embodiment of dynamic reference threshold generator 70 is given solely for purposes of describing the best mode of the present invention and is not meant to be limiting in any way. Digital circuit 31 further includes output format generator 60 (FIG. 1). Output format generator 60 inputs reference signal RS2 from dynamic reference threshold generator 70 as shown by any type of medium. Output format generator 60 outputs digital signal DS as previously described herein in connection with FIG. 1.

Figure 5A:
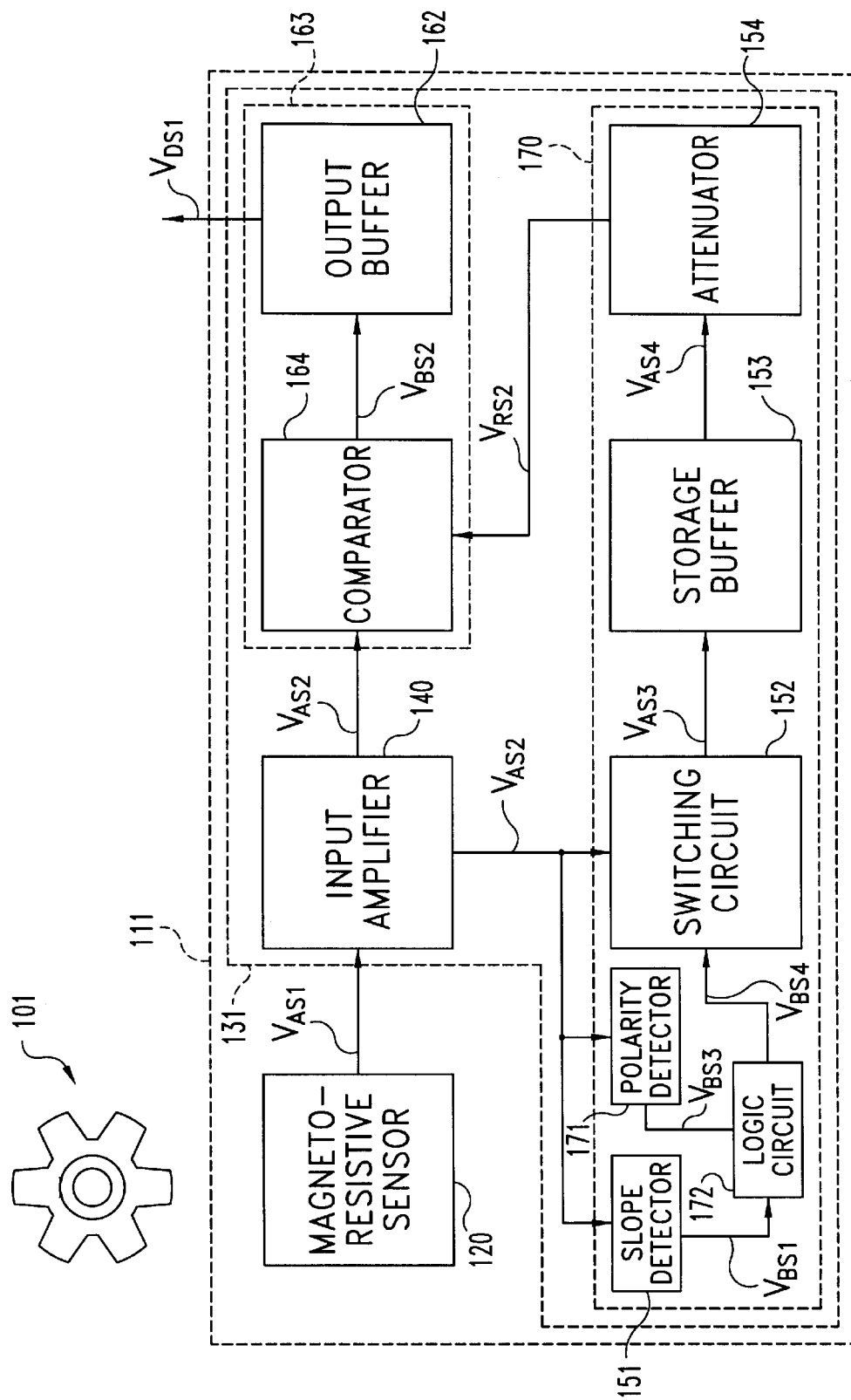
FIG. 5A is a block diagram of one embodiment of the magnetic sensing device of FIG. 4.

FIG. 5A is a block diagram a magneto-resistive sensing device 111 as an embodiment of magnetic sensing device 11 (FIG. 4). Referring to FIG. 5A, magneto-resistive sensing device 111 also outputs voltage digital signal $V_{DS1}$ as shown as a basis for ascertaining a degree and a rate of any rotational movement (as exemplified by the arrows) of a ferromagnetic gear 101. Magneto-resistive sensing device 111 comprises magneto-resistive sensor 120 (FIG. 2A). Magneto-resistive sensor 120 outputs voltage analog signal $V_{AS1}$ as previously described herein in connection with FIG. 2A. Magneto-resistive sensing device 111 further comprises a digital circuit 131 as an embodiment of digital circuit 31 (FIG. 4). Digital circuit 131 also outputs voltage digital signal $V_{DS1}$ as a dynamic representation of voltage analog signal $V_{AS1}$. Digital circuit 131 includes optional input amplifier 140 (FIG. 2A). Input amplifier 140 inputs voltage analog signal $V_{AS1}$ and outputs voltage analog signal $V_{AS2}$ as previously described herein in connection with FIG. 2A.

Digital circuit 131 further includes a dynamic reference threshold generator 170 as an embodiment of dynamic reference threshold generator 70 (FIG. 4). Dynamic reference threshold generator 170 includes slope detector 151 (FIG. 2A), a polarity detector 171, a logic circuit 172, switching circuit 152 (FIG. 2A), storage buffer 153 (FIG. 2A), and attenuator 154 (FIG. 2A). Slope detector 151 inputs voltage analog signal $V_{AS2}$ (or voltage analog signal $V_{AS1}$) and outputs voltage binary signal $V_{BS1}$ as previously described herein in connection with FIG. 2A. Polarity detector 171 inputs voltage analog signal $V_{AS2}$ from input amplifier 140 as shown by any type of medium, or alternatively, inputs voltage analog signal $V_{AS1}$ from magnetic sensor 120 by any type of medium when input amplifier 140 is excluded by an embodiment of digital circuit 131. For purposes of the present invention, polarity detector 171 is broadly defined as any electronic component or any electronic circuit that is operable to output a voltage binary signal $V_{BS3}$ equating a fixed voltage level in response to a detection of a positive polarity of voltage analog signal $V_{AS2}$ (or voltage analog signal $V_{AS1}$) and equating another fixed voltage level in response to a detection of a negative polarity of voltage analog signal $V_{AS2}$ (or voltage analog signal $V_{AS1}$). Consequently, any illustration and accompanying description herein of a particular embodiment of polarity detector 171 is given solely for purposes of describing the best mode of the present invention and is not meant to be limiting in any way.

Logic circuit 172 inputs voltage binary signal $V_{BS1}$ from slope detector 151 as shown by any type of medium, and inputs voltage binary signal $V_{BS3}$ from polarity detector 171 as shown by any type of medium. For purposes of the present invention, logic circuit 172 is broadly defined as any electronic component or any electronic circuit that is operable to output a voltage binary signal $V_{BS4}$ equating a fixed voltage level in response to voltage binary signal $V_{BS1}$ equating voltage binary signal $V_{BS3}$, and equating a another fixed voltage level in response to voltage binary signal $V_{BS1}$ differing from voltage binary signal $V_{BS3}$. Consequently, any illustration and accompanying description herein of a particular embodiment of logic circuit 172 is given solely for purposes of describing the best mode of the present invention and is not meant to be limiting in any way. Switching circuit 152 inputs voltage binary signal $V_{BS4}$, and outputs voltage analog signal $V_{AS3}$ as previously described herein in connection with FIG. 2A. Storage buffer 153 inputs voltage analog signal $V_{AS3}$ and outputs voltage analog signal $V_{AS4}$ as previously described herein in connection with FIG. 2A. Attenuator 154 inputs voltage analog signal $V_{AS4}$ and outputs voltage reference signal $V_{RS2}$ as previously described herein in connection with FIG. 2A.

Digital circuit 131 further includes output format generator 160 (FIG. 2A) including comparator 161 (FIG. 2A), and output buffer 162 (FIG. 2A). Comparator 161 inputs voltage reference signal $V_{RS2}$ and outputs voltage binary signal $V_{BS2}$ as previously described herein in connection with FIG. 2A. Output buffer 162 outputs voltage binary signal $V_{BS2}$ and outputs voltage digital signal $V_{DS1}$ as previously described herein in connection with FIG. 2A.

Figure 5B:
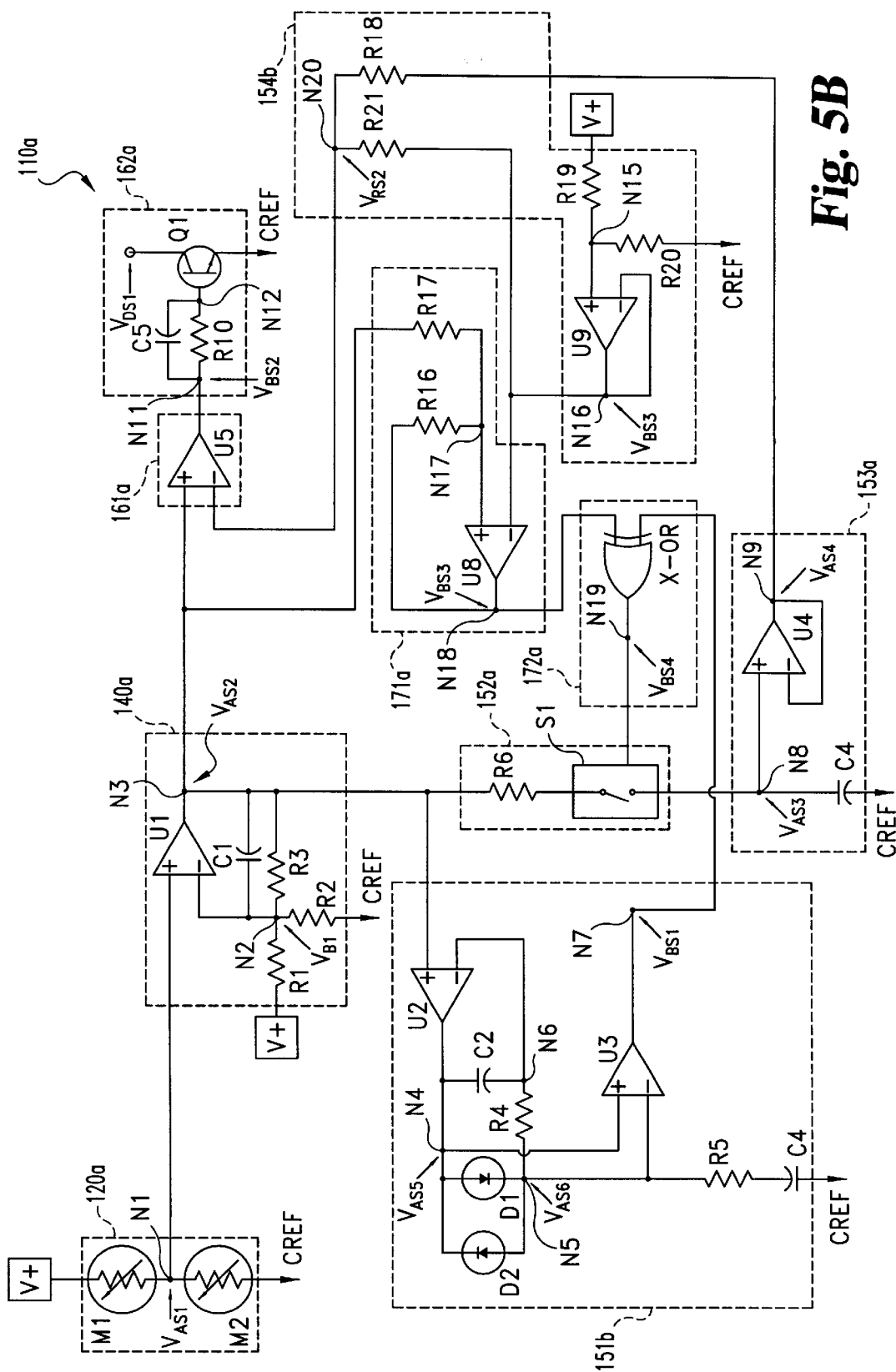
FIG. 5B is a schematic diagram of one embodiment of the magneto-resistive sensing device of FIG. 5A.

FIG. 5B is a schematic diagram of a magneto-resistive sensing device 111a as an embodiment of magneto-resistive sensing device 111 (FIG. 5A). Referring to FIG. 5B, magneto-resistive sensing device 111a comprises magneto-resistive sensor 120a (FIG. 2B). Magneto-resistive sensor 120a outputs voltage analog signal $V_{AS1}$ via node N1 as previously described herein in connection with FIG. 2B. Magneto-resistive sensing device 111a further comprises input amplifier 140a (FIG. 2B), slope detector 151b as a modification of slope detector 151a (FIG. 2A), a polarity detector 171a as an embodiment of polarity detector 171 (FIG. 5A), a logic circuit 172a as an embodiment of logic circuit 172 (FIG. 5A), switching circuit 152a (FIG. 2B), storage buffer 153a (FIG. 2B), an attenuator 154b as an embodiment of attenuator 154 (FIG. 5A), comparator 161a (FIG. 2B), and output buffer 162a (FIG. 2B). Input amplifier 140a inputs voltage analog signal $V_{AS1}$ and outputs voltage analog signal $V_{AS2}$ as previously described herein in connection with FIG. 2B. Slope detector 151b is a modification of slope detector 151a in that the noninverting input of comparator U3 is electrically coupled node N4 to thereby input voltage analog signal $V_{AS5}$, and the inverting input of comparator U3 is electrically coupled to node N5 to thereby input voltage analog signal $V_{AS6}$. Thus, comparator U3 outputs voltage binary signal $V_{BS1}$ equating common reference CREF, e.g. zero (0) volts, in response to voltage analog signal $V_{AS5}$ being equal to or less than voltage analog signal $V_{AS6}$ and to output voltage binary signal $V_{BS1}$ as equating positive voltage source $V^+$, e.g. five (5) volts, in response to voltage analog signal $V_{AS5}$ being greater than voltage analog signal $V_{AS6}$.

Polarity detector 171a is a non-inverting Schmitt trigger including an comparator U8, a resistor R16, and a resistor R17. Resistor R17 is electrically coupled to node N3 and to a node N17 to thereby input voltage analog signal $V_{AS2}$. A noninverting input of comparator U8 and resistor R17 is electrically coupled to node N17 to thereby input an attenuation of voltage analog signal $V_{AS2}$. An inverting terminal of comparator U8 is electrically coupled to a node N16 to thereby input a biasing voltage $V_{B3}$ as further described herein. An output terminal of comparator U8 outputs a voltage binary signal $V_{BS3}$ (FIG. 5A) via a node N18 in response to the attenuated voltage analog signal $V_{AS2}$ and to biasing voltage $V_{B3}$. Resistor R16 is electrically coupled to node N17 and to node N18 to thereby provide a positive feedback i.e. a hysteresis, to comparator U8. The particular model of comparator U8, and the electrical resistive values of resistor R16 and R17 are selected to output voltage binary signal $V_{BS3}$ equating positive voltage source V+in response to attenuated voltage analog signal $V_{AS2}$ being more positive than a desired upper trip point, and to output voltage binary signal $V_{BS3}$ equating common reference CREF in response to attenuated voltage analog signal $V_{AS2}$ being more negative than a desired lower trip point.

Logic circuit 172a is an exclusive OR gate XOR One of the inputs of exclusive OR gate XOR is electrically coupled to node N7 to thereby input voltage binary signal $V_{BS1}$, and the other input of exclusive OR gate XOR is electrically coupled to node N18 to thereby input voltage binary signal $V_{BS2}$. An output terminal of exclusive OR gate XOR outputs voltage binary signal $V_{BS4}$ (FIG. 5A) via a node N19 in response voltage binary signal $V_{BS1}$ and voltage binary signal $V_{BS3}$. The particular model of exclusive OR gate XOR is selected to output voltage binary signal $V_{BS4}$ equating common reference CREF in response to voltage binary signal $V_{BS1}$ equating voltage binary signal $V_{BS3}$, and to output voltage binary signal $V_{BS4}$ equating positive voltage source $V^+$ in response to voltage binary signal $V_{BS1}$ differing from voltage binary signal $V_{BS3}$. Switching circuit 152a inputs voltage binary signal $V_{BS4}$ from exclusive OR gate XOR as shown by any type of medium, and outputs voltage analog signal $V_{AS3}$ as previously described in connection with FIG. 2B. An embodiment of magneto-resistive sensing device 111 can include switch circuit 152b (FIG. 2C) as an alternative to switching 152a (FIG. 5B). For such embodiments of magneto-resistive sensing device 111, switching circuit 152b inputs voltage binary signal $V_{BS4}$ from exclusive OR gate XOR as shown by any type of medium, and outputs voltage analog signal $V_{AS3}$ as previously described in connection with FIG. 2C. Storage buffer 153a inputs voltage analog signal $V_{AS3}$ and outputs voltage analog signal $V_{AS4}$ as previously described in connection with FIG. 2B.

Attenuator 154b includes a resistor R18, a resistor R19, a resistor R20, an operational amplifier U9, and a resistor R21. Resistor R19 is electrically coupled to positive voltage source $V^+$ and to a node N15, resistor R20 is electrically coupled to node N15 and to common reference CREF, a noninverting input of operational amplifier U9 is electrically coupled to node N15, and an output terminal of operational amplifier U9 is electrically coupled to node N16 to thereby establish bias voltage signal $V_{B3}$ at node N16. An inverting input of operational amplifier U9 is electrically coupled to node N16 to thereby provide a negative feedback to operational amplifier U9. Resistor R18 is electrically coupled to node N9 to thereby input voltage analog signal $V_{AS4}$. Resistor R18 is electrically coupled to a node N20, and resistor 21 is electrically coupled to node N16 and node N20 to thereby establish voltage reference signal $V_{RS2}$ (FIG. 5A) at node N20. The particular model of operational amplifier U9, and the electrical resistive values of resistors R18–R21 are selected in view of voltage analog signal $V_{AS4}$, bias voltage signal $V_{BS3}$, positive voltage source $V^+$ and common reference CREF to equate voltage reference signal $V_{RS2}$ as a biased attenuation of voltage analog signal $V_{AS4}$. Comparator 161a inputs voltage analog signal $V_{AS2}$ and voltage reference signal $V_{RS2}$, and outputs voltage binary signal $V_{BS2}$ as previously de scribed herein in connection with FIG. 2B. Output buffer 162a inputs voltage binary signal $V_{BS2}$ and outputs voltage digital signal $V_{DS1}$ as previously described herein in connection with FIG. 2B.

Figure 6A:
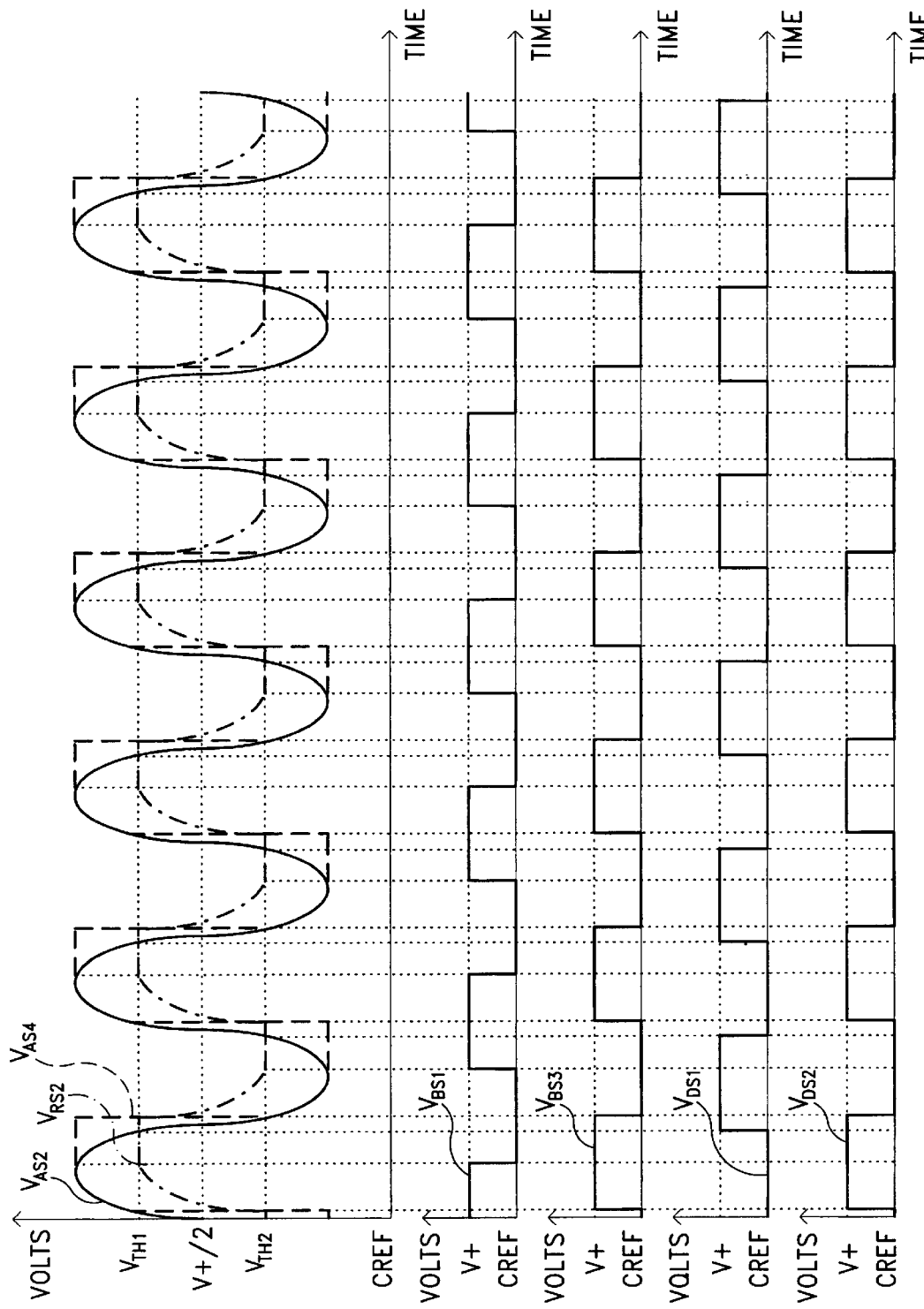
FIG. 6A is a first set of graphical diagrams of exemplary voltage waveforms as outputted by various components of a digital circuit of the magneto-resistive sensing device of FIG. 5B.

Referring to FIG. 6A, a first set of graphical diagrams consisting of an exemplary voltage analog signal $V_{AS2}$ as outputted by input amplifier 140a (FIG. 5B) as magneto-resistive sensor 120a (FIG. 5B) senses a constant rate of rotation of ferromagnetic gear 101 (FIG. 5A) over a 360 degree range of rotation, of an exemplary voltage analog signal $V_{AS4}$ as outputted by storage buffer 153a (FIG. 5B), of an exemplary voltage reference signal $V_{RS2}$ as outputted by attenuator 154b (FIG. 5B), of an exemplary voltage binary signal $V_{BS1}$ as outputted by slope detector 151b (FIG. 5B), of an exemplary voltage binary signal $V_{BS3}$ as outputted by polarity detector 171 a (FIG. 5B), of an exemplary voltage digital signal $V_{DS1}$ as outputted by output buffer 162a (FIG. 5B), and of an exemplary voltage digital signal $V_{DS2}$ as outputted by a magneto-resistive sensing device incorporating a static voltage switching threshold $V_{TH1}$ and a static voltage switching threshold $V_{TH2}$. Voltage analog signal $V_{AS2}$ is exemplary shown as a sinusoidal waveform having a consistent peak-to-peak amplitude over the 360 degree range of rotation. The first quadrant of each cycle of voltage analog signal $V_{AS2}$ corresponds to voltage analog signal $V_{AS2}$ having a positive polarity and a positive slope. During the first quadrant, voltage binary signal $V_{BS1}$ equates positive voltage source $V^+$ in response to a detection of the positive slope of voltage analog signal $V_{AS2}$, and voltage binary signal $V_{BS3}$ transitions from common reference CREF to positive voltage source $V^+$ in response to voltage analog signal $V_{AS2}$ becoming more positive than an upper trip point. As a result, voltage analog signal $V_{AS4}$ equates an approximation of voltage analog signal $V_{AS2}$ that slightly lags voltage analog signal $V_{AS2}$ as a function of capacitor C4 (FIG. 5B), and voltage reference signal $V_{RS2}$ equates a biased attenuation of voltage analog signal $V_{AS4}$, i.e. a biased attenuation of voltage analog signal $V_{AS2}$. Consequently, voltage digital signal $V_{DS1}$ equates common reference CREF in response to voltage analog signal $V_{AS2}$ being greater than voltage reference signal $V_{RS2}$. The second quadrant of each cycle of voltage analog signal $V_{AS2}$ corresponds to voltage analog signal $V_{AS2}$ having a positive polarity and a negative slope. During the second quadrant, voltage binary signal $V_{BS1}$ equates common reference CREF in response to a detection of the negative slope of voltage analog signal $V_{AS2}$, and $V_{BS3}$ equates common reference CREF in response to a detection of the positive polarity of voltage analog signal $V_{AS2}$. As a result, voltage analog signal $V_{AS4}$ equates an approximation of the positive peak amplitude of voltage analog signal $V_{AS2}$, and voltage reference signal $V_{RS2}$ equates a biased attenuation of voltage analog signal $V_{AS4}$, i.e. a biased attenuation of the positive peak amplitude of voltage analog signal $V_{AS2}$. Consequently, voltage digital signal $V_{DS1}$ transitions from common reference CREF to positive voltage source $V^+$ in response to voltage analog signal $V_{AS2}$ becoming equal to or less than voltage reference signal $V_{RS1}$ during the second quadrant of each cycle of voltage analog signal $V_{AS2}$.

The third quadrant of each cycle of voltage analog signal $V_{AS2}$ corresponds to voltage analog signal $V_{AS2}$ having a negative polarity and a negative slope. During the third quadrant, voltage binary signal $V_{BS1}$ equates common reference CREF in response to a detection of the negative slope of voltage analog signal $V_{AS2}$, and voltage binary signal $V_{BS3}$ transitions from positive voltage source $V^+$ to common reference CREF in response to voltage analog signal $V_{AS2}$ becoming more negative than a lower trip point. As a result, voltage analog signal $V_{AS4}$ equates an approximation of voltage analog signal $V_{AS2}$ that slightly lags voltage analog signal $V_{AS2}$ and voltage reference signal $V_{RS2}$ equates a biased attenuation of voltage analog signal $V_{AS4}$. Consequently, voltage digital signal $V_{DS1}$ equates positive voltage source $V^+$ in response to voltage analog signal $V_{AS2}$ being less than voltage reference signal $V_{RS2}$. The final quadrant of each cycle of voltage analog signal $V_{AS2}$ corresponds to voltage analog signal $V_{AS2}$ having a negative polarity and a positive slope. During the final quadrant, voltage binary signal $V_{BS1}$ equates positive voltage source $V^+$ in response to a detection of the positive slope of voltage analog signal $V_{AS2}$, and voltage binary signal $V_{BS3}$ equates common reference CREF in response to a detection of a negative polarity of voltage analog signal $V_{AS2}$. As a result, voltage analog signal $V_{AS4}$ equates an approximation of the negative peak amplitude of voltage analog signal $V_{AS2}$, and voltage reference signal $V_{RS2}$ equates a biased attenuation of the voltage analog signal $V_{AS4}$, i.e. a biased attenuation of the negative peak amplitude of voltage analog signal $V_{AS2}$. Consequently, voltage digital signal $V_{DS1}$ transitions from positive voltage source V+ to common reference CREF in response to voltage analog signal $V_{AS2}$ becoming greater than voltage reference signal $V_{RS2}$ during the final quadrant of each cycle. It is to be appreciated that voltage digital signal $V_{DS1}$ is an accurate representation of each occurrence and frequency of all six cycles of voltage analog signal $V_{AS2}$, i.e. voltage analog signal $V_{AS1}$ (FIG. 5B), over the 360 degree range of rotation. It is to be further appreciated that voltage binary signal $V_{BS2}$ (FIG. 2B) equates voltage digital signal $V_{DS1}$ as shown, and therefore can be alternatively or concurrently outputted as an accurate representation of each occurrence and frequency of all six cycles of voltage analog signal $V_{AS2}$ over the 360 degree range of rotation.

Voltage digital signal $V_{DS2}$ transitions from common reference CREF to positive voltage source V+ in response to voltage analog signal $V_{AS2}$ becoming greater than static voltage switching threshold $V_{TH1}$ during the first quadrant of each cycle, and transitions from positive voltage source V+ to common reference CREF to in response to voltage analog signal $V_{AS2}$ becoming less than a static voltage switching threshold $V_{TH2}$ during the third quadrant of each cycle. Due to the consistency of the peak-to-peak amplitude of voltage analog signal $V_{AS2}$, voltage digital signal $V_{DS2}$ is an accurate representation of each occurrence and frequency of all six cycles of voltage analog signal $V_{AS2}$, i.e. voltage analog signal $V_{AS1}$ (FIG. 2B), over the 360 degree range of rotation. The benefit of all embodiments of magnetic sensing device 11 (FIG. 4), e.g. magneto-resistive sensing device 111a (FIG. 5B), over a magnetic sensing device incorporating static voltage switching threshold $V_{TH1}$ and static voltage switching threshold $V_{TH2}$ will now be described herein.

Figure 6B:
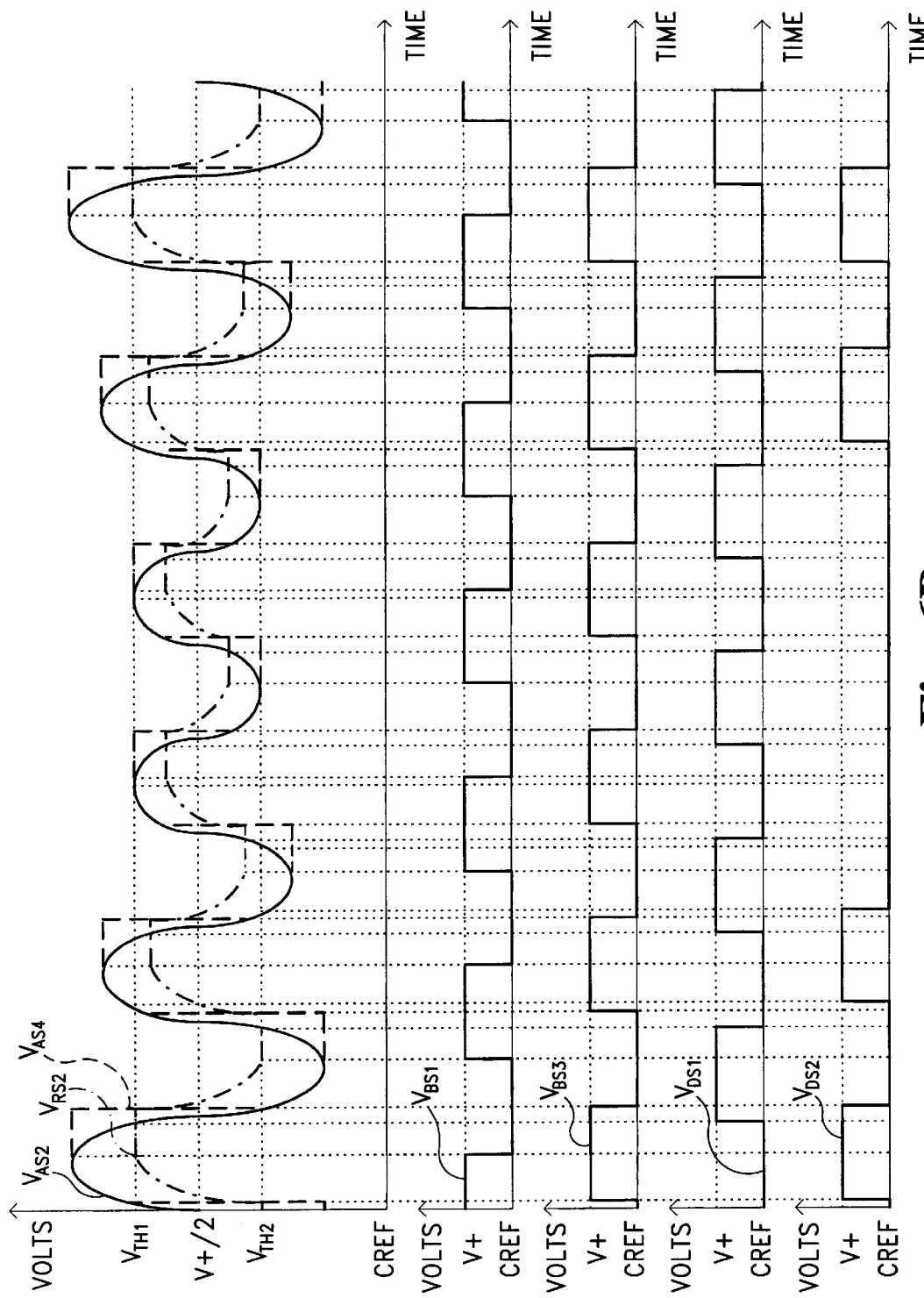
FIG. 6B is a second set of graphical diagrams of exemplary voltage waveforms as outputted by various components of a digital circuit of the magneto-resistive sensing device of FIG. 5B.

Referring to FIG. 6B, a second set of graphical diagrams consisting of an exemplary voltage analog signal $V_{AS2}$ as outputted by input amplifier 140a (FIG. 5B) as magneto-resistive sensor 120a (FIG. 5B) senses a constant rate of rotation of ferromagnetic gear 101 (FIG. 5A) over a 360 degree range of rotation, of an exemplary voltage analog signal $V_{AS4}$ as outputted by storage buffer 153a (FIG. 5B), of an exemplary voltage reference signal $V_{RS1}$ as outputted by attenuator 154b (FIG. 5B), of an exemplary voltage binary signal $V_{BS1}$ as outputted by slope detector 151b (FIG. 5B), of an exemplary voltage binary signal $V_{BS3}$ as outputted by polarity detector 171a (FIG. 5B), of an exemplary voltage digital signal $V_{DS1}$ as outputted by output buffer 162a (FIG. 5B), and of an exemplary voltage digital signal $V_{DS2}$ as outputted by a magneto-resistive sensing device incorporating static voltage switching threshold VTH, and static voltage switching threshold $V_{TH2}$. Voltage analog signal $V_{AS2}$ is exemplary shown as a sinusoidal waveform having an inconsistent peak-to-peak amplitude over the 360 degree range of rotation due to a gross manufacturing imperfection of ferromagnetic gear 101. The variations in the peak-to-peak amplitude of voltage analog signal $V_{AS2}$ is exaggerated to better illustrate an advantage of the present invention. Due to the dynamic generation of voltage reference signal $V_{RS2}$ for each cycle of voltage analog signal $V_{AS2}$, voltage digital signal $V_{DS1}$ still transitions from common reference CREF to positive voltage source V+ in response to voltage analog signal $V_{AS2}$ becoming equal to or less than voltage reference signal $V_{RS2}$ during the second quadrant of each cycle of voltage analog signal $V_{AS2}$, and voltage digital signal $V_{DS1}$ still transitions from positive voltage source V+ to common reference CREF in response to voltage analog signal $V_{AS2}$ becoming greater than voltage reference signal $V_{RS2}$ during the fourth quadrant of each cycle of voltage analog signal $V_{AS2}$ as previously described herein in connection with FIG. 6A. Therefore, despite the inconsistency of the peak-to-peak amplitude of voltage analog signal $V_{AS2}$, i.e. voltage analog signal $V_{AS1}$ (FIG. 5A), voltage digital signal $V_{DS1}$ remains an accurate representation of each occurrence and frequency of all six cycles of voltage analog signal $V_{AS2}$ over the 360 degree range of rotation of ferromagnetic gear 101. However, as shown, voltage digital signal $V_{DS2}$ ceases being an accurate representation of each occurrence of the six cycles of voltage analog signal $V_{AS2}$ over the 360 degree range of rotation as well as an accurate representation of the frequency of the four represented cycles of voltage analog signal $V_{AS2}$ due to the incorporation of static voltage switching threshold $V_{TH1}$ and static voltage switching threshold $V_{TH2}$.

Figure 6C:
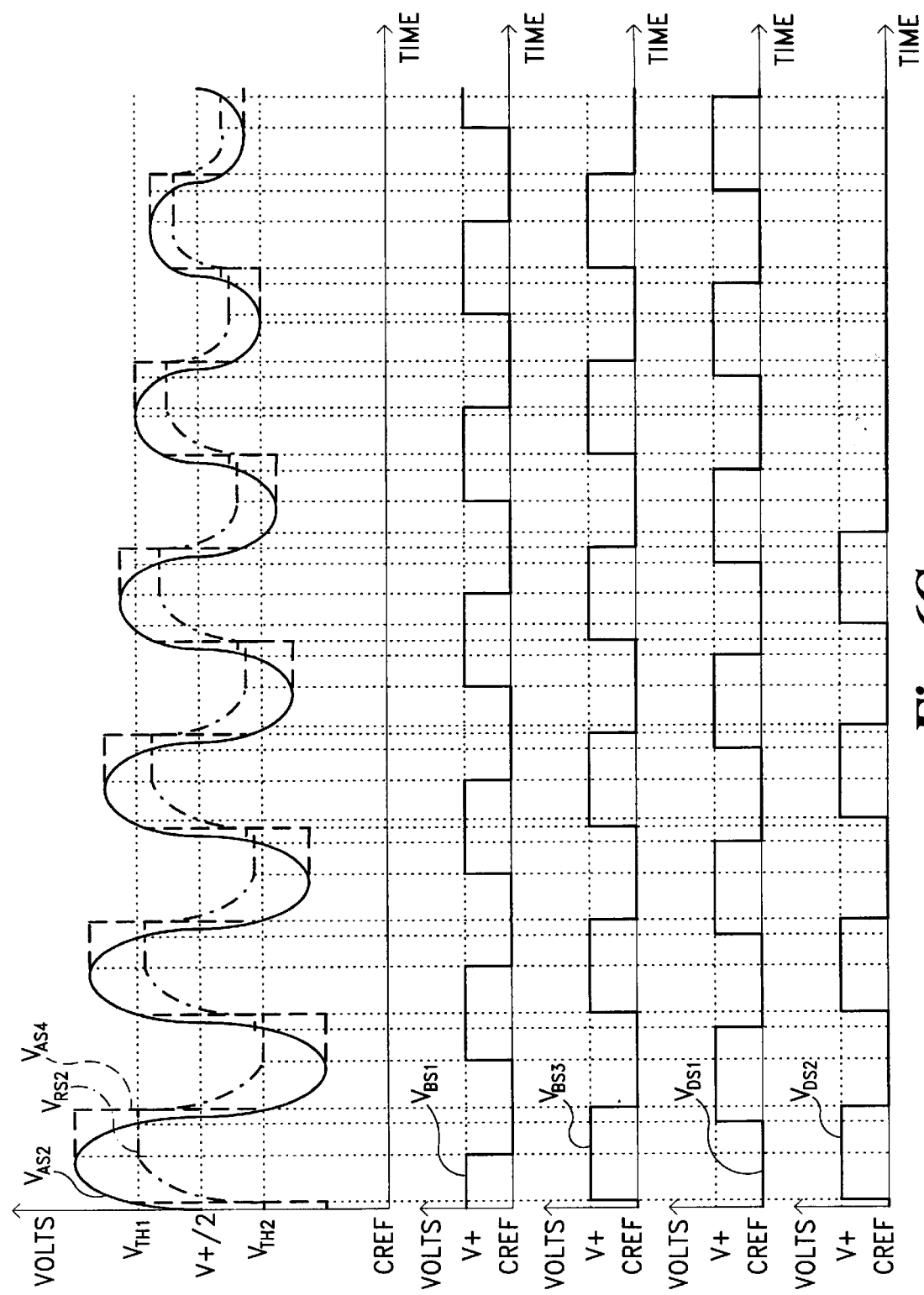
FIG. 6C is a second set of graphical diagrams of exemplary voltage waveforms as outputted by various components of a digital circuit of the magneto-resistive sensing device of FIG. 5B.

Referring to FIG. 6C, a third set of graphical diagrams consisting of an exemplary voltage analog signal $V_{AS2}$ as outputted by input amplifier 140a (FIG. 5B) as magneto-resistive sensor 120a (FIG. 5B) senses a constant rate of rotation of ferromagnetic gear 101 (FIG. 5A) over a 360 degree range of rotation, of an exemplary voltage analog signal $V_{AS4}$ as outputted by storage buffer 153a (FIG. 5B), of an exemplary voltage reference signal $V_{RS1}$ as outputted by attenuator 154b (FIG. 5B), of an exemplary voltage binary signal $V_{BS1}$ as outputted by slope detector 151b (FIG. 5B), of an exemplary voltage binary signal $V_{BS3}$ as outputted by polarity detector 171a (FIG. 5B), of an exemplary voltage digital signal $V_{DS1}$ as outputted by output buffer 162a (FIG. 5B), and of an exemplary voltage digital signal $V_{DS2}$ as outputted by a magneto-resistive sensing device incorporating static voltage switching threshold $V_{TH1}$ and static voltage switching threshold $V_{TH2}$. Voltage analog signal $V_{AS2}$ again is exemplary shown as a sinusoidal waveform having an inconsistent peak-to-peak amplitude over the 360 degree range of rotation due a weakening in the magnetic induction of the magnetic field. The variations in the peak-to-peak amplitude of voltage analog signal $V_{AS2}$ is exaggerated to better illustrate an advantage of the present invention. Again, due to the dynamic generation of voltage reference signal $V_{RS2}$ for each cycle of voltage analog signal $V_{AS2}$, voltage digital signal $V_{DS1}$ still transitions from common reference CREF to positive voltage source V+in response to voltage analog signal $V_{AS2}$ becoming equal to or less than voltage reference signal $V_{RS2}$ during the second quadrant of each cycle of voltage analog signal $V_{AS2}$, and voltage digital signal $V_{DS1}$ still transitions from positive voltage source V+ to common reference CREF in response to voltage analog signal $V_{AS2}$ becoming greater than voltage reference signal $V_{RS2}$ during the fourth quadrant of each cycle of voltage analog signal $V_{AS2}$ as previously described herein in connection with FIG. 6A. Therefore, despite the inconsistency of the peak-to-peak amplitude of voltage analog signal $V_{AS2}$, i.e. voltage analog signal $V_{AS1}$ (FIG. 5A), voltage digital signal $V_{DS1}$ remains an accurate representation of each occurrence and frequency of all six cycles of voltage analog signal $V_{AS2}$ over the 360 degree range of rotation of ferromagnetic gear 101. However, as shown, voltage digital signal $V_{DS2}$ ceases being an accurate representation of each occurrence of the six cycles of voltage analog signal $V_{AS2}$ over the 360 degree range of rotation as well as an accurate representation of the frequency of the four represented cycles of voltage analog signal $V_{AS2}$ due to the incorporation of static voltage switching threshold $V_{TH1}$ and static voltage switching threshold $V_{TH2}$.

Figure 7:
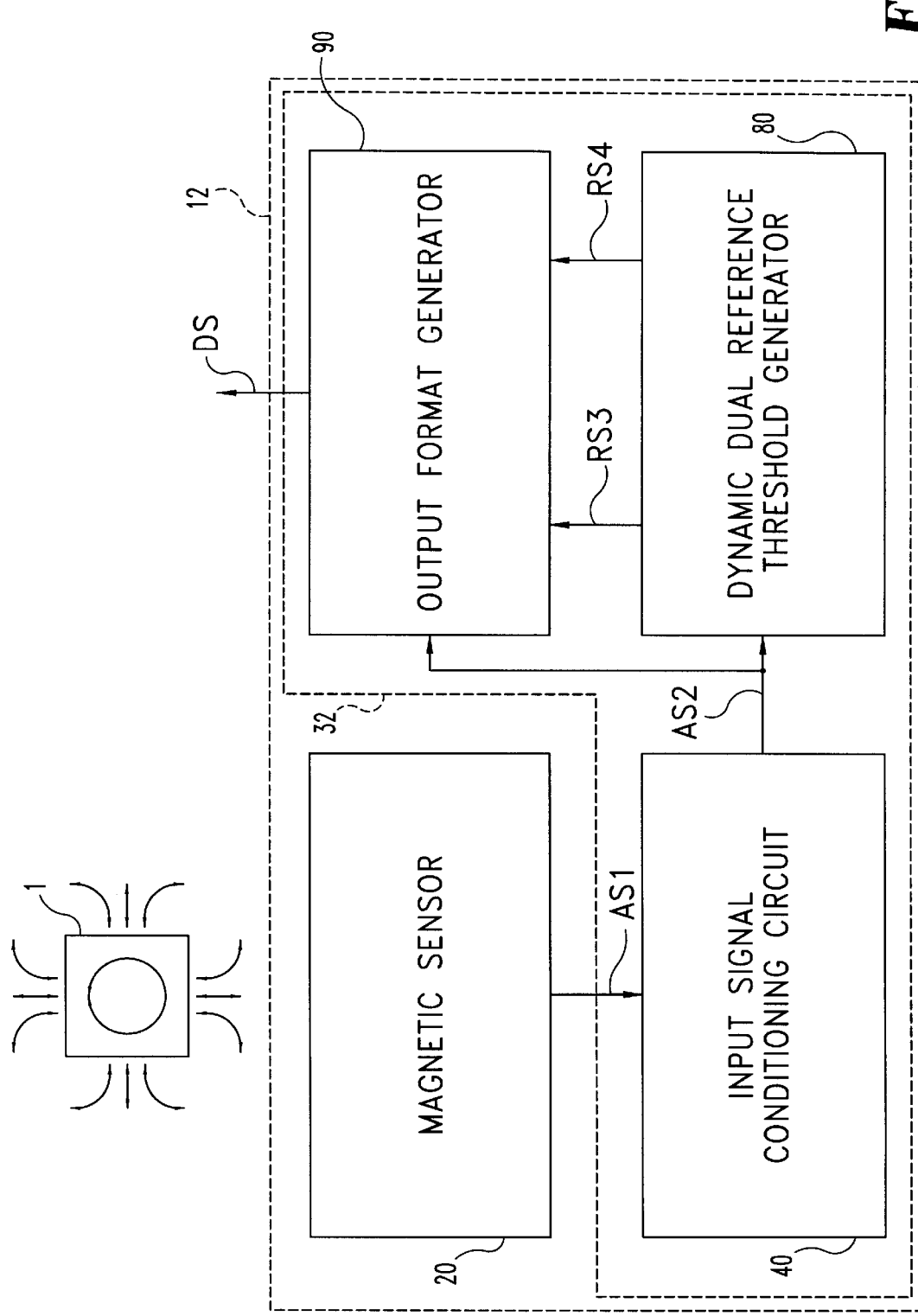
FIG. 7 is a block diagram of a third magnetic sensing device in accordance with the present invention.

Referring to FIG. 7, a block diagram of a magnetic sensing device 12 in accordance with the present invention is shown. Magnetic sensing device 12 outputs digital signal DS (in the form of a voltage or a current) as a basis for ascertaining a degree and a rate of any rotational movement, any linear movement, and/or any angular movement (as exemplified by the arrows) of an object 1. Magnetic sensing device 12 comprises magnetic sensor 20 (FIG. 1). Magnetic sensor 20 outputs analog signal AS1 as previously described herein in connection with FIG. 1. Magnetic sensing device 12 further comprises a new and unique digital circuit 32. Digital circuit 32 outputs digital signal DS as a dynamic representation of analog signal AS1. Digital circuit 32 includes optional input signal conditioning circuit 40 (FIG. 1). Input signal conditioning circuit 40 inputs analog signal AS1 and outputs analog signal AS1 as previously described herein in connection with FIG. 1.

Digital circuit 32 further includes a dynamic dual reference threshold generator 80. Dynamic dual reference threshold generator 80 inputs analog signal AS2 from input signal conditioning circuit 40 as shown by any type of medium, or alternatively, inputs analog signal AS1 from magnetic sensor 20 by any type of medium when input signal conditioning circuit 40 is excluded by an embodiment of digital circuit 32. For purposes of the present invention, dynamic dual reference threshold generator 80 is broadly defined as any electronic component or any electronic circuit that is operable for each cycle of analog signal AS2 (or analog signal AS1) to output a reference signal RS3 (in the form of a voltage or a current) equating a percentage (fixed or variable) of a positive peak amplitude of analog signal AS2 (or analog signal AS1) and operable for each cycle of analog signal AS2 (or analog signal AS1) to output a reference signal RS4 (in the form of a voltage or a current) equating a percentage (fixed or variable) of a negative peak amplitude of analog signal AS2 (or analog signal AS1). Thus, reference signal RS3 and reference signal RS4 are dynamically generated for each cycle of analog signal AS2 (or analog signal AS1). For example, an embodiment of dynamic dual reference threshold generator 80 could be operable for each cycle of analog signal AS2 (or analog signal AS1) to output reference signal RS2 as a voltage reference signal equating a variable percentage of a positive peak amplitude of analog signal AS2 (or analog signal AS1), and to output reference signal RS4 as a voltage reference signal equating a variable percentage of a negative peak amplitude of analog signal AS2 (or analog signal AS1). Also by example, an embodiment of dynamic dual reference threshold generator 80 could be operable for each cycle of analog signal AS2 (or analog signal AS1) to output reference signal RS3 as a current reference signal equating a fixed percentage of a positive peak amplitude of analog signal AS2 (or analog signal AS1), and to output reference signal RS3 as a current reference signal equating a fixed percentage of a negative peak amplitude of analog signal AS2 (or analog signal AS1). Consequently, any illustration and accompanying description herein of a particular embodiment of dynamic dual reference threshold generator 80 is given solely for purposes of describing the best mode of the present invention and is not meant to be limiting in any way.

Digital circuit 32 further includes an output format generator 90. Output format generator 90 inputs reference signal RS3 and reference signal RS4 from dynamic dual reference threshold generator 80 as shown by any type of medium. Output format generator 90 also inputs analog signal AS2 from input signal conditioning circuit 40 as shown by any type of medium, or alternatively, inputs analog signal AS1 from magnetic sensor 20 by any type of medium when input signal conditioning circuit 40 is excluded by an embodiment of digital circuit 32. For purposes of the present invention, output format generator 90 is broadly defined as any electronic component or any electronic circuit that is operable to output digital signal DS equating one of the logic signal levels in response to analog signal AS2 (or analog signal AS1) being greater than reference signal RS3, and equating the other logic signal level in response to analog signal AS2 (or analog signal AS1) being less than reference signal RS4. For example, an embodiment of output format generator 90 can output digital signal DS as a voltage digital signal equating zero (0) volts in response to analog signal AS2 being greater than reference signal RS3 and equating five (5) volts in response to analog signal AS2 being less than reference signal RS4. Also by example, an embodiment of output format generator 90 could be operable to output digital signal DS as a current digital signal equating fourteen (14) milliamperes in response to analog signal AS1 being greater than reference signal RS3, and equating seven (7) milliamperes in response to analog signal AS1 being less than reference signal RS4. Consequently, any illustration and accompanying description herein of a particular embodiment of output format generator 90 is given solely for purposes of describing the best mode of the present invention and is not meant to be limiting in any way.

Figure 8A:
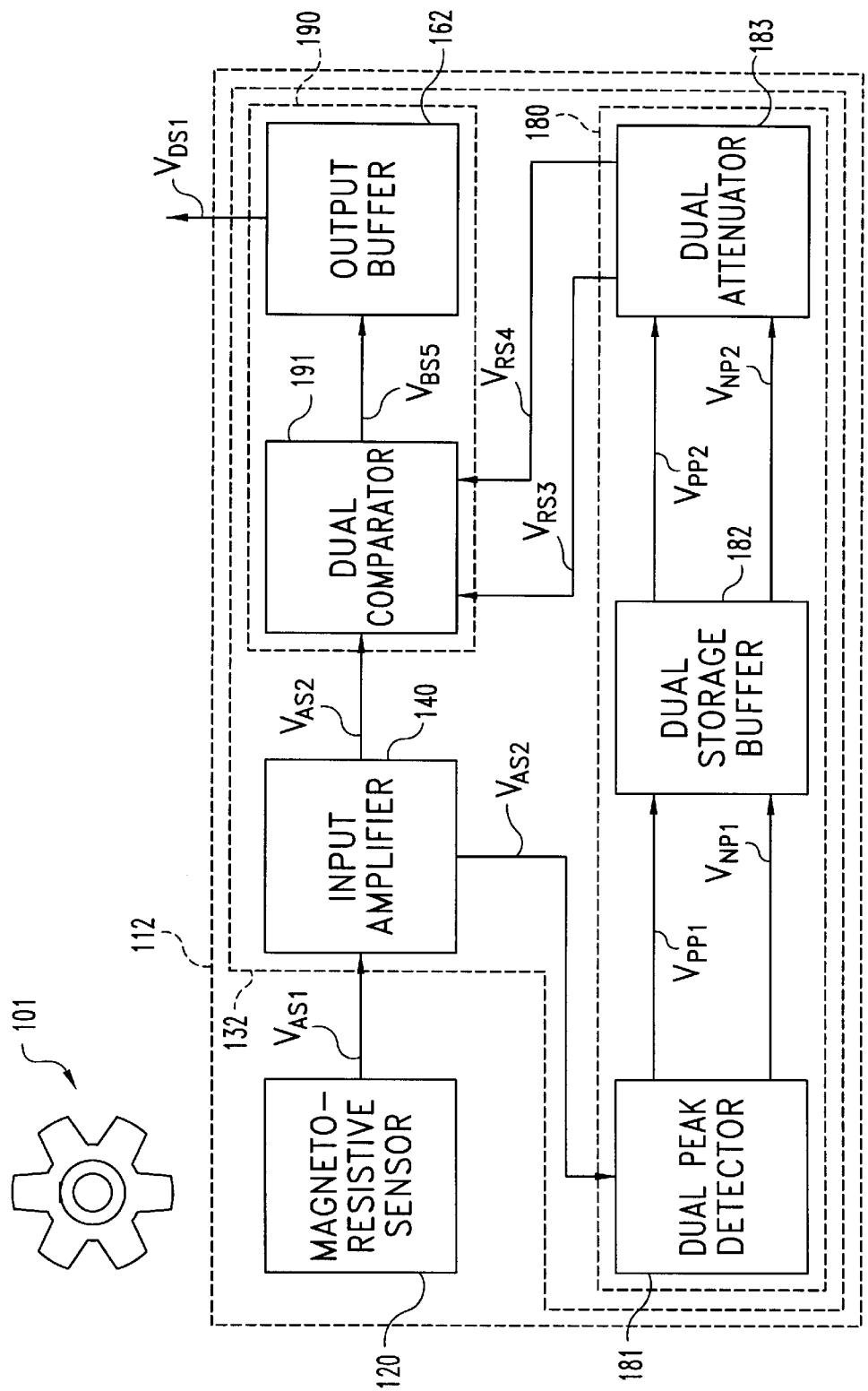
FIG. 8A is a block diagram of one embodiment of the magnetic sensing device of FIG. 7.

FIG. 8A is a block diagram a magneto-resistive sensing device 112 as an embodiment of magnetic sensing device 12 (FIG. 7). Referring to FIG. 8A, magneto-resistive sensing device 112 outputs voltage digital signal $V_{DS1}$ as shown as a basis for ascertaining a degree and a rate of any rotational movement (as exemplified by the arrows) of a ferromagnetic gear 101. Magneto-resistive sensing device 112 comprises magneto-resistive sensor 120 (FIG. 2A). Magneto-resistive sensor 120 outputs voltage analog signal $V_{AS1}$ as previously described herein in connection with FIG. 2A. Magneto-resistive sensing device 112 further comprises a digital circuit 132 as an embodiment of digital circuit 32 (FIG. 7). Digital circuit 132 outputs voltage digital signal $V_{DS1}$ as shown as a dynamic representation of voltage analog signal $V_{AS1}$. Digital circuit 131 includes optional input amplifier 140 (FIG. 2A). Input amplifier 140 inputs voltage analog signal $V_{AS1}$ and outputs voltage analog signal $V_{AS2}$ as previously described herein in connection with FIG. 2A.

Digital circuit 131 further includes a dynamic dual reference threshold generator 180 as an embodiment of dynamic dual reference threshold generator 80 (FIG. 7). Dynamic dual reference threshold generator 180 includes a dual peak detector 181, a dual storage buffer 182, and a dual attenuator 183. Dual peak detector 181 inputs voltage analog signal $V_{AS2}$ (or voltage analog signal $V_{AS1}$) as shown by any type of medium. For purposes of the present invention, dual peak detector 181 is broadly defined as any electronic component or electronic circuit that is operable to output a voltage positive peak signal $V_{PP1}$ equating a fixed percentage of a positive peak amplitude of voltage analog signal $V_{AS2}$ (or voltage analog signal $V_{AS1}$) in response to a detection of the positive peak amplitude of voltage analog signal $V_{AS2}$ (or voltage analog signal $V_{AS1}$), and to output a voltage negative peak signal $V_{NP1}$ equating a fixed percentage of a negative peak amplitude of voltage analog signal $V_{AS2}$ (or voltage analog signal $V_{AS1}$) in response to a detection of the negative peak amplitude of voltage analog signal $V_{AS2}$ (or voltage analog signal $V_{AS1}$). Consequently, any illustration and accompanying description herein of a particular embodiment of dual peak detector 181 is given solely for purposes of describing the best mode of the present invention and is not to be limiting in any way.

Dual storage buffer 182 inputs voltage positive peak signal $V_{PP1}$ and voltage negative peak signal $V_{NP1}$ from dual peak detector 181 as shown by any type of medium. For purposes of the present invention, dual storage buffer 182 is broadly defined as any electronic component or electronic circuit that is operable to store voltage positive peak signal $V_{PP1}$ and to output a voltage positive peak signal $V_{PP2}$ equating voltage positive peak signal $V_{PP1}$ as stored dual storage buffer 182 and further operable to store voltage negative peak signal $V_{NP1}$ and to output a voltage negative peak signal $V_{NP2}$ equating voltage negative peak signal $V_{NP1}$ as stored by dual storage buffer 182. Consequently, any illustration and accompanying description herein of a particular embodiment of dual storage buffer 182 is given solely for purposes of describing the best mode of the present invention and is not to be limiting in any way. Dual attenuator 183 inputs voltage positive peak signal $V_{PP2}$ and voltage negative peak signal $V_{NP2}$ from dual storage buffer 182 as shown by any medium. For purposes of the present invention, dual attenuator 183 is broadly defined as any electronic component or any electronic circuit that is operable to output a voltage reference signal $V_{RS3}$ as an attenuation (fixed or variable) of voltage positive peak signal $V_{PP2}$, and further operable to output a voltage reference signal $V_{RS4}$ as an attenuation (fixed or variable) of voltage negative peak signal $V_{NP2}$. Consequently, any illustration and accompanying description herein of a particular embodiment of dual attenuator 183 is given solely for purposes of describing the best mode of the present invention and is not to be limiting in any way.

Digital circuit 132 further includes an output format generator 190 as an embodiment of output format generator 90 (FIG. 7). Output format generator 190 includes a dual comparator 191, and optional output buffer 162 (FIG. 1). Dual comparator 191 inputs voltage reference signal $V_{RS3}$ and voltage reference signal $V_{RS4}$ from dual attenuator 183 as shown by any type of medium. Comparator 191 also inputs voltage analog signal $V_{AS2}$ from input amplifier 140 as shown by any type of medium, or alternatively inputs voltage analog signal $V_{AS1}$ from magnetic sensor 120 by any type of medium when input amplifier 140 is excluded from an embodiment of digital circuit 132. For purposes of the present invention, dual comparator 121 is broadly defined as any electronic component or any electronic circuit that is operable to output voltage binary signal $V_{BS5}$ equating a fixed voltage level in response to voltage analog signal $V_{AS2}$ being greater voltage reference signal $V_{RS3}$, and equating another fixed voltage level in response to voltage analog signal $V_{AS2}$ being less than voltage reference signal $V_{RS4}$. Consequently, any illustration and accompanying description herein of a particular embodiment of comparator 191 is given solely for purposes of describing the best mode of the present invention and is not meant to be limiting in any way. Output buffer 162 inputs voltage binary signal $V_{BS5}$ and outputs voltage digital signal $V_{DS1}$ as previously described herein in connection with FIG. 2A.

Figure 8B:
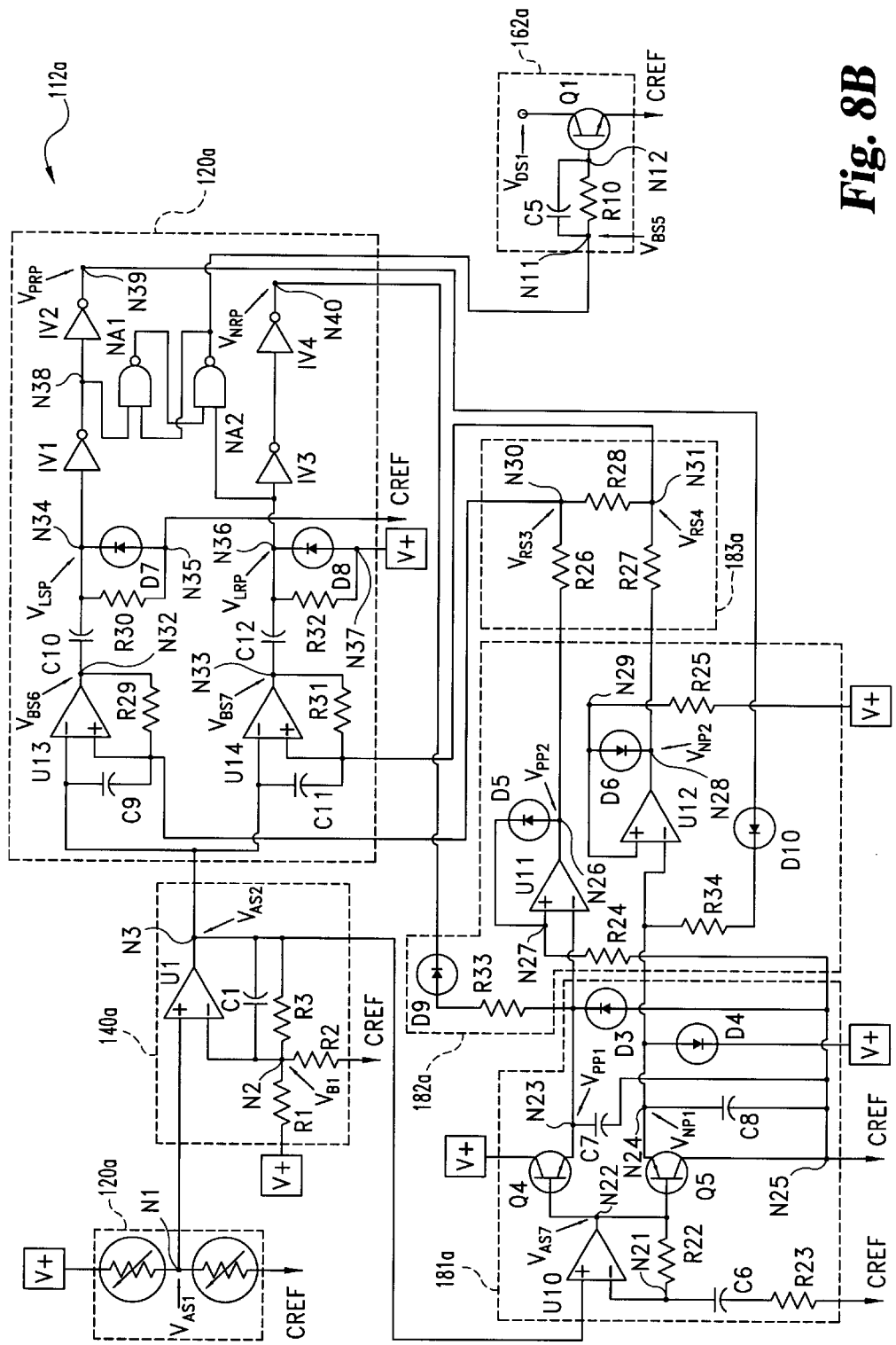
FIG. 8B is a schematic diagram of one embodiment of the magneto-resistive sensing device of FIG. 8A.

FIG. 8B is a schematic diagram of a magneto-resistive sensing device 112a as an embodiment of magneto-resistive sensing device 112 (FIG. 8A). Referring to FIG. 8B, magneto-resistive sensing device 112a comprises magneto-resistive sensor 120a (FIG. 2B). Magneto-resistive sensor 120a outputs voltage analog signal $V_{AS1}$ via node N1 as previously described herein in connection with FIG. 2B. Magneto-resistive sensing device 112a further comprises input amplifier 140a (FIG. 2B), a dual peak detector 181a as an embodiment of dual peak detector 181 (FIG. 8A), a dual storage buffer 182a as an embodiment of dual storage buffer 182 (FIG. 8A), a dual attenuator 183a as an embodiment of dual attenuator 183 (FIG. 8A), a dual comparator 191a as an embodiment of dual comparator 191 (FIG. 8A), and output buffer 162a (FIG. 2B). Input amplifier 140a inputs voltage analog signal $V_{AS1}$ and outputs voltage analog signal $V_{AS2}$ as previously described herein in connection with FIG. 2B.

Dual peak detector 181a includes an operational amplifier U10, a resistor R22, a capacitor C6, and a resistor R23 collectively constituting a frequency compensator. A noninverting input of operational amplifier U10 is electrically coupled to node N3 to thereby input voltage analog signal $V_{AS2}$. An output terminal of operational amplifier U10 outputs a voltage analog signal $V_{AS7}$ via a node N22 in response to voltage analog signal $V_{AS2}$. A resistor R22 is electrically coupled to node N22 and to a node N21, an inverting input of operational amplifier U10 is electrically coupled to node N21, capacitor C6 is electrically coupled to node N21 and to resistor R23, and resistor R23 is electrically coupled to common reference CREF to thereby provide negative feedback to operational amplifier U10. The particular model of operational amplifier U10, the electrical resistive values of resistor R22 and R23, and the electrical reactive value of capacitor C6 are selected in view of voltage analog signal $V_{AS2}$ and common reference CREF to equate voltage analog signal $V_{AS7}$ as an amplitude adjustment of voltage analog signal $V_{AS2}$ relative to an ac zero reference during high frequencies of voltage analog signal $V_{AS2}$.

Dual peak detector 181a further includes a NPN transistor Q4, a capacitor C7, and a diode D3 collectively constituting a positive peak detector. A base terminal of transistor Q4 is electrically coupled to node N22 to thereby input voltage analog signal $V_{AS7}$. A collector terminal of transistor Q4 is electrically coupled to a positive voltage source $V^+$, an emitter terminal of transistor Q4 is electrically coupled to a node N23, capacitor C7 is electrically coupled to node N23 and to a node N25, an cathode terminal of diode D3 is electrically coupled to node N23, an anode terminal of diode D3 is electrically coupled to node N25, and common reference CREF is electrically coupled to node N25 to thereby output a voltage positive peak signal $V_{PP1}$ (FIG. 8A) via node N23. The particular model of transistor Q4, the electrical reactive value of capacitor C7, and the electrical resistive value of diode D3 are selected in view of voltage analog signal $V_{AS7}$, positive voltage source $V^+$, and common reference CREF to equate voltage positive peak signal $V_{PP1}$ as an approximation of a positive peak amplitude of voltage analog signal $V_{AS7}$ during each cycle of voltage analog signal $V_{AS7}$.

Dual peak detector 181a further includes a PNP transistor Q5, a capacitor C8, and a diode D4 collectively constituting a negative peak detector. A base terminal of transistor Q5 is electrically coupled node N22 to thereby input voltage analog signal $V_{AS7}$. A collector terminal of transistor Q5 is electrically coupled to node N25, an emitter terminal of transistor Q5 is electrically coupled to a node N24, capacitor C8 is electrically coupled to node N24 and to node N25, an anode terminal of diode D4 is electrically node N24, and a cathode terminal of diode D4 is electrically coupled to positive voltage source $V^+$ to thereby output a voltage negative peak signal $V_{NP1}$ via node N24. The particular model of transistor Q5, the electrical reactive value of capacitor C8, and the electrical resistive value of diode D4 are selected in view of voltage analog signal $V_{AS7}$, positive voltage source $V^+$, and common reference CREF to equate voltage negative peak signal $V_{NP1}$ as an approximation of a negative peak amplitude of voltage analog signal $V_{AS7}$ during each cycle of voltage analog signal $V_{AS7}$.

Dual storage buffer 182a includes a buffer amplifier U11, a diode D5, and a resistor R24. A noninverting input of buffer amplifier U11 is electrically coupled to node N23 to thereby input voltage positive peak signal $V_{PP1}$. An output terminal of buffer amplifier U11 outputs a voltage positive peak signal $V_{PP2}$ (FIG. 8A) via a node N26 in response to voltage positive peak signal $V_{PP1}$. An anode terminal of diode D5 is electrically coupled to node N26, a cathode terminal of diode D5 is electrically coupled to a node N27, a noninverting input of buffer amplifier U11 is electrically coupled to node N27, and resistor R24 is electrically coupled to node N27 and to node N25 to thereby provide a negative feedback to buffer amplifier U11. The particular model of buffer amplifier U11, and the electrical resistive values of diode D5 and resistor R24 are selected to equate voltage positive peak signal $V_{PP2}$ as a positive peak amplitude of voltage analog signal $V_{AS7}$ during each cycle of voltage analog signal $V_{AS7}$. Dual storage buffer 182a further includes a buffer amplifier U12, a diode D6, and a resistor R25. A noninverting input of buffer amplifier U12 is electrically coupled to node N24 to thereby input voltage negative peak signal $V_{NP1}$. An output terminal of buffer amplifier U12 outputs a voltage negative peak signal $V_{NP2}$ (FIG. 8A) via a node N28 in response to voltage negative peak signal $V_{NP1}$. A cathode terminal of diode D6 is electrically coupled to node N28, an anode terminal of diode D6 is electrically coupled to a node N29, an inverting input of buffer amplifier U11 is electrically coupled to node N29, and resistor R25 is electrically coupled to node N29 and to positive voltage source V⁺ to thereby provide a negative feedback to buffer amplifier U12. The particular model of buffer amplifier U12, and the electrical resistive values of diode D6 and resistor R25 are selected to equate voltage negative peak signal $V_{NP2}$ as a negative peak amplitude of voltage analog signal $V_{AS7}$ during each cycle of voltage analog signal $V_{AS7}$.

Attenuator 183a include a resistor R26, a resistor R27, and resistor R28. Resistor R26 is electrically coupled to node N26 to thereby input voltage positive peak signal $V_{PP2}$, and resistor R27 is electrically coupled to node N28 to thereby input voltage negative peak signal $V_{NP2}$. Resistor R26 is further electrically coupled to a node N30, resistor R27 is electrically coupled to a node N31, and resistor R28 is electrically coupled to node N30 and node N31 to thereby output voltage reference signal $V_{RS3}$ via node N30, and voltage reference signal $V_{RS4}$ via node N31. The electrical resistive values of resistors R26, R27 and R28 are selected to output voltage reference signal $V_{RS3}$ equating a fixed percentage of a positive peak amplitude of voltage analog signal $V_{AS2}$, and to output voltage reference signal $V_{RS4}$ equating a fixed percentage of a negative peak amplitude of voltage analog signal $V_{AS2}$.

Dual comparator 191a includes a comparator U13, a capacitor C9, and a resistor R29 collectively constituting a positive threshold comparator. An inverting input of comparator U13 is electrically coupled to node N3 to thereby input voltage analog signal $V_{AS2}$, and a noninverting input of comparator U13 is electrically coupled to node N30 to thereby input voltage reference signal $V_{RS3}$. An output terminal of comparator U13 is electrically coupled to a node N32 and outputs a voltage binary signal $V_{BS6}$ via node N32 in response to input voltage analog signal $V_{AS2}$ and voltage reference signal $V_{RS3}$. Resistor R29 is electrically coupled to node N32 and node N30 to thereby provide a positive feedback to comparator U13. Capacitor C9 is electrically coupled to node N3 and to node N30 to provide a high-frequency noise reduction. The particular model of comparator U13, the electrical reactive value of capacitor C9, and the electrical resistive value of resistor R9 are selected to output voltage binary signal $V_{BS6}$ as equating a positive voltage source V⁺ in response to voltage analog signal $V_{AS2}$ being greater than voltage reference signal $V_{RS3}$ and equating common reference CREF in response to voltage analog signal $V_{AS2}$ being equal to or less than voltage reference signal $V_{RS3}$.

Dual comparator 191a further includes a capacitor C10, a resistor R30 and a diode D7 collectively constituting a narrow pulse differentiator. Capacitor C10 is electrically coupled to a node N32 to thereby input voltage binary signal $V_{BS6}$. Capacitor C10 is further electrically coupled to a node N34, resistor 30 is electrically coupled to node N34 and to a node N35, a cathode terminal of diode D7 is electrically coupled to node N34, an anode terminal of diode D7 is electrically coupled to node N35, and common reference CREF is electrically coupled to node N35 to thereby output a voltage latch set pulse $V_{LSP}$ via node N35. The electrical reactive values of capacitor C10 and the electrical resistive values of resistor R30 and diode D7 are selected to output voltage latch set pulse $V_{LSP}$ having a limited positive spike and a negative spike indicating a trailing edge of voltage binary signal $V_{BS6}$.

Dual comparator 191a further includes a comparator U14, a capacitor C11, and a resistor R31 collectively constituting a negative threshold comparator. An inverting input of comparator U14 is electrically coupled to node N3 to thereby input voltage analog signal $V_{AS2}$, and a noninverting input of comparator U14 is electrically coupled to node N31 to thereby input voltage reference signal $V_{RS4}$. An output terminal of comparator U14 is electrically coupled to a node N33 and outputs a voltage binary signal $V_{BS7}$ via node N33 in response to input voltage analog signal $V_{AS2}$ and voltage reference signal $V_{RS4}$. Resistor R31 is electrically coupled to node N33 and node N31 to thereby provide a positive feedback to comparator U14. Capacitor C9 is electrically coupled to node N3 and to node N31 to provide a high-frequency noise reduction. The particular model of comparator U14, the electrical reactive value of capacitor C1, and the electrical resistive value of resistor R31 are selected to output voltage binary signal $V_{BS7}$ as equating a positive voltage source V⁺ in response to voltage analog signal $V_{AS2}$ being greater than voltage reference signal $V_{RS4}$ and equating common reference CREF in response to voltage analog signal $V_{AS2}$ being equal to or less than voltage reference signal $V_{RS4}$.

Dual comparator 191a further includes a capacitor C12, a resistor R32 and a diode D8 collectively constituting a narrow pulse differentiator. Capacitor C12 is electrically coupled to node N33 to thereby input voltage binary signal $V_{BS7}$. Capacitor C12 is further electrically coupled to a node N36, resistor 32 is electrically coupled to node N36 and to a node N37, an anode terminal of diode D8 is electrically coupled to node N36, a cathode terminal of diode D8 is electrically coupled to node N37, and positive voltage source V⁺ is electrically coupled to node N37 to thereby output a voltage latch reset pulse $V_{LRP}$ via node N36. The electrical reactive value s of capacitor C12 and the electrical resistive values of resistor R32 and diode D8 are selected to output voltage latch reset pulse $V_{LRP}$ having a limited positive spike and a negative spike indicating a trailing edge of voltage binary signal $V_{BS7}$.

Dual comparator 191a further includes a Schmitt inverter IV1, and a Schmitt inverter IV2. An input terminal of Schmitt invert IV1 is electrically coupled to node N34 to thereby input voltage latch set pulse $V_{LSP}$. An output terminal of Schmitt trigger IV1 is electrically coupled to an input terminal of Schmitt inverter IV2. The output terminal of Schmitt inverter IV2 outputs a voltage positive reset pulse $V_{PRP}$ via a node N39 in response to voltage latch set pulse $V_{LSP}$. Dual storage buffer 182a further includes a diode D10 and a resistor R33. AN anodeterminal of diode D10 is electrically coupled to node N39 to thereby input voltage positive reset pulse $V_{PRP}$. A cathodeterminal of diode D10 is electrically coupled to a negative terminal of resistor R33, and a positive terminal of resistor R33 is electrically coupled to the noninverting input of buffer amplifier U12. The electrical resistive values of diode D10 and resistor R33 are selected to discharge a fixed percentage of voltage negative peak signal $V_{NP2}$.

Dual comparator 191a further includes a Schmitt inverter IV3, and a Schmitt inverter IV4. An input terminal of Schmitt invert IV3 is electrically coupled to node N36 to thereby input voltage latch reset pulse $V_{LRP}$. An output terminal of Schmitt trigger IV3 is electrically coupled to an input terminal of Schmitt inverter IV4. The output terminal of Schmitt inverter IV4 outputs a voltage negative reset pulse $V_{NRP}$ via a node N40 in response to voltage latch reset pulse $V_{LRP}$. Dual storage buffer 182a further includes a diode D9 and a resistor R32. A cathodeterminal of diode D9 is electrically coupled to node N40 to thereby input voltage negative reset pulse $V_{NRP}$. An anodeterminal of diode D9 is electrically coupled to a positive terminal of resistor R32, and a negative terminal of resistor R32 is electrically coupled to the noninverting input of buffer amplifier U11. The electrical resistive values of diode D9 and resistor R32 are selected to discharge a fixed percentage of voltage positive peak signal $V_{PP2}$.

Dual comparator 191a further includes a NAND gate NA1, and a NAND gate NA2 collectively constituting a set-reset latch. A first input terminal of NAND gate NA1 is electrically coupled to node N38, and a second input terminal of NAND gate NA1 is electrically coupled to node N11. A first input terminal of NAND gate NA2 is electrically coupled to node N36, and second input terminal of NAND gate NA2 is electrically coupled to an output terminal of NAND gate NA1 to thereby output voltage binary signal $V_{BS5}$ to node N11. Output buffer 162a inputs voltage binary signal $V_{BS5}$ and outputs voltage digital signal $V_{DS1}$ as previously described in connection with FIG. 2B.

Figure 9A:
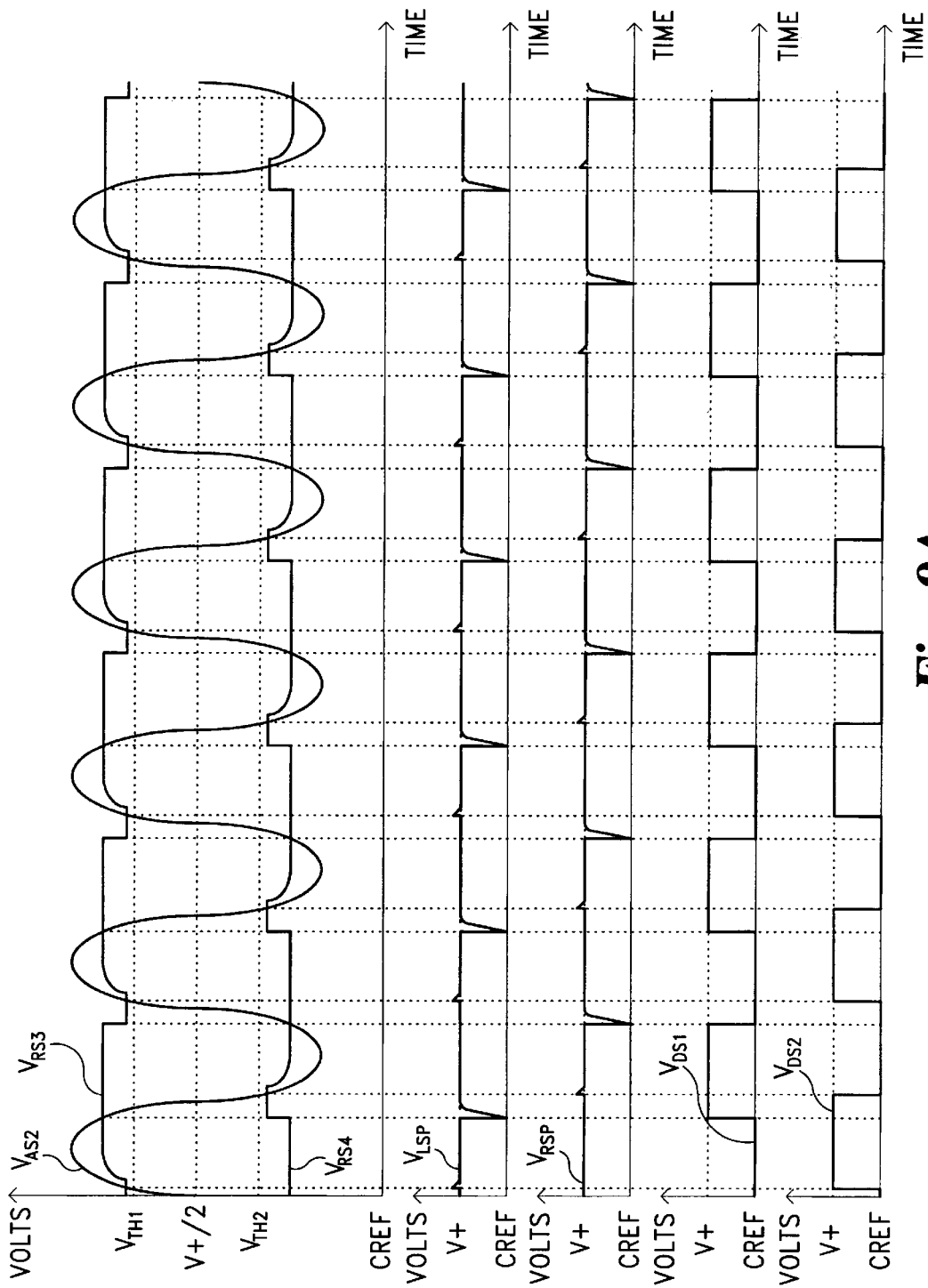
FIG. 9A is a first set of graphical diagrams of exemplary voltage waveforms as outputted by various components of a digital circuit of the magneto-resistive sensing device of FIG. 8B.

Referring to FIG. 9A, a first set of graphical diagrams consisting of an exemplary voltage analog signal $V_{AS2}$ as outputted by input amplifier 140a (FIG. 8B) as magnetoresistive sensor 120a (FIG. 8B) senses a constant rate of rotation of ferromagnetic gear 101 (FIG. 8A) over a 360 degree range of rotation, of an exemplary voltage reference signal $V_{RS3}$ as outputted by dual attenuator 183a (FIG. 8B), of an exemplary voltage reference signal $V_{RS4}$ as outputted by dual attenuator 183a, of an exemplary voltage latch set pulse $V_{LSP}$ as generated by dual comparator 191a (FIG. 8B), of an exemplary voltage latch reset pulse $V_{RSP}$ as generated by dual comparator 191a, of an exemplary voltage digital signal $V_{DS1}$ as outputted by output buffer 162a (FIG. 8B), and of an exemplary voltage digital signal $V_{DS2}$ as outputted by a magneto-resistive sensing device incorporating a static voltage switching threshold $V_{TH1}$ and a static voltage switching threshold $V_{TH2}$. Voltage analog signal $V_{AS2}$ is exemplary shown as a sinusoidal waveform having a consistent peak-to-peak amplitude over the 360 degree range of rotation. Prior to each cycle of voltage analog signal $V_{AS2}$, voltage reference signal $V_{RS3}$ statically equates a fixed percentage of the positive peak amplitude of voltage analog signal $V_{AS2}$ during the previous cycle, voltage analog signal $V_{RS4}$ statically equates a fixed percentage of the negative peak amplitude of voltage analog signal $V_{AS2}$ during the previous cycle, both voltage latch set pulse $V_{LSP}$ and voltage latch reset pulse $V_{RSP}$ equate positive voltage source V+, and voltage digital signal $V_{DS1}$ equates common reference CREF. The first quadrant of each cycle of voltage analog signal $V_{AS2}$ corresponds to voltage analog signal $V_{AS2}$ having a positive polarity and a positive slope. During the first quadrant, voltage latch set pulse $V_{LSP}$ inconsequentially pulses above positive voltage source V+ (due to diode D7 in FIG. 8B; in response to voltage analog signal $V_{AS2}$ becoming greater than voltage reference signal $V_{RS3}$, and voltage reference signal $V_{RS3}$ begins to dynamically equate a fixed percentage of voltage analog signal $V_{AS2}$. Consequently, voltage digital signal $V_{DS1}$ still equates common reference CREF. The second quadrant of each cycle to voltage analog signal $V_{AS2}$ corresponds to voltage analog signal $V_{AS2}$ having a positive polarity and a negative slope. During the second quadrant, voltage reference signal $V_{RS3}$ statically equates a fixed percentage of the most current positive peak amplitude of voltage analog signal $V_{AS2}$, and voltage latch set pulse $V_{LSP}$ pulses from positive voltage source V+ to common reference CREF in response to voltage analog signal $V_{AS2}$ becoming equal to and less than voltage reference signal $V_{RS3}$. Consequently, voltage digital signal $V_{DS1}$ transitions from common reference CREF to positive voltage source $V^+$, and voltage reference signal $V_{RS4}$ is discharged by a fixed percentage in response to voltage positive reset pulse $V_{PRP}$ (FIG. 8B).

The third quadrant of each cycle corresponds to voltage analog signal $V_{AS2}$ having a negative polarity and a negative slope. During the third quadrant, voltage latch reset pulse $V_{RSP}$ inconsequentially pulses above positive voltage source $V^+$ (due to diode D8 in FIG. 8B) in response to voltage analog signal $V_{AS2}$ becoming equal to or less than voltage reference signal $V_{RS4}$, and voltage reference signal $V_{RS4}$ begins to dynamically equate a fixed percentage of voltage analog signal $V_{AS2}$. Consequently, voltage digital signal $V_{DS1}$ still equates positive voltage source $V^+$. The final quadrant of each cycle of voltage analog signal $V_{AS2}$ corresponds to voltage analog signal $V_{AS2}$ having a negative polarity and a positive slope. During the final quadrant, voltage reference signal $V_{RS4}$ statically equates a fixed percentage of the most recent negative peak amplitude of voltage analog signal $V_{AS2}$, and voltage latch set pulse $V_{RSP}$ pulses from positive voltage source $V^+$ to common reference CREF in response to voltage analog signal $V_{AS2}$ becoming greater than voltage reference signal $V_{RS4}$. Consequently, voltage digital signal $V_{DS1}$ transitions from positive voltage source $V^+$ to common reference CREF, and voltage reference signal $V_{RS3}$ is discharged by a fixed percentage in response to voltage negative reset pulse $V_{NRP}$ (FIG. 8B). It is to be appreciated that voltage digital signal $V_{DS1}$ is an accurate representation of each occurrence and frequency of all six cycles of voltage analog signal $V_{AS2}$, i.e. voltage analog signal $V_{AS1}$ (FIGS. 8 and 8B), over the 360 degree range of rotation. It is to be further appreciated that voltage digital signal $V_{BS5}$ (FIG. 8B) equates voltage digital signal $V_{DS1}$ as shown, and therefore can be alternatively or concurrently outputted as an accurate representation of each occurrence and frequency of all six cycles of voltage analog signal $V_{AS1}$ over the 360 degree range of rotation.

Voltage digital signal $V_{DS2}$ transitions from common reference CREF to positive voltage source $V^+$ in response to voltage analog signal $V_{AS2}$ becoming greater than static voltage switching threshold $V_{TH1}$ during the first quadrant of each cycle of voltage analog signal $V_{AS2}$, and transitions from positive voltage source V+ to common reference CREF to in response to voltage analog signal $V_{AS2}$ becoming equal to or less than a static voltage switching threshold $V_{TH2}$ during the third quadrant of each cycle of voltage analog signal $V_{AS2}$. Due to the consistency of the peak-to-peak amplitude of voltage analog signal $V_{AS2}$, voltage digital signal $V_{DS2}$ is an accurate representation of each occurrence and frequency of all six cycles of voltage analog signal $V_{AS2}$ over the 360 degree range of rotation. The benefit of all embodiments of magnetic sensing device 12 (FIG. 8), e.g. magneto-resistive sensing device 112a (FIG. 8B), over magnetic sensing devices incorporating static voltage switching threshold $V_{TH1}$ and static voltage switching threshold $V_{TH2}$ will now be described herein.

Figure 9B:
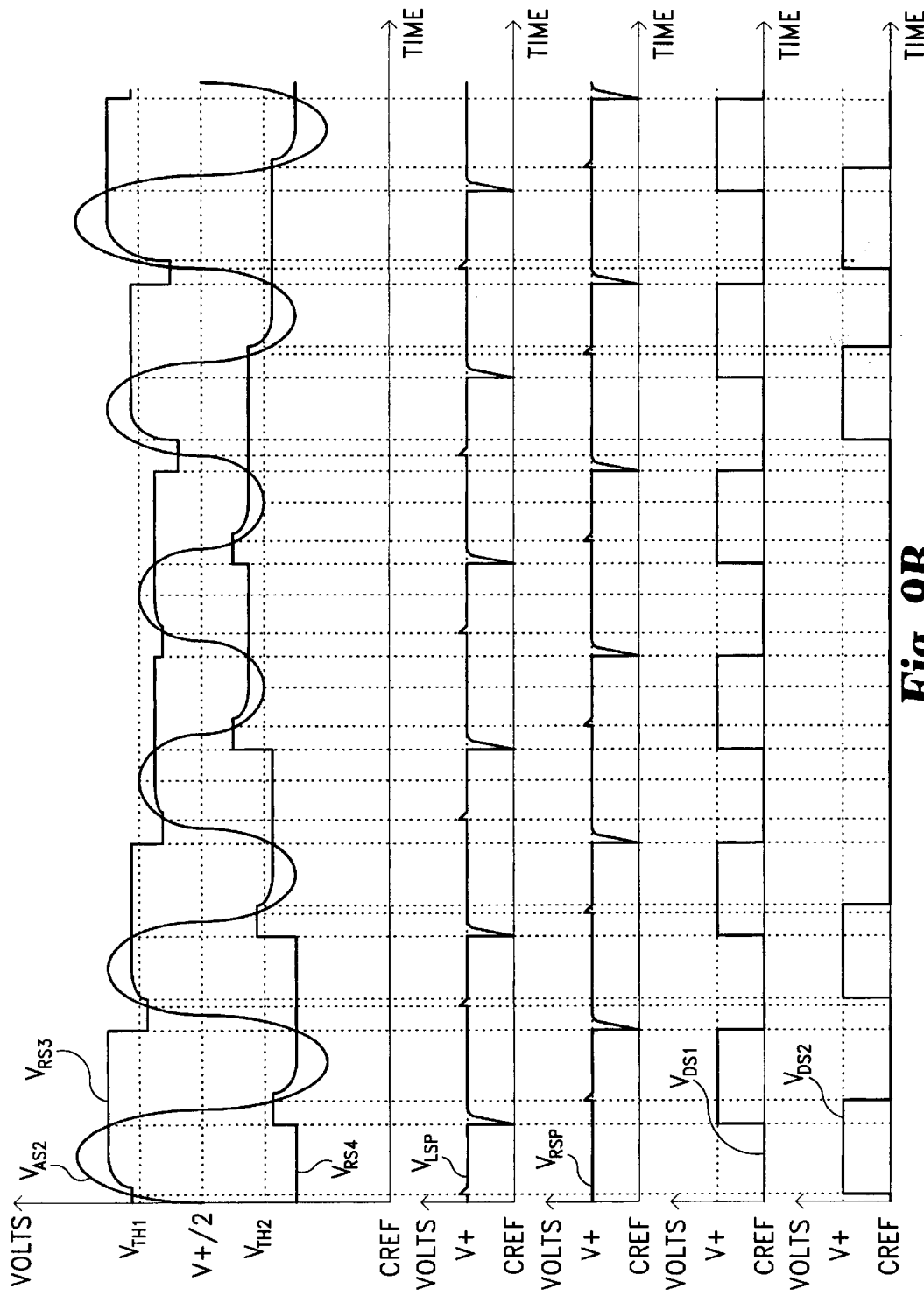
FIG. 9B is a second set of graphical diagrams of exemplary voltage waveforms as outputted by various components of a digital circuit of the magneto-resistive sensing device of FIG. 8B.

Referring to FIG. 9B, a second set of graphical diagrams consisting of an exemplary voltage analog signal $V_{AS2}$ as outputted by input amplifier 140a (FIG. 8B) as magneto-resistive sensor 120a (FIG. 8B) senses a constant rate of rotation of ferromagnetic gear 101 (FIG. 8A) over a 360 degree range of rotation, of an exemplary voltage reference signal $V_{RS3}$ as outputted by dual attenuator 183a (FIG. 8B), of an exemplary voltage reference signal $V_{RS4}$ as outputted by dual attenuator 183a, of an exemplary voltage latch set pulse $V_{LSP}$ as generated by dual comparator 191a (FIG. 8B), of an exemplary voltage latch reset pulse $V_{RSP}$ as generated by dual comparator 191a, of an exemplary voltage digital signal $V_{DS1}$ as outputted by output buffer 162a (FIG. 8B), and of an exemplary voltage digital signal $V_{DS2}$ as outputted by a magneto-resistive sensing device incorporating a static voltage switching threshold $V_{TH1}$ and a static voltage switching threshold $V_{TH2}$. Voltage analog signal $V_{AS2}$ is exemplary shown as a sinusoidal waveform having an inconsistent peak-to-peak amplitude over the 360 degree range of rotation due to a gross manufacturing imperfection of ferromagnetic gear 101 (FIG. 2B). The variations in the peak-to-peak amplitude of voltage analog signal $V_{AS2}$ is exaggerated to better illustrate an advantage of the present invention. Due to the dynamic generation of voltage reference signal $V_{RS3}$ during the first quadrant of each cycle of voltage analog signal $V_{AS2}$ and the dynamic generation voltage reference signal $V_{RS4}$ during the third quadrant of each cycle of voltage analog signal $V_{AS2}$, voltage digital signal $V_{DS1}$ still transitions from common reference CREF to positive voltage source V+in response to voltage analog signal $V_{AS2}$ becoming equal to or less than voltage reference signal $V_{RS1}$ during the second quadrant of each cycle of voltage analog signal $V_{AS2}$, and voltage digital signal $V_{DS1}$ still transitions from positive voltage source V+ to common reference CREF in response to voltage analog signal $V_{AS2}$ becoming greater than voltage reference signal $V_{RS4}$ during the fourth quadrant of each cycle as previously described herein in connection with FIG. 9A. Therefore, despite the inconsistency of the peak-to-peak amplitude of voltage analog signal $V_{AS2}$, i.e. voltage analog signal $V_{AS1}$ (FIG. 8B), voltage digital signal $V_{DS1}$ remains an accurate representation of each occurrence and frequency of all six cycles of voltage analog signal $V_{AS2}$ over the 360 degree range of rotation of ferromagnetic gear 101. However, as shown, voltage digital signal $V_{DS2}$ ceases being an accurate representation of each occurrence of the six cycles voltage analog signal $V_{AS2}$ over the 360 degree range of rotation as well as an accurate representation of the four represented cycles of voltage analog signal $V_{AS2}$ due to the incorporation of static voltage switching threshold $V_{TH1}$ and static voltage switching threshold $V_{TH2}$.

Figure 9C:
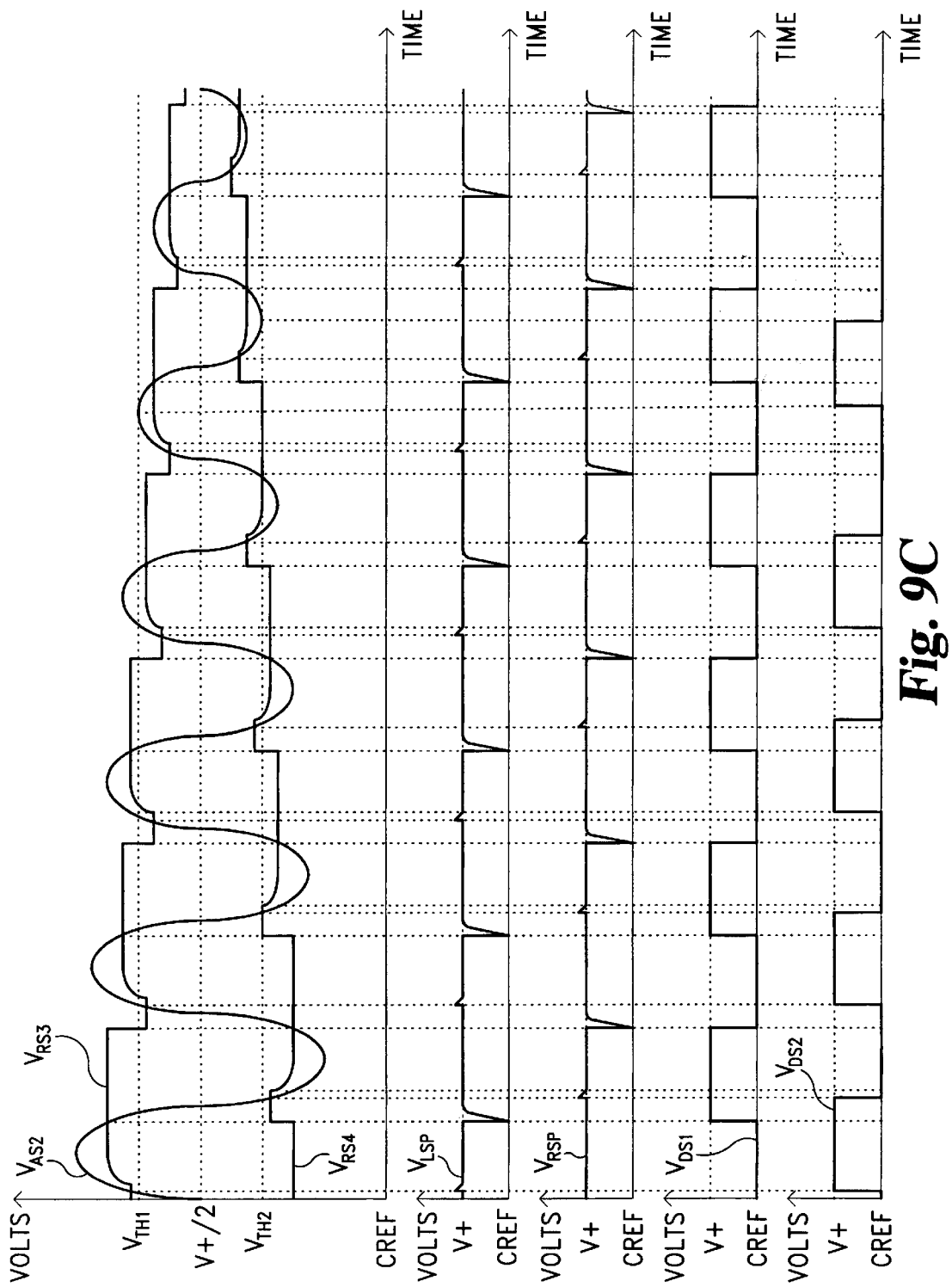
FIG. 9C is a third set of graphical diagrams of exemplary voltage waveforms as outputted by various components of a digital circuit of the magneto-resistive sensing device of HG. 8B.

Referring to FIG. 9C, a third set of graphical diagrams consisting of an exemplary voltage analog signal $V_{AS2}$ as outputted by input amplifier 140a (FIG. 8B) as magneto-resistive sensor 120a (FIG. 8B) senses a constant rate of rotation of ferromagnetic gear 101 (FIG. 8A) over a 360 degree range of rotation, of an exemplary voltage reference signal $V_{RS3}$ as outputted by dual attenuator 183a (FIG. 8B), of an exemplary voltage reference signal $V_{RS4}$ as outputted by dual attenuator 183a, of an exemplary voltage latch set pulse $V_{LSP}$ as generated by dual comparator 191a (FIG. 8B), of an exemplary voltage latch reset pulse $V_{RSP}$ as generated by dual comparator 191a, of an exemplary voltage digital signal $V_{DS2}$ as outputted by output buffer 162a (FIG. 8B), and of an exemplary voltage digital signal $V_{DS3}$ as outputted by a magneto-resistive sensing device incorporating a static voltage switching threshold $V_{TH1}$ and a static voltage switching threshold $V_{TH2}$. Voltage analog signal $V_{AS2}$ again is exemplary shown as a sinusoidal waveform having an inconsistent peak-to-peak amplitude over the 360 degree range of rotation due a weakening in the magnetic induction of the magnetic field. The variations in the peak-to-peak amplitude of voltage analog signal $V_{AS2}$ is exaggerated to better illustrate an advantage of the present invention. Again, due to the dynamic generation of voltage reference signal $V_{RS3}$ during the first quadrant of each cycle of voltage analog signal $V_{AS2}$ and the dynamic generation voltage reference signal $V_{RS4}$ during the third quadrant of each cycle of voltage analog signal $V_{AS2}$, voltage digital signal $V_{DS1}$ still transitions from common reference CREF to positive voltage source V+ in response to voltage analog signal $V_{AS2}$ becoming equal to or less than voltage reference signal $V_{RS1}$ during the second quadrant of each cycle of voltage analog signal $V_{AS2}$, and voltage digital signal $V_{DS1}$ still transitions from positive voltage source V+ to common reference CREF in response to voltage analog signal $V_{AS2}$ becoming greater than voltage reference signal $V_{RS4}$ during the fourth quadrant of each cycle as previously described herein in connection with FIG. 9A. Therefore, despite the inconsistency of the peak-to-peak amplitude of voltage analog signal $V_{AS2}$, i.e. voltage analog signal $V_{AS1}$ (FIG. 8B), voltage digital signal $V_{DS1}$ remains an accurate representation of each occurrence and frequency of all six cycles of voltage analog signal $V_{AS2}$ over the 360 degree range of rotation of ferromagnetic gear 101. However, as shown, voltage digital signal $V_{DS2}$ ceases being an accurate representation of each occurrence of the six cycles voltage analog signal $V_{AS2}$ over the 360 degree range of rotation as well as an accurate representation of the four represented cycles of voltage analog signal $V_{AS2}$ due to the incorporation of static voltage switching threshold $V_{TH1}$ and static voltage switching threshold $V_{TH2}$.

While the present invention has been illustrated and described in detail in the drawings and foregoing description, the same is to be considered as illustrative and not restrictive in character, it being understood that the preferred embodiments have been shown and described and that all changes and modifications that come within the spirit of the present invention are desired to be protected.

What is claimed is:

1. A magnetic sensing device comprising:
   a magnetic sensor outputting a first analog signal; and
   a digital circuit including:
   an input signal conditioning circuit inputting said first analog signal, said input signal conditioning circuit outputting a second analog signal as a variant of said first analog signal;
   a dynamic reference threshold generator inputting said second analog signal, said dynamic reference threshold generator outputting a reference signal, wherein said reference signal equates a percentage of said second analog signal in response to a detection of a first signal feature of said second analog signal during a cycle of said second analog signal, and wherein said reference signal equates a fixed percentage of one of a pair of peak amplitudes of said second analog signal in response to a detection of a second signal feature of said second analog signal during a cycle of said second analog signal,; and an output format generator inputting said reference signal and said second analog signal, said output format generator outputting a digital signal, said digital signal equating a first logic signal level in response to said second analog signal being greater than said reference signal, said digital signal equating a second logic signal level in response to said second analog signal being less than said reference signal.

2. The magnetic sensing device of claim 1 wherein said magnetic sensor is a magneto-resistive sensor outputting said first analog signal as a first voltage analog signal, and wherein said input signal conditioning circuit is an input amplifier outputting said second analog signal as a second voltage analog signal, said second voltage analog signal being an amplification of said first voltage analog signal.

3. The magnetic sensing device of claim 2 wherein said dynamic reference threshold generator includes:

a slope detector inputting said second voltage analog signal, said slope detector outputting a first voltage binary signal, said first voltage binary signal equating a first voltage level in response to a detection of a positive slope of said second voltage analog signal, said first voltage binary signal equating a second voltage level in response to a detection of a negative slope of said second voltage analog signal, wherein said positive slope of said second voltage analog signal is said first signal feature of said second analog signal and said negative slope of said second voltage analog signal is said second signal feature of said second analog signal;

a switching circuit inputting said first voltage binary signal and said second voltage analog signal, said switching circuit outputting a third voltage analog signal in response to said first voltage binary signal equating said first voltage level, said third voltage analog signal equating at least a portion of said second voltage analog signal, said switching circuit being inoperative to output said third analog voltage signal in response to said first voltage binary signal equating said second voltage level;

a storage buffer inputting and storing said third voltage analog signal, said storage buffer outputting a fourth voltage analog signal, said fourth voltage analog signal equating at least a portion of said third voltage analog signal, wherein said third voltage analog signal as stored by said storage buffer equates a fixed percentage of a positive peak voltage amplitude of said second voltage analog signal when said first voltage binary signal equates said second voltage level; and an attenuator inputting said fourth voltage analog signal, said attenuator outputting said reference signal as a voltage reference signal, said voltage reference signal equating an attenuation of said fourth voltage analog signal.

4. The magnetic sensing device of claim 3 wherein said output format generator includes a comparator inputting said second voltage analog signal and said voltage reference signal, said comparator outputting said digital signal as a voltage digital signal, said voltage digital signal equating a first voltage logic level in response to said second voltage analog signal being greater than said voltage reference signal, said voltage digital signal equating a second voltage logic level in response to said second voltage analog signal being less than said voltage reference signal.

5. The magnetic sensing device of claim 3 wherein said output format generator includes:

a comparator inputting said second voltage analog signal and said voltage reference signal, said comparator outputting a second voltage binary signal, said second voltage binary signal equating a third voltage level in response to said second voltage analog signal being greater than said voltage reference signal, said second voltage binary signal equating a fourth voltage level in response to said second voltage analog signal being less than said voltage reference signal; and an output buffer inputting said second voltage binary signal, said output buffer outputting said digital signal as a voltage digital signal, said voltage digital signal equating a first voltage logic level in response to said second voltage binary signal equating said third voltage level, said voltage digital signal equating a second voltage logic level in response to said second voltage binary signal equating said fourth voltage level.

6. The magnetic sensing device of claim 5 wherein said first voltage level and said third voltage level are substantially identical, and said second voltage level and said fourth voltage level are substantially identical.

7. A magnetic sensing device comprising:

a magnetic sensor outputting a first analog signal; and a digital circuit including:

a dynamic reference threshold generator inputting said first analog signal, said dynamic reference threshold generator outputting a reference signal, wherein said reference signal equates a percentage of said first analog signal in response to a detection of a first signal feature of said first analog signal during a cycle of said first analog signal, and wherein said reference signal equates a fixed percentage of one of a pair of peak amplitudes of said first analog signal in response to a detection of a second signal feature of said first analog signal during a cycle of said first analog signal, ; and an output format generator inputting said reference signal and said first analog signal, said output format generator outputting a digital signal, said digital signal equating a first logic signal level in response to said first analog signal being greater than said reference signal, said digital signal equating a second logic signal level in response to said first analog signal being less than said reference signal.

8. The magnetic sensing device of claim 7 wherein said magnetic sensor is a magneto-resistive sensor outputting said first analog signal as a first voltage analog signal.

9. The magnetic sensing device of claim 8 wherein said dynamic reference threshold generator includes:

a slope detector inputting said first voltage analog signal, said slope detector outputting a first voltage binary signal, said first voltage binary signal equating a first voltage level in response to a detection of a positive slope of said first voltage analog signal, said first voltage binary signal equating a second voltage level in response to a detection of a negative slope of said first voltage analog signal.
  wherein said positive slope of said first voltage analog signal is said first signal feature of said first analog signal and said negative slope of said first voltage analog signal is said second signal feature of said first analog signal;
a switching circuit inputting said first voltage binary signal and said first voltage analog signal, said switching circuit outputting a second voltage analog signal in response to said first voltage binary signal equating said first voltage level, said second voltage analog signal equating at least a portion of said first voltage analog signal, said switching circuit being inoperative to output said second voltage analog signal in response to said first voltage binary signal equating said second voltage level;
a storage buffer inputting and storing said second voltage analog signal, said storage buffer outputting a third voltage analog signal, said third voltage analog signal equating at least a portion of said second voltage analog signal,
  wherein said second voltage analog signal as stored by said storage buffer equates a fixed percentage of a positive peak voltage amplitude of said first voltage analog signal when said first voltage binary signal equates said second voltage level; and
an attenuator inputting said third voltage analog signal, said attenuator outputting said reference signal as a voltage reference signal, said voltage reference signal equating an attenuation of said third voltage analog signal.

10. The magnetic sensing device of claim 9 wherein said output format generator includes a comparator inputting said first voltage analog signal and said voltage reference signal, said comparator outputting said digital signal as a voltage digital signal, said voltage digital signal equating a first voltage logic level in response to said first voltage analog signal being greater than said voltage reference signal, said voltage digital signal equating a second voltage logic level in response to said first voltage analog signal being less than said voltage reference signal.

11. The magnetic sensing device of claim 9 wherein said output format generator includes:
  a comparator inputting said first voltage analog signal and said voltage reference signal, said comparator outputting a second voltage binary signal, said second voltage binary signal equating a third voltage level in response to said first voltage analog signal being greater than said voltage reference signal, said second voltage binary signal equating a fourth voltage level in response to said first voltage analog signal being less than said voltage reference signal; and
  an output buffer inputting said second voltage binary signal, said output buffer outputting said digital signal as a voltage digital signal, said voltage digital signal equating a first voltage logic level in response to said second voltage binary signal equating said third voltage level, said voltage digital signal equating a second voltage logic level in response to said second voltage binary signal equating said fourth voltage level.

12. The magnetic sensing device of claim 11 wherein said first voltage level and said third voltage level are substantially identical, and said second voltage level and said fourth voltage level are substantially identical.

13. A magnetic sensing device comprising:
  a magnetic sensor outputting a first analog signal; and
  a digital circuit including:
    an input signal conditioning circuit inputting said first analog signal, said input signal conditioning circuit outputting a second analog signal as a variant of said first analog signal;
    a dynamic reference threshold generator inputting said second analog signal, said dynamic reference threshold generator outputting a reference signal,
      wherein said reference signal equates a percentage of said second analog signal in response to a detection of a first quadrant or a second quadrant of said second analog signal during a cycle of said second analog signal, and
      wherein said reference signal equates a percentage of one of a pair of peak amplitudes of said second analog signal in response to a detection of a third quadrant or a fourth quadrant of said second analog signal during a cycle of said second analog signal; and
    an output format generator inputting said reference signal and said second analog signal, said output format generator outputting a digital signal, said digital signal equating a first logic signal level in response to said second analog signal being greater than said reference signal, said digital signal equating a second logic signal level in response to said second analog signal being less than said reference signal.

14. The magnetic sensing device of claim 13 wherein said magnetic sensor is a magneto-resistive sensor outputting said first analog signal as a first voltage analog signal, and
  wherein said input signal conditioning is an input amplifier outputting said second analog signal as a second voltage analog signal, said second voltage analog signal being an amplification of said first voltage analog signal.

15. The magnetic sensing device of claim 14 wherein said dynamic reference threshold generator includes:
  a slope detector inputting said second voltage analog signal, said slope detector outputting a first voltage binary signal, said first voltage binary signal equating a first voltage level in response to a detection of a positive slope of said second voltage analog signal, said first voltage binary signal equating a second voltage level in response to a detection of a negative slope of said second voltage analog signal;
  a polarity detector inputting said second voltage analog signal, said polarity detector outputting a second voltage binary signal, said second voltage binary signal equating said first voltage level in response to a detection of a positive polarity of said second voltage analog signal, said second voltage binary signal equating said second voltage level in response to a detection of a negative polarity of said second voltage analog signal,
    wherein said positive slope and said positive polarity of said second voltage analog signal collectively correspond to said first quadrant, said negative slope and said negative polarity of said second voltage analog signal collectively correspond to said second quadrant, said negative slope and said positive polarity of said second voltage analog signal collectively correspond to said third quadrant, and said positive slope and said negative polarity of said second voltage analog signal collectively correspond to said fourth quadrant;

a logic circuit inputting said first voltage binary signal and said second voltage binary signal, said logic circuit outputting a third voltage binary signal, said third voltage binary signal equating said first voltage level in response to said first voltage binary signal equating said second voltage binary signal, said third voltage binary signal equating said second voltage level in response to said first voltage binary signal differing from said second voltage binary signal;

a switching circuit inputting said third voltage binary signal and said second voltage analog signal, said switching circuit outputting a third voltage analog signal in response to said third voltage binary signal equating said first voltage level, said third voltage analog signal equating at least a portion of said second voltage analog signal in response to said third voltage binary signal equating said first voltage level, said switching circuit being inoperable to output said third voltage analog signal in response to said third voltage binary signal equating said second voltage level;

a storage buffer inputting and storing said third voltage analog signal, said storage buffer outputting a fourth voltage analog signal, said fourth voltage analog signal equating at least a portion of said third voltage analog signal, wherein said third voltage analog signal as stored by said storage buffer equates a fixed percentage of a positive peak voltage amplitude of said second voltage analog signal when said first voltage binary signal equates second voltage level and said second voltage binary signal equates said first voltage level, and wherein said third voltage analog signal as stored by said storage buffer equates a fixed percentage of a negative peak voltage amplitude of said second voltage analog signal when said first voltage binary signal equates first voltage level and said second voltage binary signal equates said second voltage level; and an attenuator inputting said fourth voltage analog signal, said attenuator outputting said reference signal as a voltage reference signal, said voltage reference signal equating an attenuation of said fourth voltage analog signal.

16. The magnetic sensing device of claim 15 wherein said output format generator includes a comparator inputting said second voltage analog signal and said voltage reference signal, said comparator outputting said digital signal as a voltage digital signal, said voltage digital signal equating a first voltage logic level in response to said second voltage analog signal being greater than said voltage reference signal, said voltage digital signal equating a second voltage logic level in response to said second voltage analog signal being less than said voltage reference signal.

17. The magnetic sensing device of claim 15 wherein said output format generator includes:

a comparator inputting said second voltage analog signal and said voltage reference signal, said comparator outputting a fourth voltage binary signal, said fourth voltage binary signal equating a third voltage level in response to said second voltage analog signal being greater than said voltage reference signal, said fourth voltage binary signal equating a fourth voltage level in response to said second voltage analog signal being less than said voltage reference signal; and an output buffer inputting said fourth voltage binary signal, said output buffer outputting said digital signal as a voltage digital signal, said voltage digital signal equating a first voltage logic level in response to said fourth voltage binary signal equating said third voltage level, said voltage digital signal equating a second voltage logic level in response to said fourth voltage binary signal equating said fourth voltage level.

18. The magnetic sensing device of claims wherein said first voltage level and said third voltage level are substantially identical, and said second voltage level and said fourth voltage level are substantially identical.

19. A magnetic sensing device comprising:

a magnetic sensor outputting a first analog signal; and a digital circuit including:

a dynamic reference threshold generator inputting said first analog signal, said dynamic reference threshold generator outputting a reference signal, wherein said reference signal equates a percentage of said first analog signal in response to a detection of a first quadrant or a second quadrant of said first analog signal during a cycle of said first analog signal, and wherein said reference signal equates a percentage of one of a pair of peak amplitudes of said first analog signal in response to a detection of a third quadrant or a fourth quadrant of said first analog signal during a cycle of said first analog signal; and an output format generator inputting said reference signal and said first analog signal, said output format generator outputting a digital signal, said digital signal equating a first logic signal level in response to said first analog signal being greater than said reference signal, said digital signal equating a second logic signal level in response to said first analog signal being less than said reference signal.

20. The magnetic sensing device of claim 19 wherein said magnetic sensor is a magneto-resistive sensor outputting said first analog signal as a first voltage analog signal.

21. The magnetic sensing device of claim 20 wherein said dynamic reference threshold generator includes:

a slope detector inputting said first voltage analog signal, said slope detector outputting a first voltage binary signal, said first voltage binary signal equating a first voltage level in response to a detection of a positive slope of said first voltage analog signal, said first voltage binary signal equating a second voltage level in response to a detection of a negative slope of said first voltage analog signal;

a polarity detector inputting said first voltage analog signal, said polarity detector outputting a second voltage binary signal, said second voltage binary signal equating said first voltage level in response to a detection of a positive polarity of said first voltage analog signal, said second voltage binary signal equating said second voltage level in response to a detection of a negative polarity of said first voltage analog signal, wherein said positive slope and said positive polarity of said first voltage analog signal collectively correspond to said first quadrant, said negative slope and said negative polarity of said first voltage analog signal collectively correspond to said second quadrant, said negative slope and said positive polarity of said first voltage analog signal collectively correspond to said third quadrant, and said positive slope and said negative polarity of said first voltage analog signal collectively correspond to said fourth quadrant;

a logic circuit inputting said first voltage binary signal and said second voltage binary signal, said logic circuit outputting a third voltage binary signal, said third voltage binary signal equating said first voltage level in response to said first voltage binary signal equating said second voltage binary signal, said third voltage binary signal equating said second voltage level in response to said first voltage binary signal differing from said second voltage binary signal;

a switching circuit inputting said third voltage binary signal and said first voltage analog signal, said switching circuit outputting a second voltage analog signal in response to said third voltage binary signal equating said first voltage level, said second voltage analog signal equating at least a portion of said first voltage analog signal, said switching circuit being inoperable to output said second voltage analog signal in response to said third voltage binary signal equating said second voltage level;

a storage buffer inputting and storing said second voltage analog signal, said storage buffer outputting a third voltage analog signal equating at least a portion of said second voltage analog signal, wherein said second voltage analog signal as stored by said storage buffer equates a fixed percentage of a positive peak voltage amplitude of said second voltage analog signal when said first voltage binary signal equates second voltage level and said second voltage binary signal equates said first voltage level, and wherein said second voltage analog signal as stored by said storage buffer equates a fixed percentage of a negative peak voltage amplitude of said second voltage analog signal when said first voltage binary signal equates first voltage level and said second voltage binary signal equates said second voltage level; and an attenuator inputting said third voltage analog signal, said attenuator outputting said reference signal as a voltage reference signal, said voltage reference signal equating an attenuation of said third voltage analog signal.

22. The magnetic sensing device of claim 21 wherein said output format generator includes a comparator inputting said first voltage analog signal and said voltage reference signal, said comparator outputting said digital signal as a voltage digital signal, said voltage digital signal equating a first voltage logic level in response to said first voltage analog signal being greater than said voltage reference signal, said voltage digital signal equating a second voltage logic level in response to said first voltage analog signal being less than said voltage reference signal.

23. The magnetic sensing device of claim 21 wherein said output format generator includes:

a comparator inputting said first voltage analog signal and said voltage reference signal, said comparator outputting a fourth voltage binary signal, said fourth voltage binary signal equating a third voltage level in response to said first voltage analog signal being greater than said voltage reference signal, said fourth voltage binary signal equating a fourth voltage level in response to said first voltage analog signal being less than said voltage reference signal; and an output buffer inputting said fourth voltage binary signal, said output buffer outputting said digital signal as a voltage digital signal, said voltage digital signal equating a first voltage logic level in response to said fourth voltage binary signal equating said third voltage level, said voltage digital signal equating a second voltage logic level in response to said fourth voltage binary signal equating said fourth voltage level.

24. The magnetic sensing device of claim 23 wherein said first voltage level and said third voltage level are substantial identical, and said second voltage level and said fourth voltage level are substantially identical.

25. A magnetic sensing device comprising:

a magnetic sensor outputting a first analog signal; and a digital circuit including:

an input signal conditioning circuit inputting said first analog signal, said input signal conditioning circuit outputting a second analog signal, said second analog signal being a variant of said first analog signal;

a dynamic dual reference threshold generator inputting said second analog signal, said dynamic dual reference threshold generator simultaneously outputting a first reference signal and a second reference signal, wherein said first reference signal equates a percentage of a positive peak amplitude of said second analog signal during a cycle of said second analog signal, and wherein said second reference signal equates a percentage of a negative peak amplitude of said second analog signal during a cycle of said second analog signal; and an output format generator concurrently inputting said first reference signal, said second reference signal, and said second analog signal, said output format generator outputting a digital signal, said digital signal equating a first logic signal level in response to said second analog signal being greater than said first reference signal, said digital signal equating a second logic signal level in response to said second analog signal being less than said second reference signal.

26. The magnetic sensing device of claim 25 wherein said magnetic sensor is a magneto-resistive sensor outputting said first analog signal as a first voltage analog signal, and wherein said input signal conditioning circuit is an input amplifier outputting said second analog signal as a second voltage analog signal, said second voltage analog signal being an amplification of said first voltage analog signal.

27. The magnetic sensing device of claim 26 wherein said dynamic dual reference threshold generator includes:

a dual peak detector inputting said second voltage analog signal, said dual peak detector outputting a first voltage positive peak signal and a first voltage negative peak signal, said first voltage positive peak signal equating a percentage of a positive peak amplitude of said second voltage analog signal, said first voltage negative peak signal equating a percentage of a negative peak amplitude of said second voltage analog signal;

a dual storage buffer inputting and storing said first voltage positive peak signal and said first voltage negative peak signal, said dual storage buffer outputting a second voltage positive peak signal and a second voltage negative peak signal, said second voltage positive peak signal equating at least a portion of said first voltage positive peak signal as stored by said dual storage buffer, said second voltage negative peak signal equating at least a portion of said first voltage negative peak signal as stored by said dual storage buffer; and a dual attenuator inputting second voltage positive peak signal and said second voltage negative peak signal, said dual attenuator simultaneously outputting said first reference signal as a first voltage reference signal and said second reference signal as a second voltage reference signal, said first voltage reference signal equating an attenuation of said second voltage positive peak signal, said second voltage reference signal equating an attenuation of said second voltage negative peak signal.

28. The magnetic sensing device of claim 27 wherein said output format generator includes a dual comparator concurrently inputting said second voltage analog signal, said first voltage reference signal, and said second voltage reference signal, said comparator outputting said digital signal as a voltage digital signal, said voltage digital signal equating a first voltage logic level in response to said second voltage analog signal being greater than said first voltage reference signal, said voltage digital signal equating a second voltage logic level in response to said second voltage analog signal being less than said second voltage reference signal.

29. The magnetic sensing device of claim 27 wherein said output format generator includes:

a dual comparator concurrently inputting said second voltage analog signal, said first voltage reference signal, and said second voltage reference signal, said dual comparator outputting a voltage binary signal, said voltage binary signal equating a first voltage level in response to said second voltage analog signal being greater than said first voltage reference signal, said voltage binary signal equating a second voltage level in response to said second voltage analog signal being less than said second voltage reference signal; and an output buffer inputting said voltage binary signal, said output buffer outputting said digital signal as a voltage digital signal, said voltage digital signal equating a first voltage logic level in response to said voltage binary signal equating said first voltage level, said voltage digital signal equating a second voltage logic level in response to said voltage binary signal equating said second voltage level.

30. A magnetic sensing device comprising:

a magnetic sensor outputting a analog signal; and a digital circuit including:

a dynamic dual reference threshold generator inputting said analog signal, said dynamic duel reference threshold generator simultaneously outputting a first reference signal and a second reference signal, wherein said first reference signal equates a percentage of a positive peak amplitude of said first analog signal during a cycle of said first analog signal, and wherein said second reference signal equates a percentage of a negative peak amplitude of said first analog signal during a cycle of said first analog signal; and an output format generator concurrently inputting said first reference signal, said second reference signal, and said analog signal, said output format generator outputting a digital signal, said digital signal equating a first logic signal level in response to said analog signal being greater than said first reference signal, said digital signal equating a second logic signal level in response to said analog signal being less than said second reference signal.

31. The magnetic sensing device of claim 30 wherein said magnetic sensor is a magneto-resistive sensor outputting said analog signal as a voltage analog signal.

32. The magnetic sensing device of claim 31 wherein said dynamic dual reference threshold generator includes:

a dual peak detector inputting said voltage analog signal, said dual peak detector outputting a first voltage positive peak signal and a first voltage negative peak signal, said first voltage positive peak signal equating a percentage of a positive peak amplitude of said first voltage analog signal, said first voltage negative peak signal equating a percentage of a negative peak amplitude of said first voltage analog signal;

a dual storage buffer inputting and storing said first voltage positive peak signal and said first voltage negative peak signal, said dual storage buffer outputting a second voltage positive peak signal and a second voltage negative peak signal, said second voltage positive peak signal equating at least a portion of said first voltage positive peak signal as stored by said dual storage buffer, said second voltage negative peak signal equating at least a portion of said first voltage negative peak signal as stored by said dual storage buffer; and a dual attenuator inputting second voltage positive peak signal and said second voltage negative peak signal, said dual attenuator simultaneously outputting said first reference signal as a first voltage reference signal and said second reference signal as a second voltage reference signal, said first voltage reference signal equating an attenuation of said second voltage positive peak signal, said second voltage reference signal equating an attenuation of said second voltage negative peak signal.

33. The magnetic sensing device of claim 32 wherein said output format generator includes a dual comparator concurrently inputting said voltage analog signal, said first voltage reference signal, and said second voltage reference signal, said dual comparator outputting said digital signal as a voltage digital signal, said voltage digital signal equating a first voltage logic level in response to said voltage analog signal being greater than said first voltage reference signal, said voltage digital signal equating a second voltage logic level in response to said voltage analog signal being less than said second voltage reference signal.

34. The magnetic sensing device of claim 32 wherein said output format generator includes:

a dual comparator concurrently inputting said voltage analog signal, said first voltage reference signal, and said second voltage reference signal, said dual comparator outputting a voltage binary signal, said voltage binary signal equating a first voltage level in response to said voltage analog signal being greater than said first voltage reference signal, said voltage binary signal equating a second voltage level in response to said voltage analog signal being less than said second voltage reference signal; and an output buffer inputting said voltage binary signal, said output buffer outputting said digital signal as a voltage digital signal, said voltage digital signal equating a first voltage logic level in response to said voltage binary signal equating said first voltage level, said voltage digital signal equating a second voltage logic level in response to said voltage binary signal equating said second voltage level.

35. The magnetic sensing device of claim 1 wherein said dynamic reference threshold generator includes:
a slope detector inputting said second analog signal, said slope detector outputting a binary signal, said binary signal equating a first signal level in response to a detection of a first slope of said second analog signal, said binary signal equating a second signal level in response to a detection of a second slope of said second analog signal; and
a switching circuit inputting said binary signal and said second analog signal, said switching circuit outputting a third analog signal in response to said binary signal equating said first signal level, said third analog signal equating at least a portion of said second analog signal, said switching circuit being inoperable to output said third analog signal when said binary signal equates said second signal level.

36. The magnetic sensing device of claim 35 wherein said first slope of said second analog signal corresponds to said first signal feature and said second slope of said second analog signal corresponds to said second signal feature.

37. The magnetic sensing device of claim 35 wherein said dynamic reference threshold generator further includes a storage buffer inputting and storing said third analog signal, said storage buffer outputting a fourth analog signal, said fourth analog signal equating at least a portion of said third analog signal, said third analog signal as stored by said storage buffer equating a fixed percentage of one of a pair of peak amplitudes of said second analog signal when said binary signal equates said second signal level.

38. The magnetic sensing device of claim 37 wherein said dynamic reference threshold generator further includes an attenuator inputting said fourth analog signal, said attenuator outputting a reference signal, said reference signal equating an attenuation of said fourth analog signal.

39. The magnetic sensing device of claim 1 wherein said output format generator includes:
a comparator inputting said second analog signal and said reference signal, said comparator outputting a binary signal, said binary signal equating a first signal level in response to said second analog signal being greater than said reference signal, said binary signal equating a second signal level in response to said second analog signal being less than said reference signal; and
an output buffer inputting said binary signal, said output buffer outputting said digital signal, said digital signal equating a first logic signal level in response to said binary signal equating said first signal level, said digital signal equating a second logic signal level in response to said binary signal equating said second signal level.

40. The magnetic sensing device of claim 7 wherein said dynamic reference threshold generator includes:
a slope detector inputting said first analog signal, said slope detector outputting a binary signal, said binary signal equating a first signal level in response to a detection of a first slope of said first analog signal, said binary signal equating a second signal level in response to a detection of a second slope of said first analog signal; and
a switching circuit inputting said binary signal and said first analog signal, said switching circuit outputting a second analog signal in response to said binary signal equating said first signal level, said second analog signal equating at least a portion of said first analog signal, said switching circuit being inoperable to output said second analog signal when said binary signal equates said second signal level.

41. The magnetic sensing device of claim 40 wherein said first slope of said first analog signal corresponds to said first signal feature and said second slope of said first analog signal corresponds to said second signal feature.

42. The magnetic sensing device of claim 40 wherein said dynamic reference threshold generator further includes a storage buffer inputting and storing said second analog signal, said storage buffer outputting a third analog signal, said third analog signal equating at least a portion of said second analog signal, said second analog signal as stored by said storage buffer equating a fixed percentage of one of a pair of peak amplitudes of said first analog signal when said binary signal equates said second signal level.

43. The magnetic sensing device of claim 42 wherein said dynamic reference threshold generator further includes an attenuator inputting said third analog signal, said attenuator outputting a reference signal, said reference signal equating an attenuation of said third analog signal.

44. The magnetic sensing device of claim 7 wherein said output format generator includes:
a comparator inputting said first analog signal and said reference signal, said comparator outputting a binary signal, said binary signal equating a first signal level in response to said first analog signal being greater than said reference signal, said binary signal equating a second signal level in response to said first analog signal being less than said reference signal; and
an output buffer inputting said binary signal, said output buffer outputting said digital signal, said digital signal equating a first logic signal level in response to said binary signal equating said first signal level, said digital signal equating a second logic signal level in response to said binary signal equating said second signal level.

45. The magnetic sensing device of claim 13 wherein said dynamic reference threshold generator includes:
a slope detector inputting said second analog signal, said slope detector outputting a first binary signal, said first binary signal equating a first signal level in response to a detection of a first slope of said second analog signal, said first binary signal equating a second signal level in response to a detection of a second slope of said second analog signal; and
a polarity detector inputting said second analog signal, said polarity detector outputting a second binary signal, said second binary signal equating said first signal level in response to a detection of a first polarity of said second analog signal, said second binary signal equating said second signal level in response to a detection of a second polarity of said second analog signal.

46. The magnetic sensing device of claim 45 wherein said first slope and said first polarity of said second analog signal collectively correspond to said first quadrant, said second slope and said second polarity of said second analog signal collectively correspond to said second quadrant, said second slope and said first polarity collectively correspond to said third quadrant, and said first slope and said second polarity collectively correspond to said fourth quadrant.

47. The magnetic sensing device of claim 45 wherein said dynamic reference threshold generator further includes a logic circuit inputting said first binary signal and said second binary signal, said logic circuit outputting a third binary signal, said third binary signal equating said first signal level in response to said first binary signal equating said second binary signal, said third binary signal equating said second binary signal in response to said first binary signal differing from said second binary signal.

48. The magnetic sensing device of claim 47 wherein said dynamic reference threshold generator further includes a switching circuit inputting said third binary signal and said second analog signal, said switching circuit outputting a third analog signal in response to said third binary signal equating said first signal level, said third analog signal equating at least a portion of said second analog signal, said switching circuit being inoperable to output said third analog signal when said third binary signal equates said second signal level.

49. The magnetic sensing device of claim 48 wherein said dynamic reference threshold generator further includes a storage buffer inputting and storing said third analog signal, said storage buffer outputting a fourth analog signal equating at least a portion of said third analog signal, said third analog signal as stored by said storage buffer equating a fixed percentage of a first peak amplitude of said second analog signal when said first binary signal equates said second signal level and said second binary signal equates said first signal level, said third analog signal as stored by said storage buffer equating a fixed percentage of a second peak amplitude of said second analog signal when said first binary signal equates said first signal level and said second binary signal equates said second signal level.

50. The magnetic sensing device of claim 49 wherein said dynamic reference threshold generator further includes an attenuator inputting said fourth analog signal, said attenuator outputting said reference signal, said reference signal equating an attenuation of said fourth analog signal.

51. The magnetic sensing device of claim 13 wherein said output format generator includes:
  a comparator inputting said second analog signal and said reference signal, said comparator outputting a binary signal, said binary level equating a first signal level in response to said second analog signal being greater than said reference signal, said binary signal equating a second signal level in response to said second analog signal less than said reference signal; and
  an output buffer inputting said binary signal, said output buffer outputting said digital signal, said digital signal equating a first logic signal level in response to said binary signal equating said first signal level, said digital signal equating a second logic signal level in response to said binary signal equating said second signal level.

52. The magnetic sensing device of claim 19 wherein said dynamic reference threshold generator includes:
  a slope detector inputting said first analog signal, said slope detector outputting a first binary signal, said first binary signal equating a first signal level in response to a detection of a first slope of said first analog signal, said first binary signal equating a second signal level in response to a detection of a second slope of said first analog signal; and
  a polarity detector inputting said first analog signal, said polarity detector outputting a second binary signal, said second binary signal equating said first signal level in response to a detection of a first polarity of said first analog signal, said second binary signal equating said second signal level in response to a detection of a second polarity of said first analog signal.

53. The magnetic sensing device of claim 52 wherein said first slope and said first polarity of said first analog signal collectively correspond to said first quadrant, said second slope and said second polarity of said second analog signal collectively correspond to said second quadrant, said second slope and said first polarity collectively correspond to said third quadrant, and said first slope and said second polarity collectively correspond to said fourth quadrant.

54. The magnetic sensing device of claim 52 wherein said dynamic reference threshold generator further includes a logic circuit inputting said first binary signal and said second binary signal, said logic circuit outputting a third binary signal, said third binary signal equating said first signal level in response to said first binary signal equating said second binary signal, said third binary signal equating said second binary signal in response to said first binary signal differing from said second binary signal.

55. The magnetic sensing device of claim 54 wherein said dynamic reference threshold generator further includes a switching circuit inputting said third binary signal and said first analog signal, said switching circuit outputting a second analog signal in response to said third binary signal equating said first signal level, said second analog signal equating at least a portion of said first analog signal, said switching circuit being inoperable to output said second analog signal when said third binary signal equates said second signal level.

56. The magnetic sensing device of claim 55 wherein said dynamic reference threshold generator further includes a storage buffer inputting and storing said second analog signal, said storage buffer outputting a third analog signal equating at least a portion of said second analog signal, said second analog signal as stored by said storage buffer equating a fixed percentage of a first peak amplitude of said first analog signal when said first binary signal equates said second signal level and said second binary signal equates said first signal level, said second analog signal as stored by said storage buffer equating a fixed percentage of a second peak amplitude of said first analog signal when said first binary signal equates said first signal level and said second binary signal equates said second signal level.

57. The magnetic sensing device of claim 56 wherein said dynamic reference threshold generator further includes an attenuator inputting said third analog signal, said attenuator outputting said reference signal, said reference signal equating an attenuation of said third analog signal.

58. The magnetic sensing device of claim 19 wherein said output format generator includes:
  a comparator inputting said first analog signal and said reference signal, said comparator outputting a binary signal, said binary level equating a first signal level in response to said first analog signal being greater than said reference signal, said binary signal equating a second signal level in response to said first analog signal less than said reference signal; and
  an output buffer inputting said binary signal, said output buffer outputting said digital signal, said digital signal equating a first logic level in response to said binary signal equating said first signal level, said digital signal equating a second logic level in response to said binary signal equating said second signal level.

59. The magnetic sensing device of claim 25 wherein said dynamic dual reference threshold generator includes a dual peak detector inputting said second analog signal, said dual peak detector outputting a first positive peak signal and a second negative peak signal, said first positive peak signal equating a percentage of a positive peak amplitude of said second analog signal, said second negative peak signal equating a percentage of a negative peak amplitude of said second analog signal.

60. The magnetic sensing device of claim 59 wherein said dynamic dual reference threshold generator further includes a dual storage buffer inputting and storing said first positive peak signal and said first negative peak signal, said dual storage buffer outputting a second positive peak signal and a second negative peak signal, said second positive peak signal equating at least a portion of said first positive peak signal as stored by said dual storage buffer, said second negative peak signal equating at least a portion of said first negative peak signal as stored by said dual storage buffer.

61. The magnetic sensing device of claim 60 wherein said dynamic dual reference threshold generator further includes a dual attenuator inputting second positive peak signal and said second negative peak signal, said dual attenuator simultaneously outputting said first reference signal and said second reference signal, said first reference signal equating an attenuation of said second positive peak signal, said second reference signal equating an attenuation of said second negative peak signal.

62. The magnetic sensing device of claim 25 wherein said output format generator includes:

- a dual comparator concurrently inputting said second analog signal, said first reference signal, and said second reference signal, said comparator outputting a binary signal, said binary signal equating a first signal level in response to said second analog signal being greater than said first reference signal, said binary signal equating a second signal level in response to said first analog signal being less than said second reference signal; and
- an output buffer inputting said binary signal, said output buffer outputting said digital signal, said digital signal equating a first logic level in response to said binary signal equating said first signal level, said digital signal equating a second logic level in response to said binary signal equating said second signal level.

63. The magnetic sensing device of claim 30 wherein said dynamic dual reference threshold generator includes a dual peak detector inputting said analog signal, said dual peak detector outputting a first positive peak signal and a second negative peak signal, said first positive peak signal equating a percentage of a positive peak amplitude of said analog signal, said second negative peak signal equating a percentage of a negative peak amplitude of said analog signal.

64. The magnetic sensing device of claim 63 wherein said dynamic dual reference threshold generator further includes a dual storage buffer inputting and storing said first positive peak signal and said first negative peak signal, said dual storage buffer outputting a second positive peak signal and a second negative peak signal, said second positive peak signal equating at least a portion of said first positive peak signal as stored by said dual storage buffer, said second negative peak signal equating at least a portion of said first negative peak signal as stored by said dual storage buffer.

65. The magnetic sensing device of claim 64 wherein said dynamic dual reference threshold generator further includes a dual attenuator inputting second positive peak signal and said second negative peak signal, said dual attenuator simultaneously outputting said first reference signal and said second reference signal, said first reference signal equating an attenuation of said second positive peak signal, said second reference signal equating an attenuation of said second negative peak signal.

66. The magnetic sensing device of claim 30 wherein said output format generator includes:

- a dual comparator concurrently inputting said analog signal, said first reference signal, and said second reference signal, said comparator outputting a binary signal, said binary signal equating a first signal level in response to said analog signal being greater than said first reference signal, said binary signal equating a second signal level in response to said first analog signal being less than said second reference signal; and
- an output buffer inputting said binary signal, said output buffer outputting said digital signal, said digital signal equating a first logic level in response to said binary signal equating said first signal level, said digital signal equating a second logic level in response to said binary signal equating said second signal level.

* * * * *